(12) United States Patent
Weis et al.

(10) Patent No.: US 7,635,893 B2
(45) Date of Patent: Dec. 22, 2009

(54) TRANSISTOR, MEMORY CELL ARRAY AND METHOD OF MANUFACTURING A TRANSISTOR

(75) Inventors: Rolf Weis, Dresden (DE); Till Schloesser, Dresden (DE); Ulrike Gruening von Schwerin, Munich (DE)

(73) Assignee: Infineon Technologies AG, Neubiberg (DE)

( * ) Notice: Subject to any disclaimer, the term of this patent is extended or adjusted under 35 U.S.C. 154(b) by 125 days.

(21) Appl. No.: 11/128,782

(22) Filed: May 13, 2005

(65) Prior Publication Data

US 2005/0285153 A1 Dec. 29, 2005

Related U.S. Application Data

(63) Continuation-in-part of application No. 10/939,255, filed on Sep. 10, 2004, now Pat. No. 7,132,333.

(30) Foreign Application Priority Data

Jun. 29, 2004 (DE) .................. 10 2004 031 385

(51) Int. Cl.
*H01L 29/772* (2006.01)
(52) U.S. Cl. .................. 257/332; 257/330; 257/333; 257/E29.257; 257/E29.26
(58) Field of Classification Search .......... 257/E29.198, 257/330, 332, 302, 303, 333
See application file for complete search history.

(56) References Cited

U.S. PATENT DOCUMENTS

| | | | | |
|---|---|---|---|---|
| 4,455,740 A * | 6/1984 | Iwai | ................ | 438/270 |
| 6,037,194 A * | 3/2000 | Bronner et al. | ........... | 438/147 |
| 6,413,802 B1 * | 7/2002 | Hu et al. | ............. | 438/151 |
| 6,437,388 B1 | 8/2002 | Radens et al. | | |
| 6,970,372 B1 * | 11/2005 | Furukawa et al. | ........... | 365/149 |
| 6,995,412 B2 * | 2/2006 | Fried et al. | ............... | 257/296 |
| 7,154,144 B2 * | 12/2006 | Kim et al. | ................ | 257/328 |
| 7,183,600 B2 * | 2/2007 | Kim et al. | ................ | 257/295 |
| 7,250,645 B1 * | 7/2007 | Wang et al. | .............. | 257/213 |
| 2004/0195608 A1 * | 10/2004 | Kim et al. | ................ | 257/296 |
| 2004/0227174 A1 * | 11/2004 | Richter et al. | ............ | 257/300 |

(Continued)

FOREIGN PATENT DOCUMENTS

EP 1 017 095 7/2000

*Primary Examiner*—David Vu
*Assistant Examiner*—Earl N Taylor
(74) *Attorney, Agent, or Firm*—Dicke, Billig & Czaja, PLLC

(57) ABSTRACT

A transistor, memory cell array and method of manufacturing a transistor are disclosed. In one embodiment, the invention refers to a transistor, which is formed at least partially in a semiconductor substrate, comprising a first and a second source/drain regions, a channel region connecting said first and second source/drain regions, said channel region being disposed in said semiconductor substrate, and a gate electrode disposed along said channel region and being electrically insulated from said channel region, for controlling an electrical current flowing between said first and second source/drain regions, wherein said channel region comprises a fin-region in which the channel has the shape of a ridge, said ridge comprising a top side and two lateral sides in a cross section perpendicular to a line connecting said first and second source/drain regions, wherein said top side is disposed beneath a surface of said semiconductor substrate and said gate electrode is disposed along said top side and said two lateral sides.

11 Claims, 59 Drawing Sheets

U.S. PATENT DOCUMENTS

| | | | |
|---|---|---|---|
| 2004/0251487 A1* | 12/2004 | Wu et al. .................. 257/315 |
| 2004/0266077 A1* | 12/2004 | Yeo et al. .................. 438/157 |
| 2004/0266088 A1* | 12/2004 | Luyken et al. ............. 438/202 |
| 2005/0014318 A1* | 1/2005 | Manger ..................... 438/197 |
| 2005/0151206 A1* | 7/2005 | Schwerin ................... 257/390 |
| 2005/0233525 A1* | 10/2005 | Yeo et al. .................. 438/283 |
| 2006/0097329 A1* | 5/2006 | Anderson et al. ........... 257/401 |
| 2006/0281250 A1* | 12/2006 | Schloesser ................. 438/253 |

\* cited by examiner

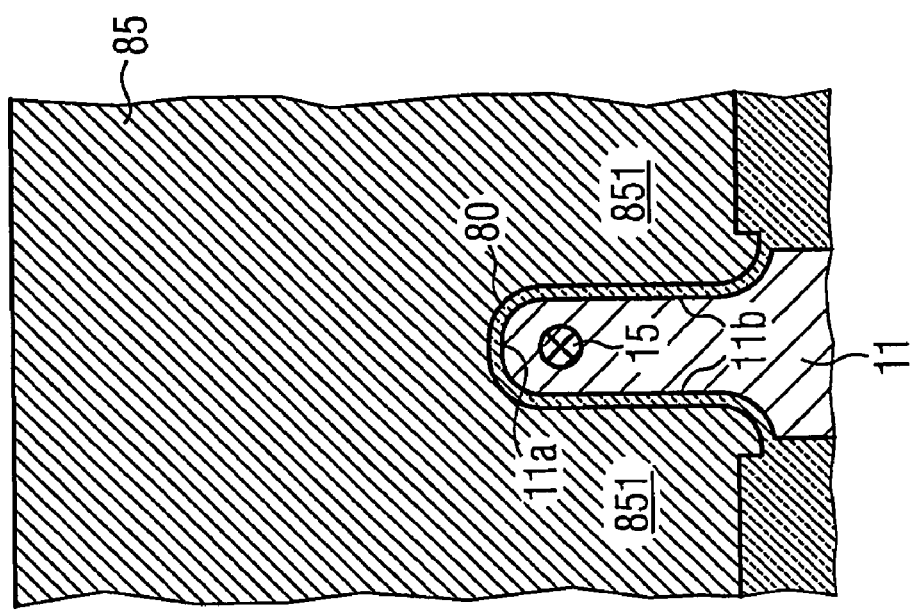
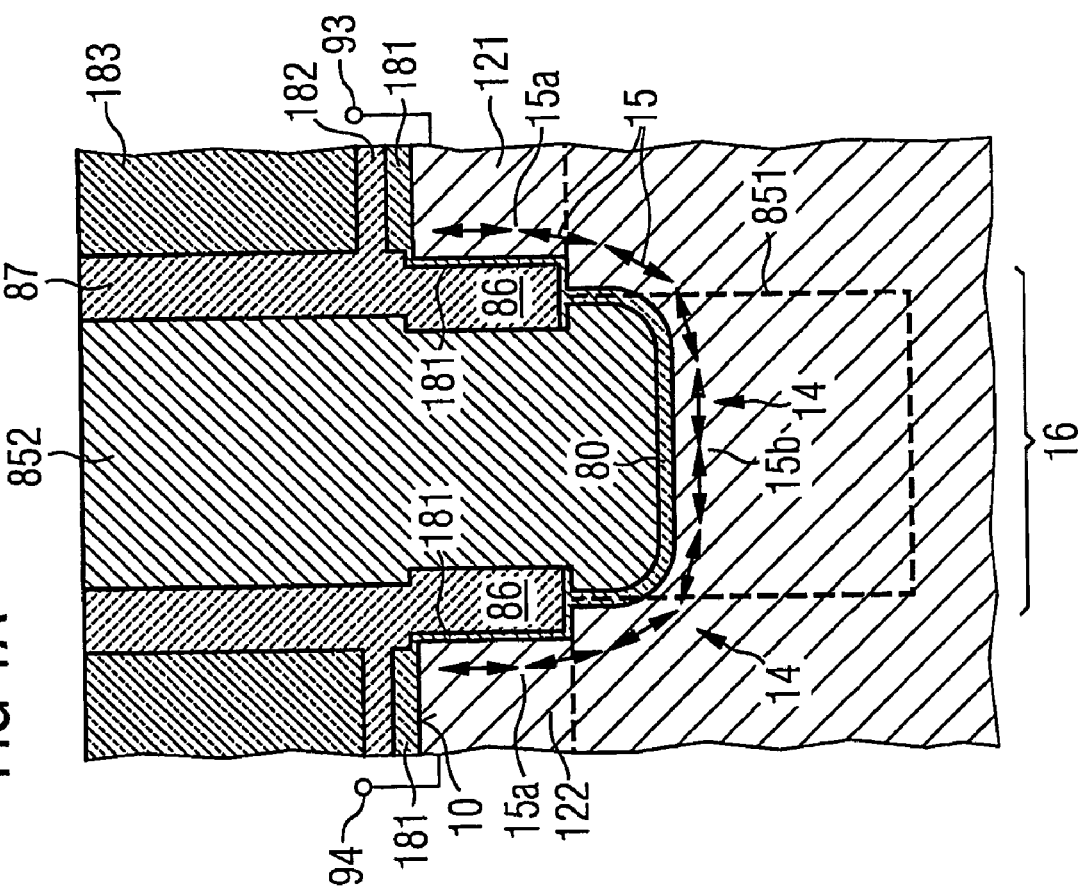

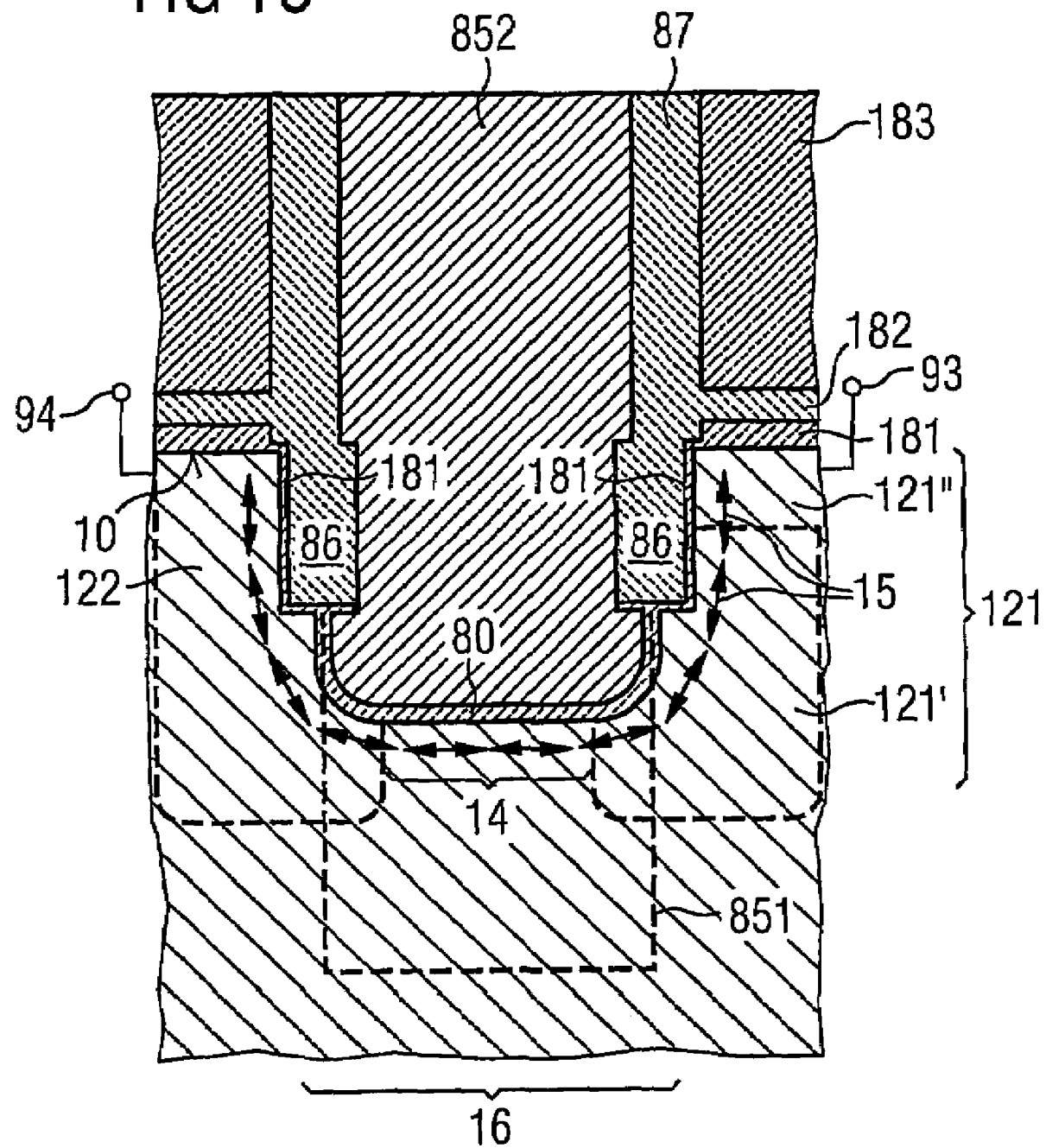

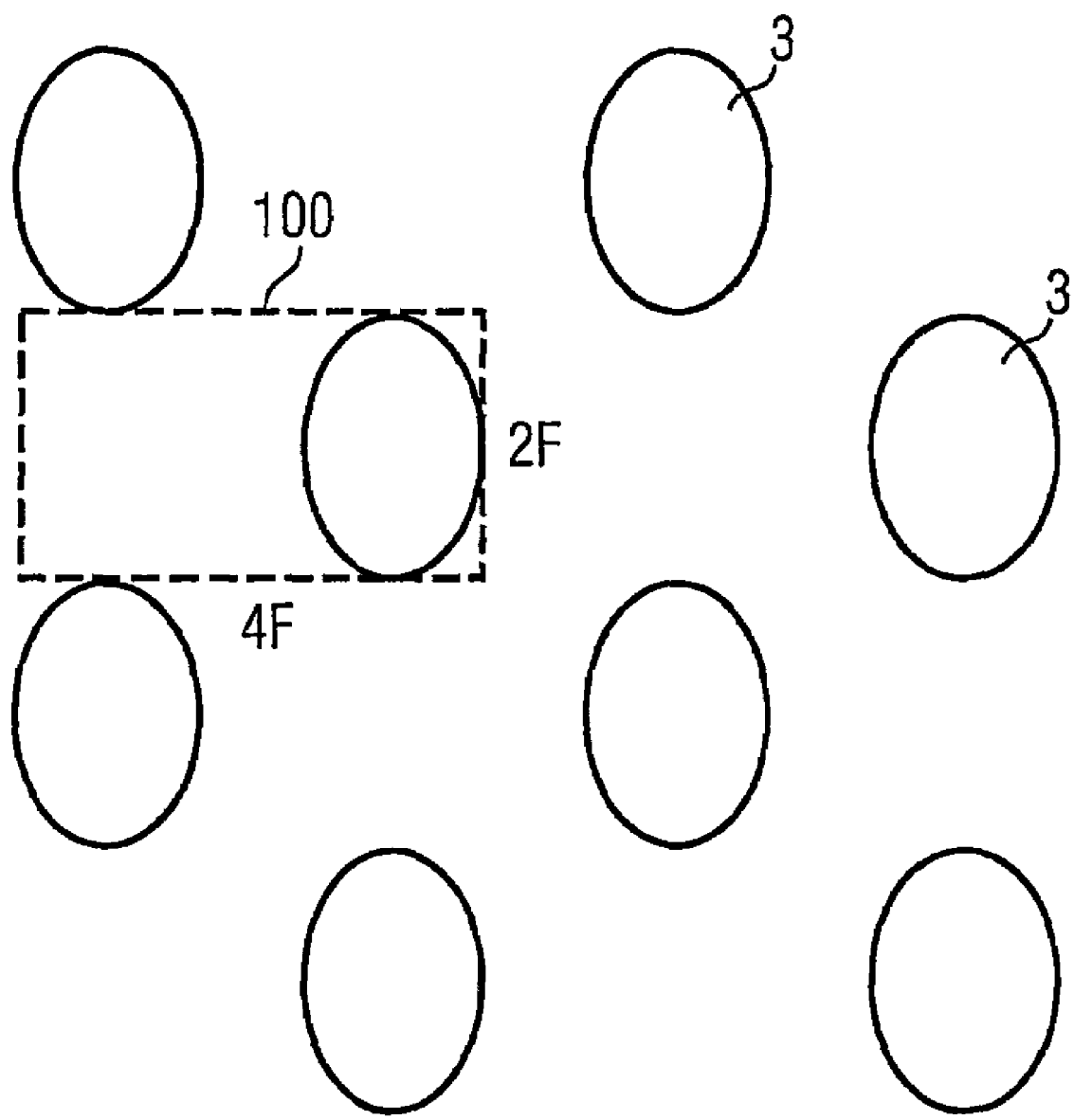

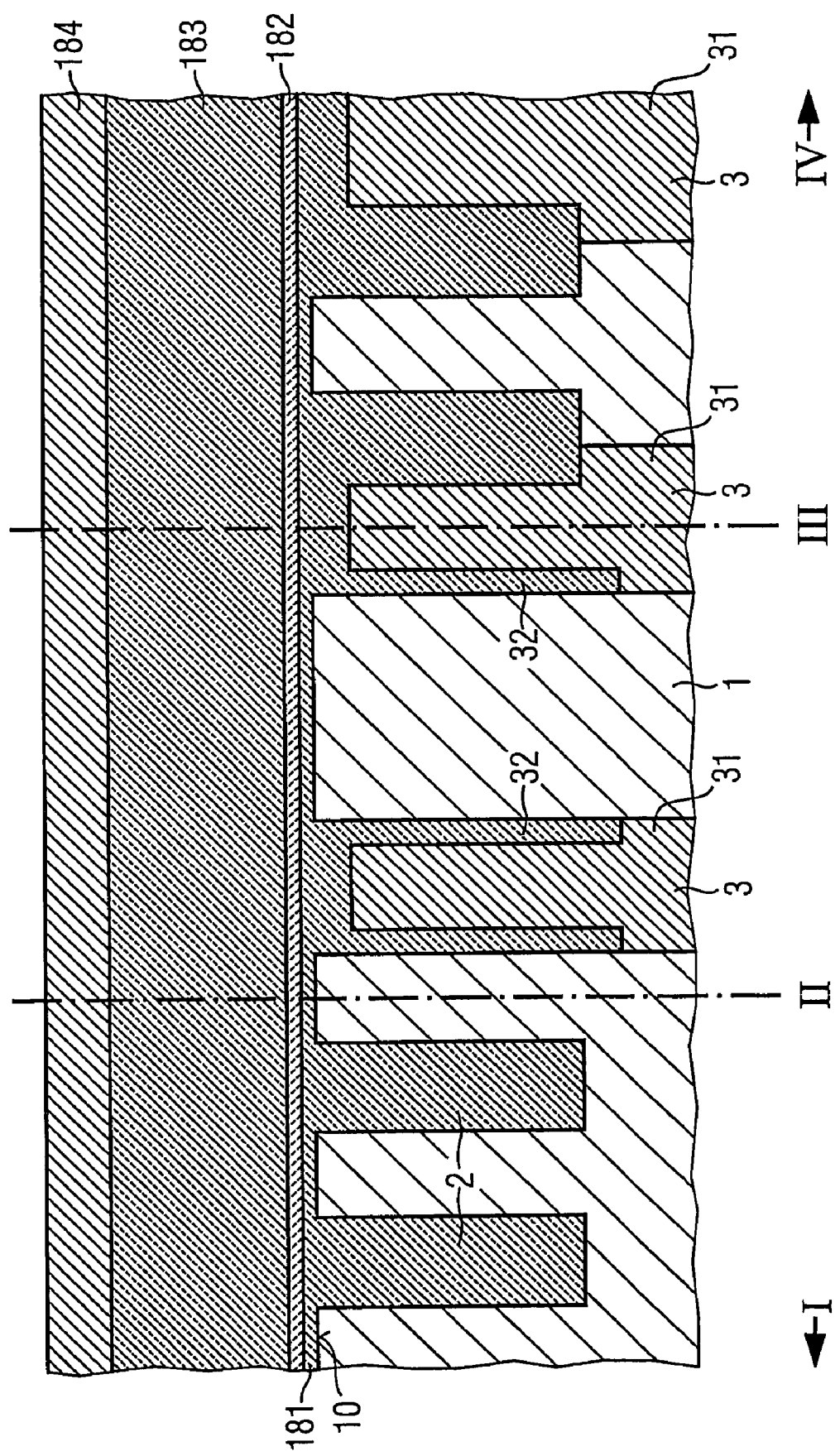

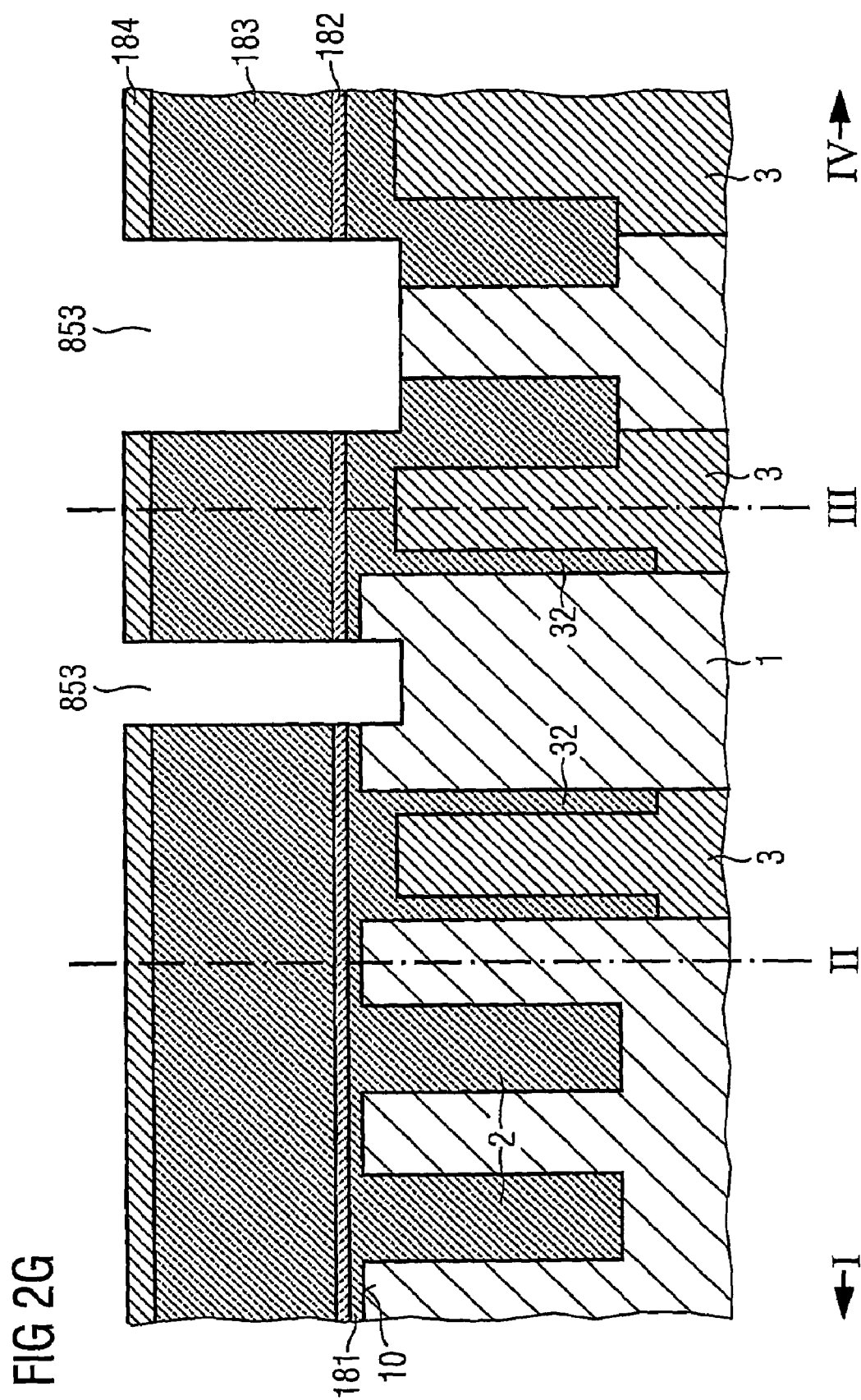

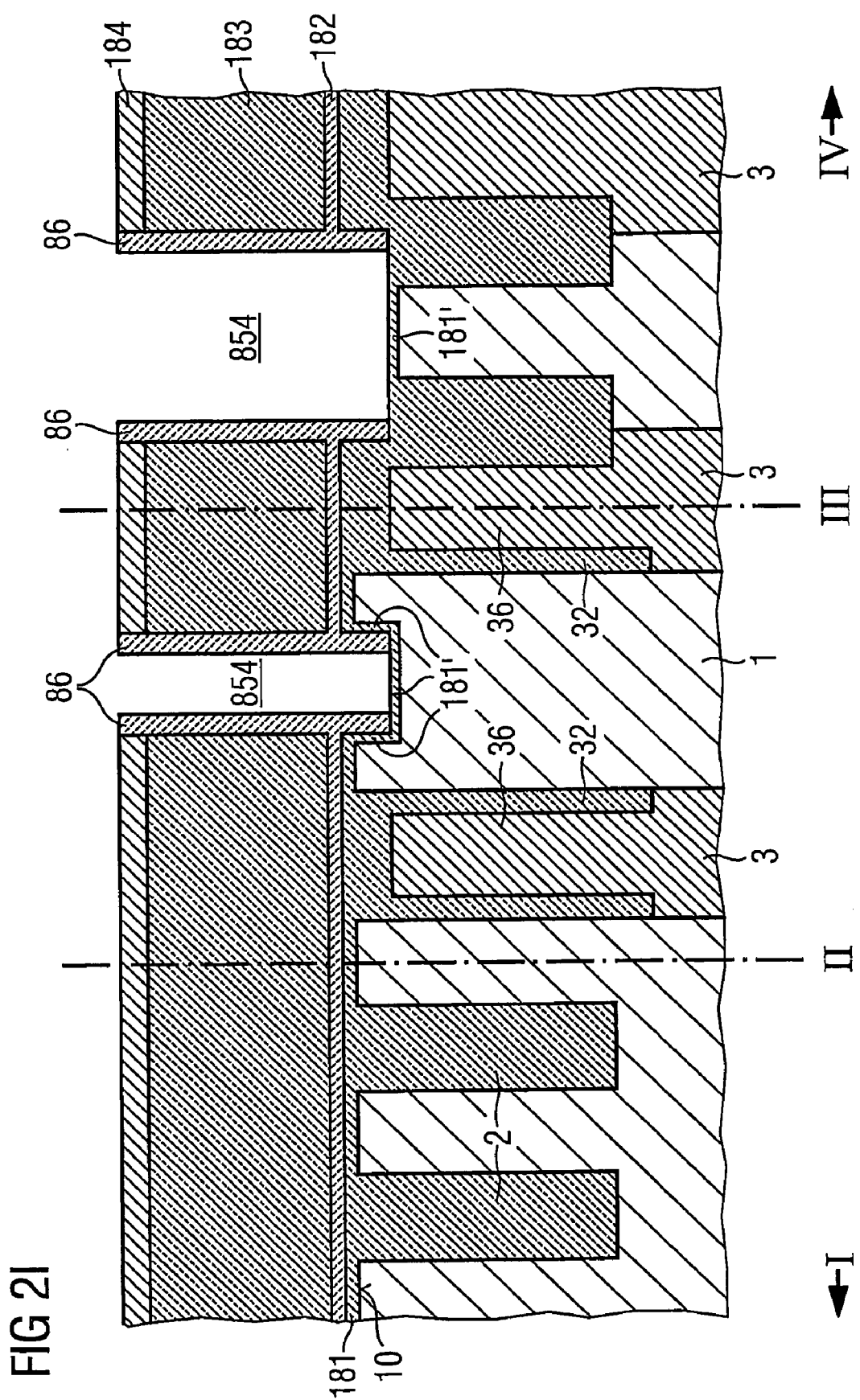

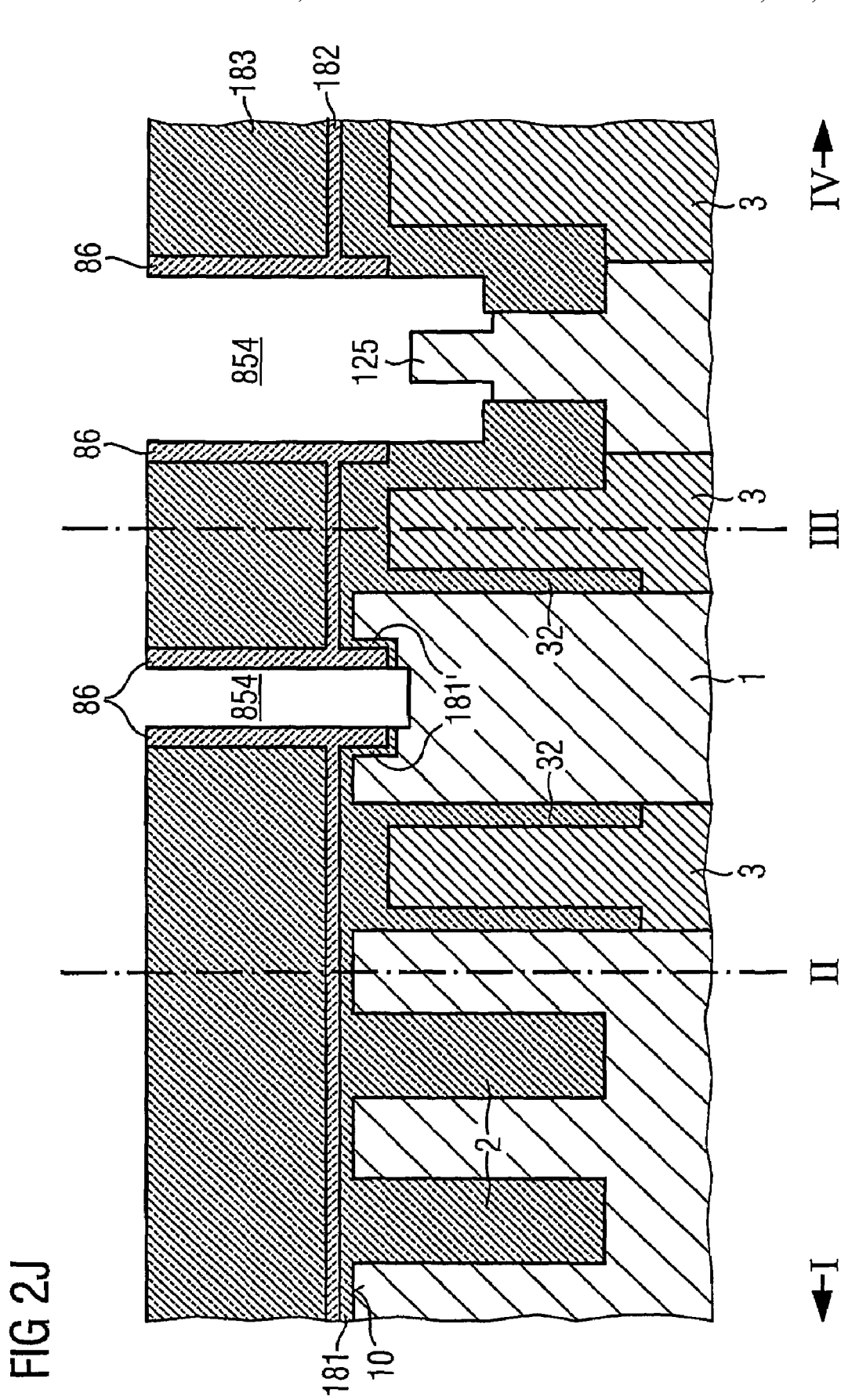

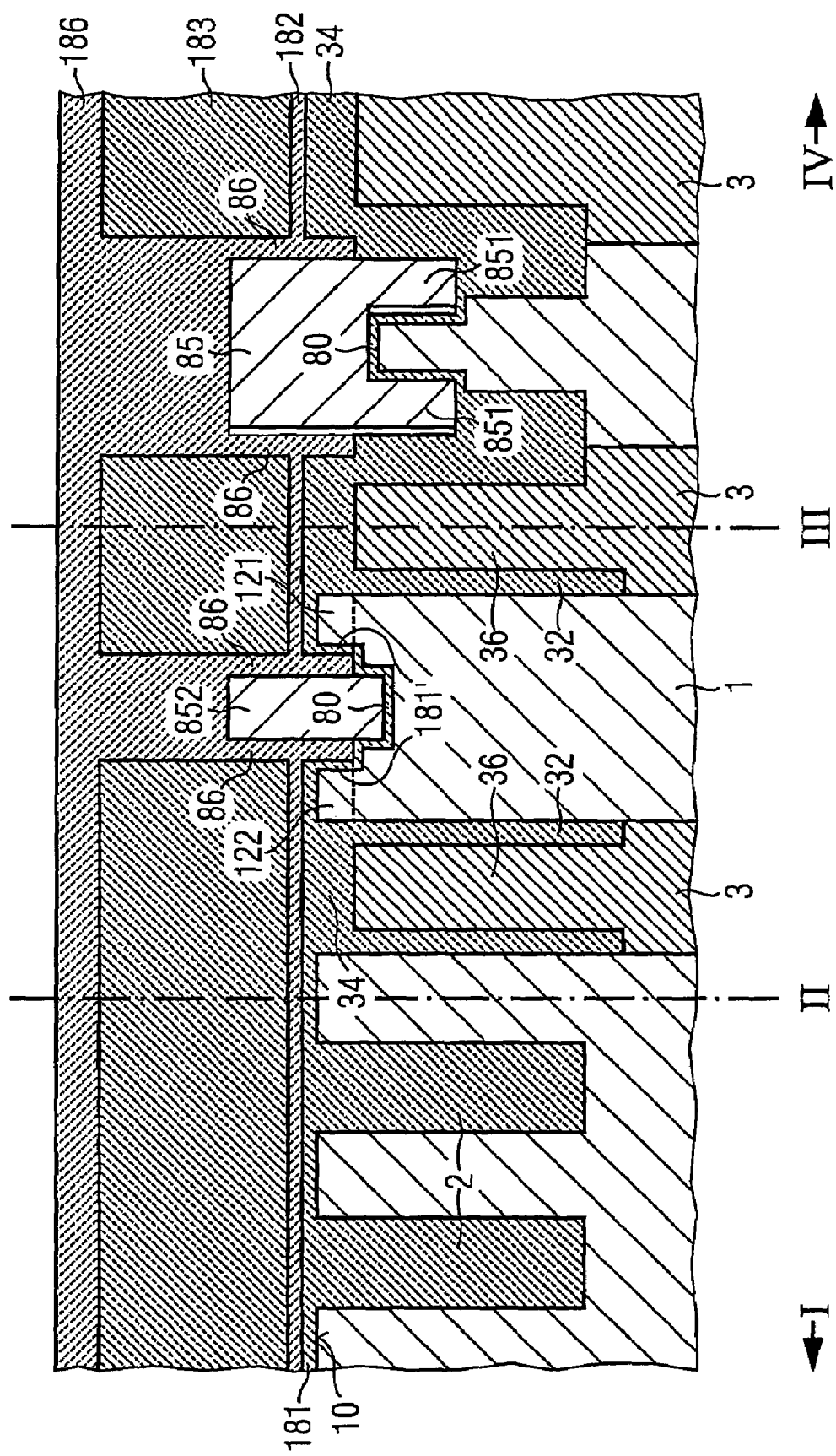

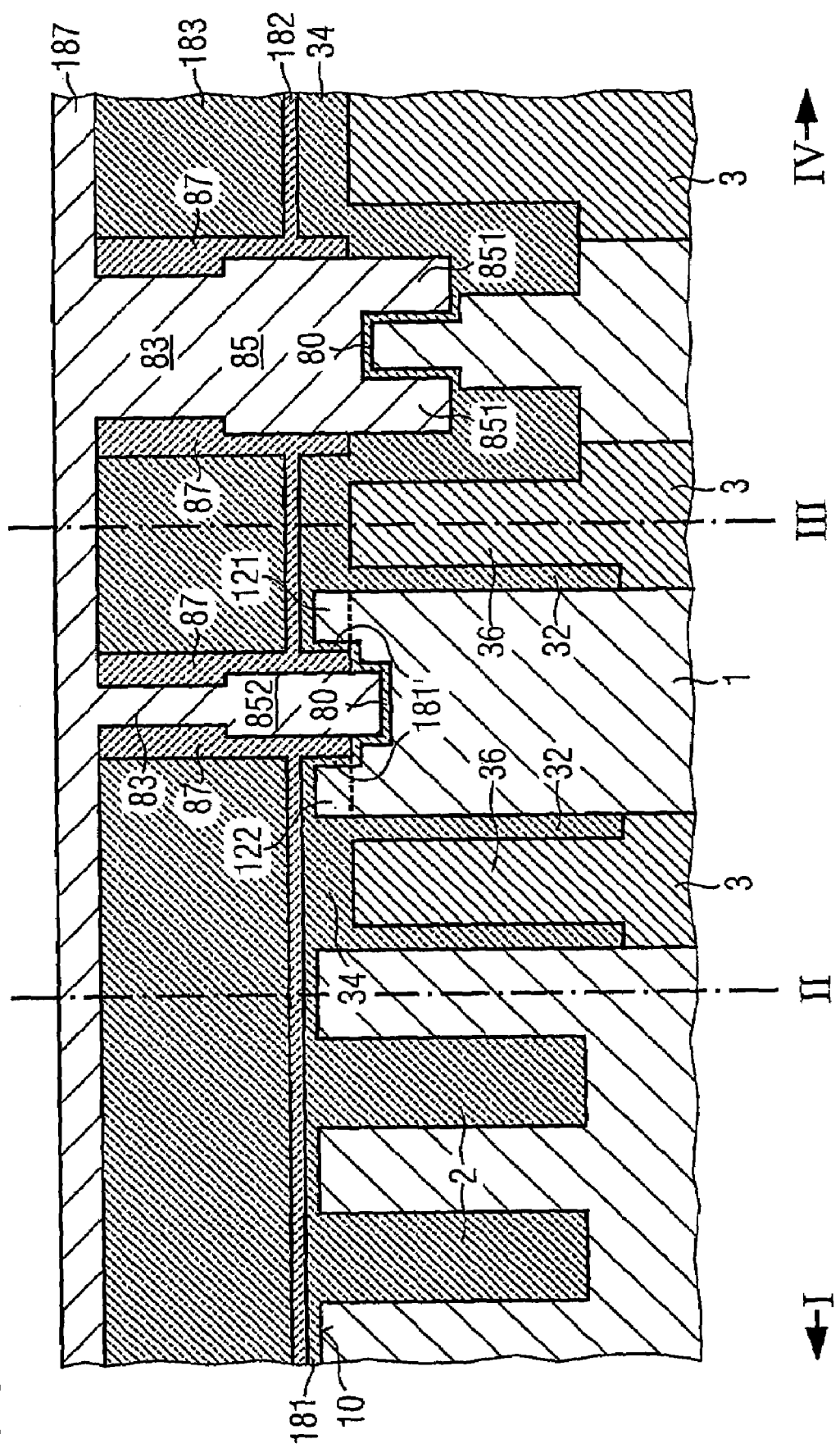

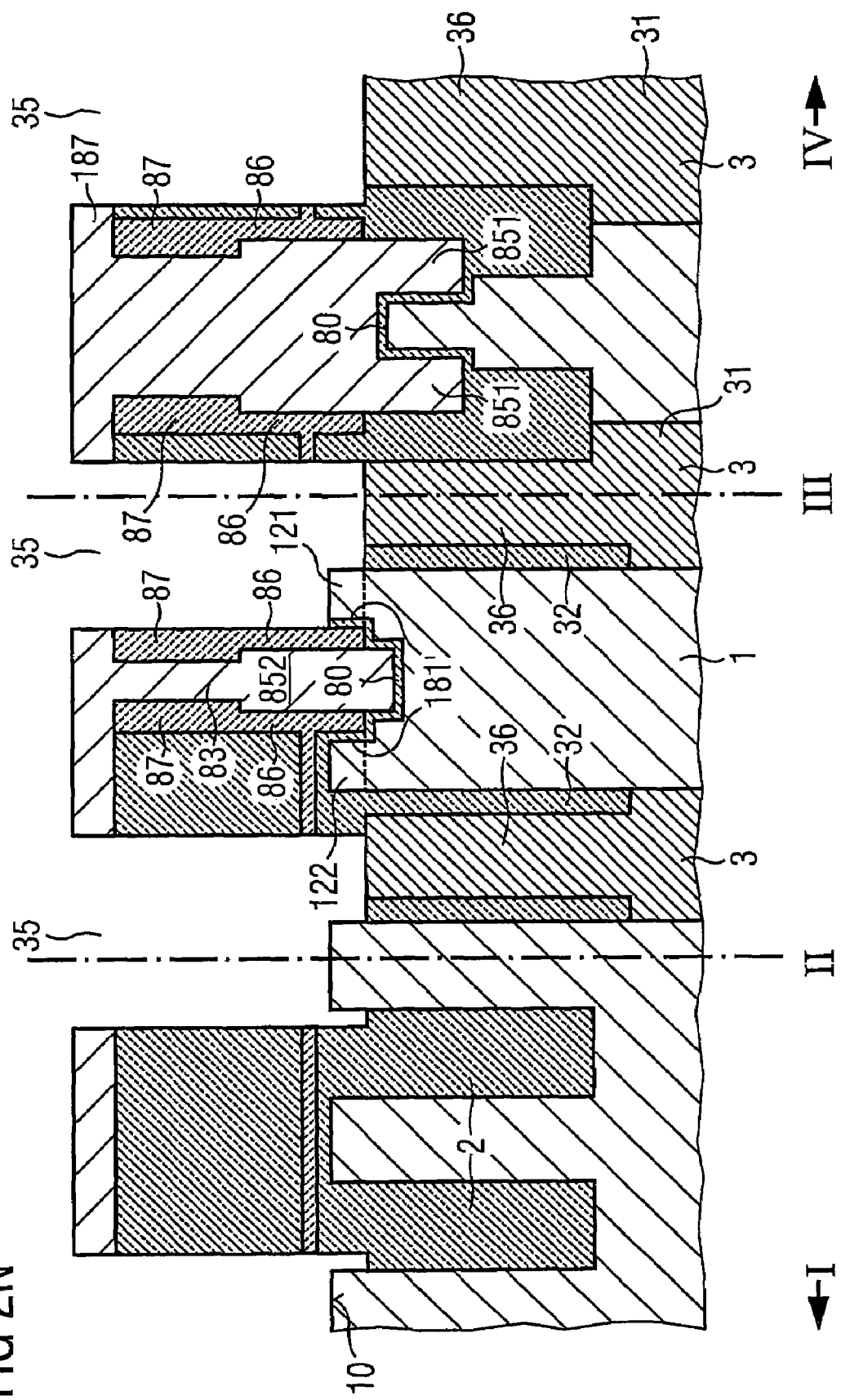

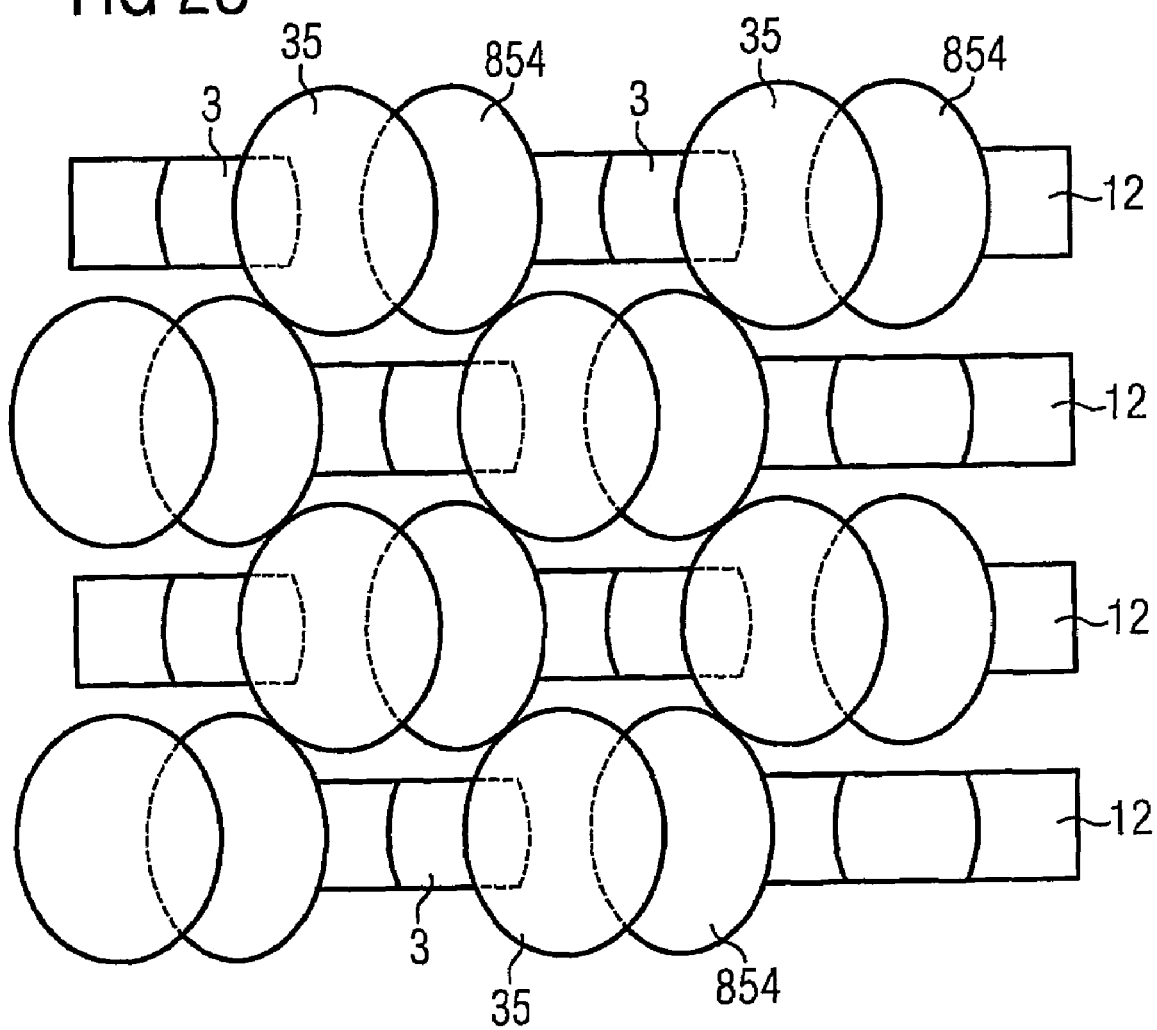

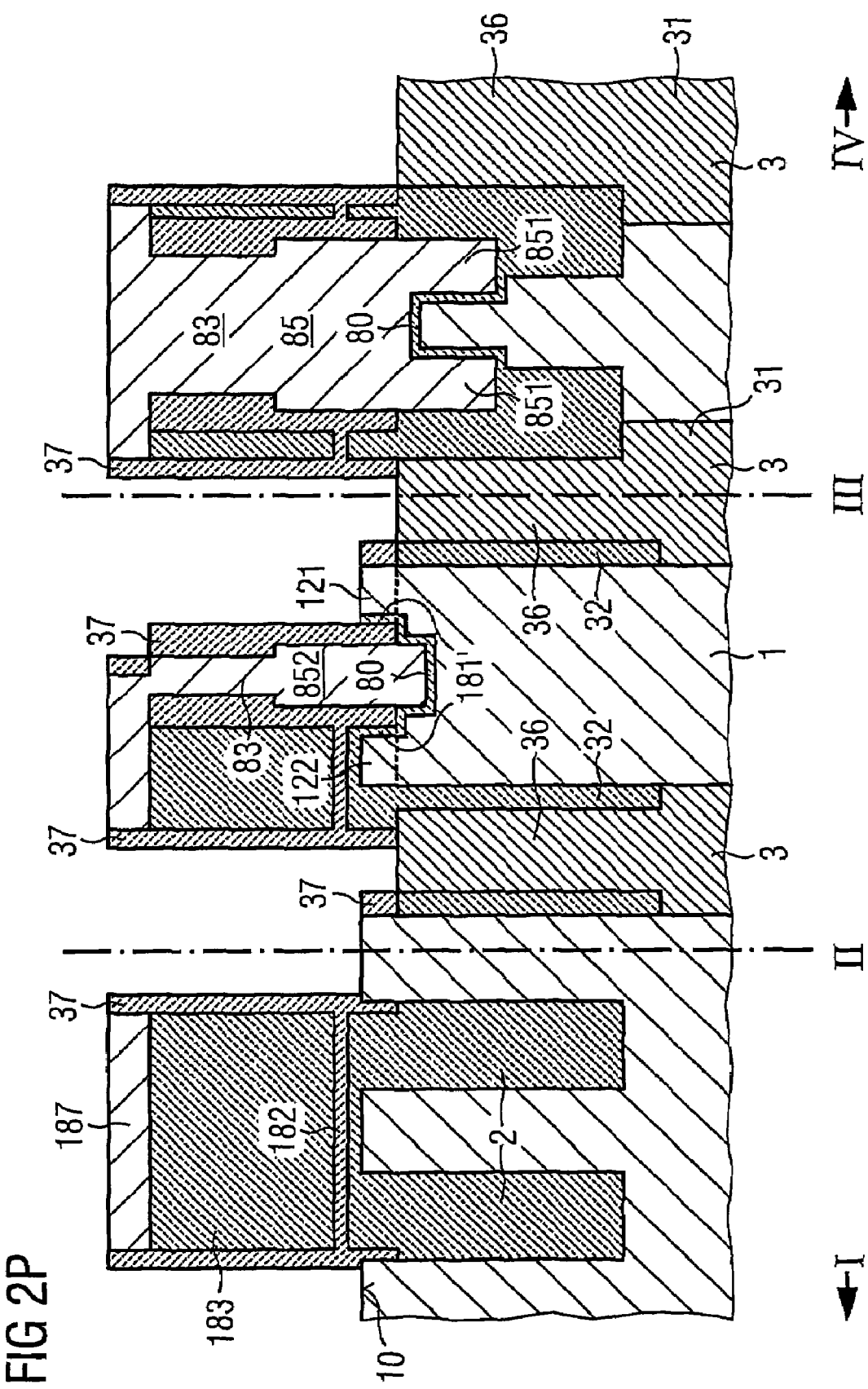

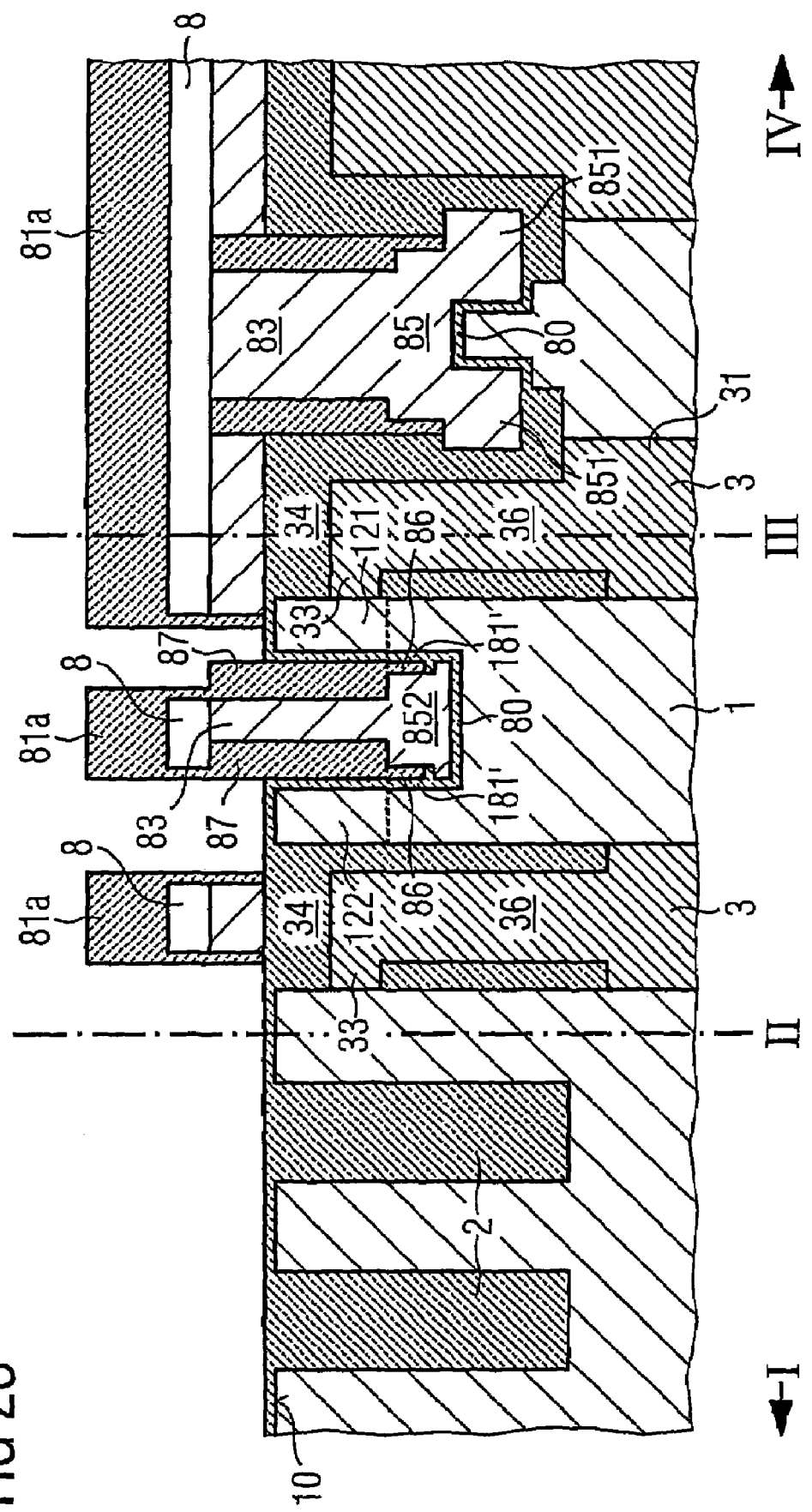

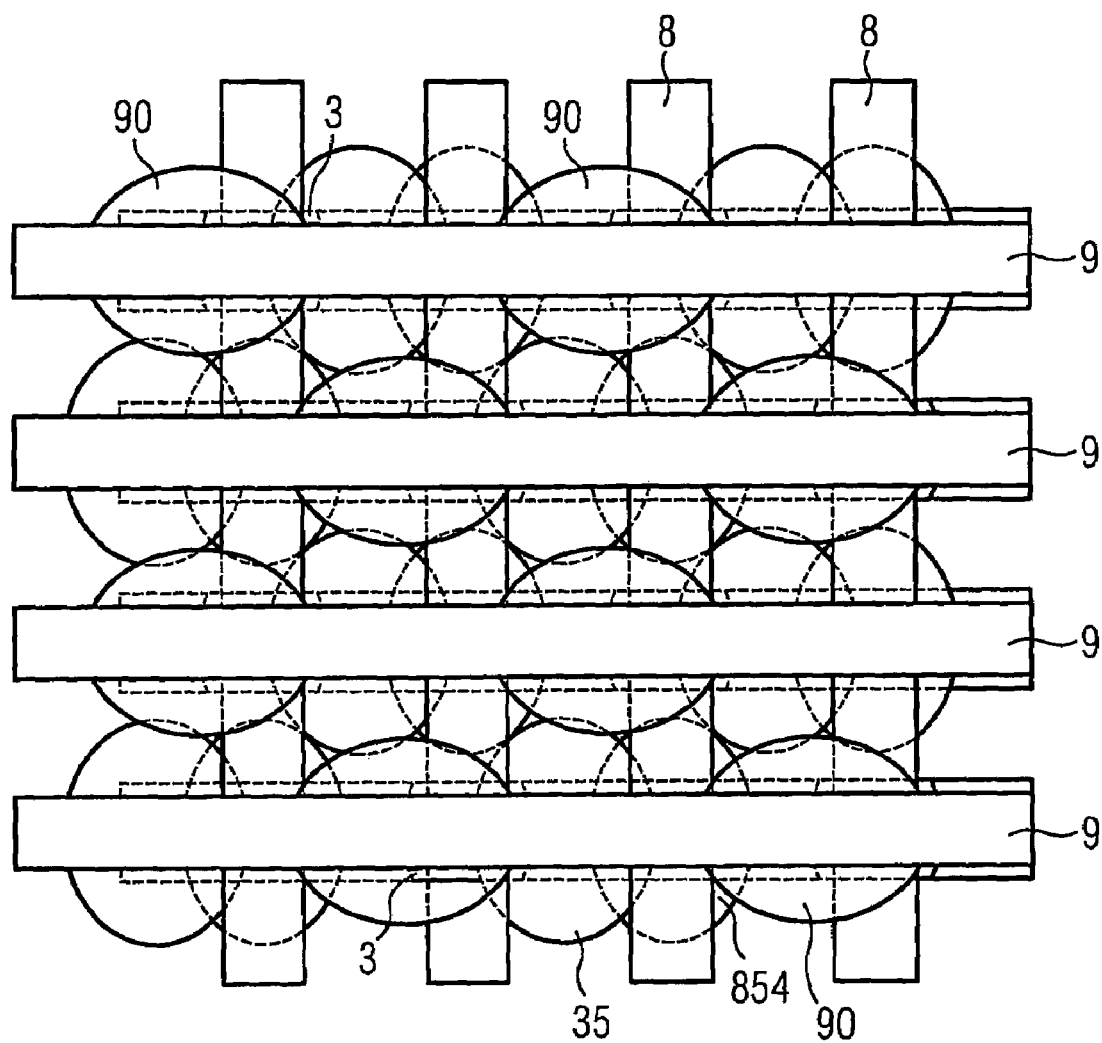

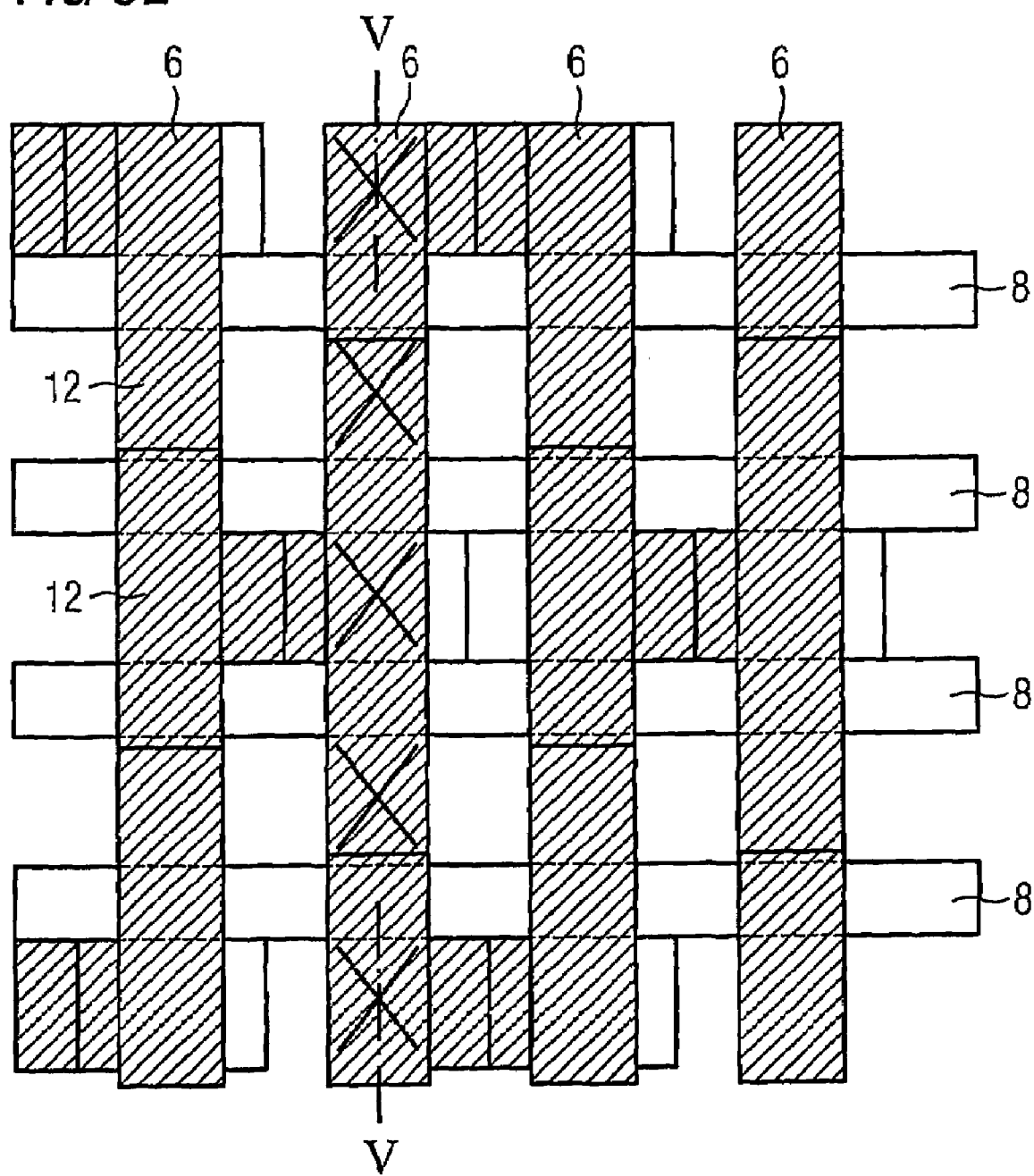

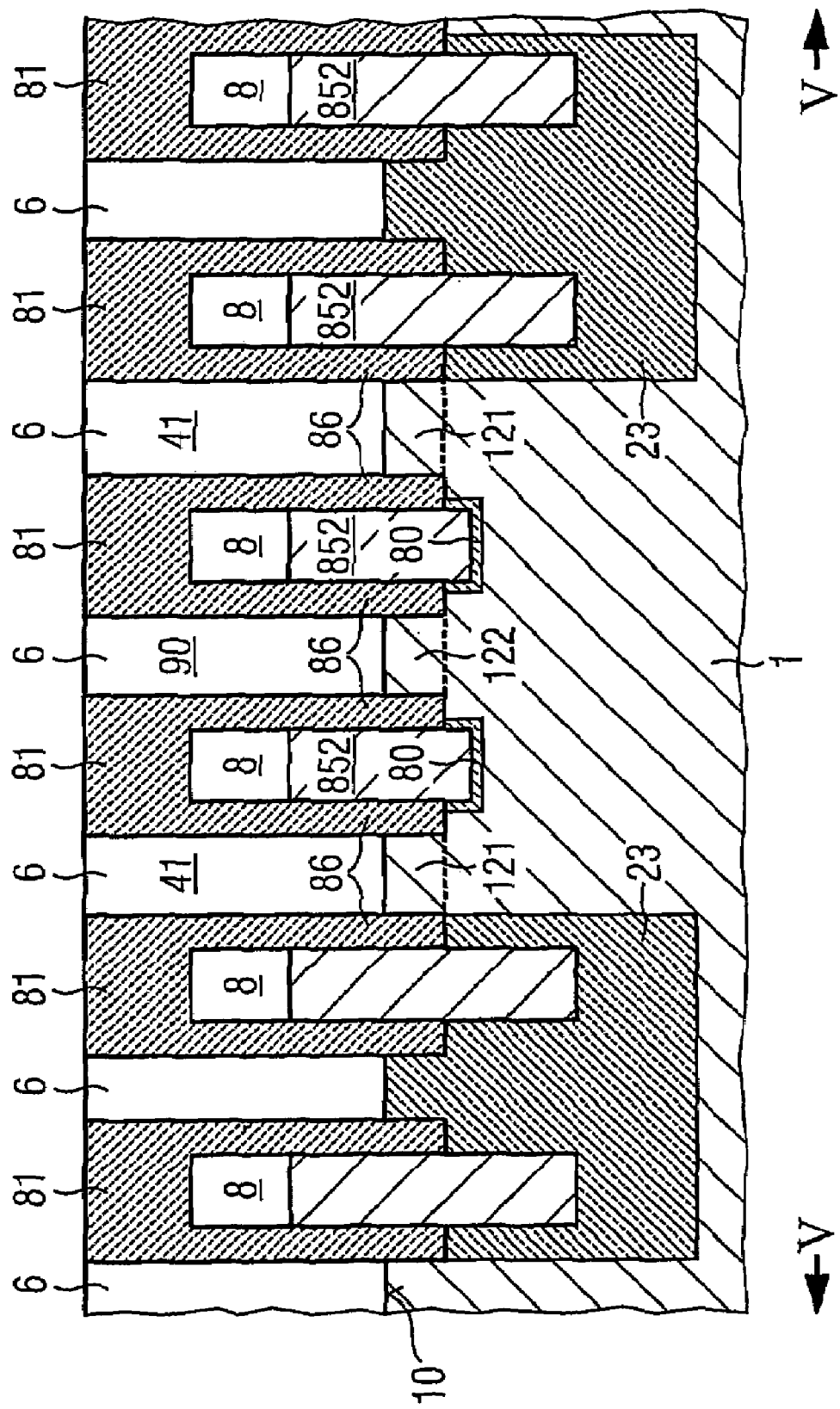

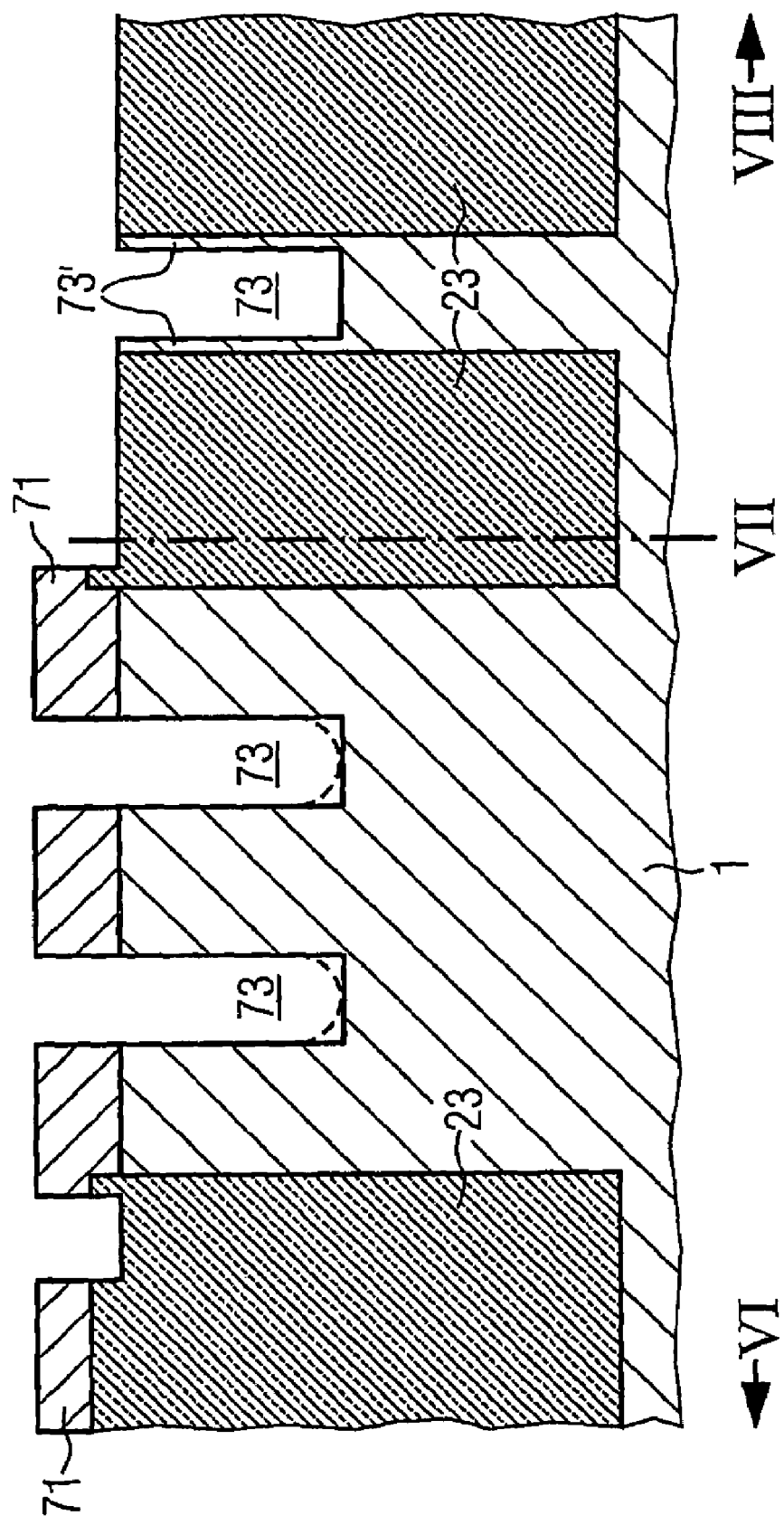

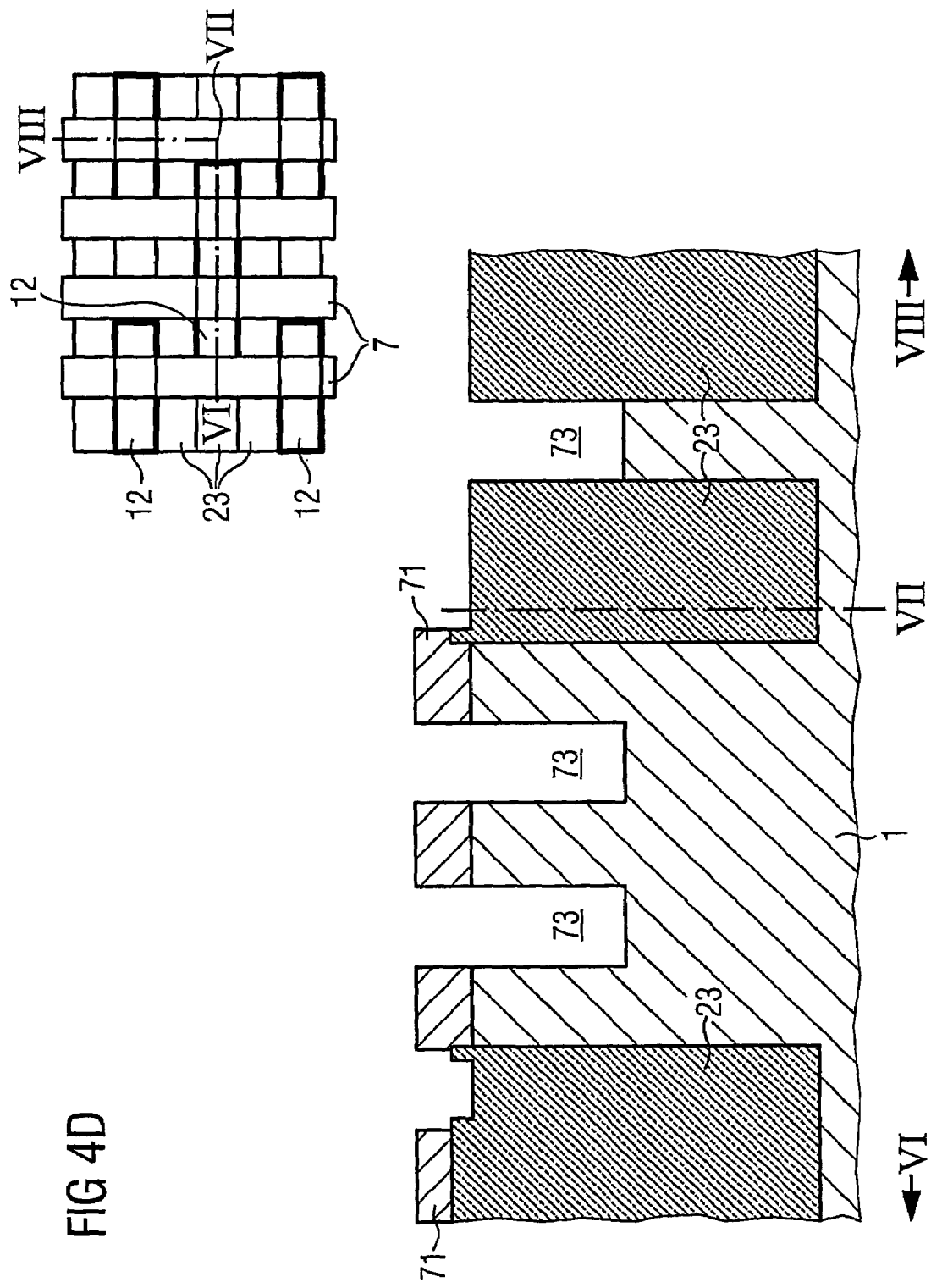

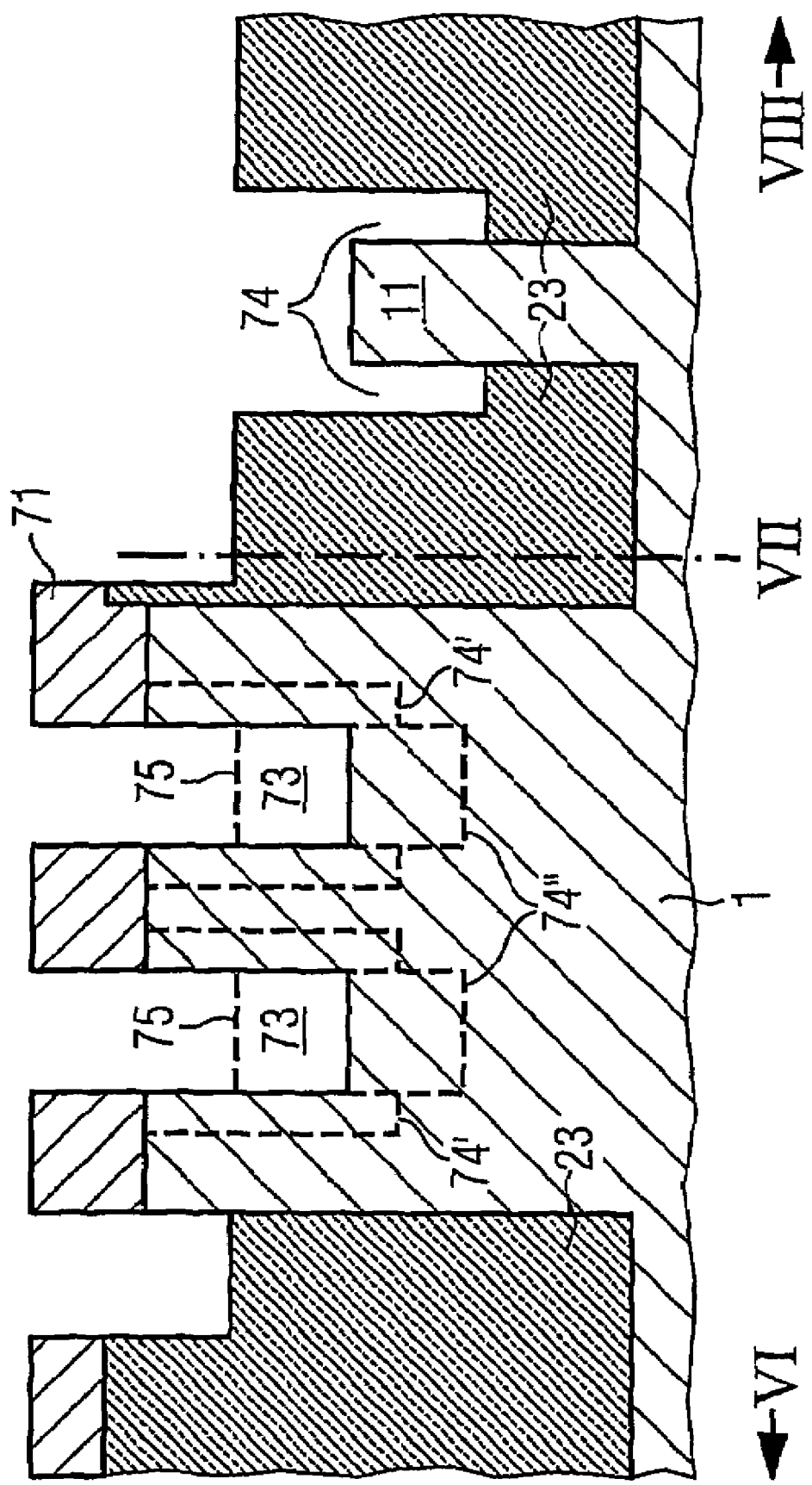

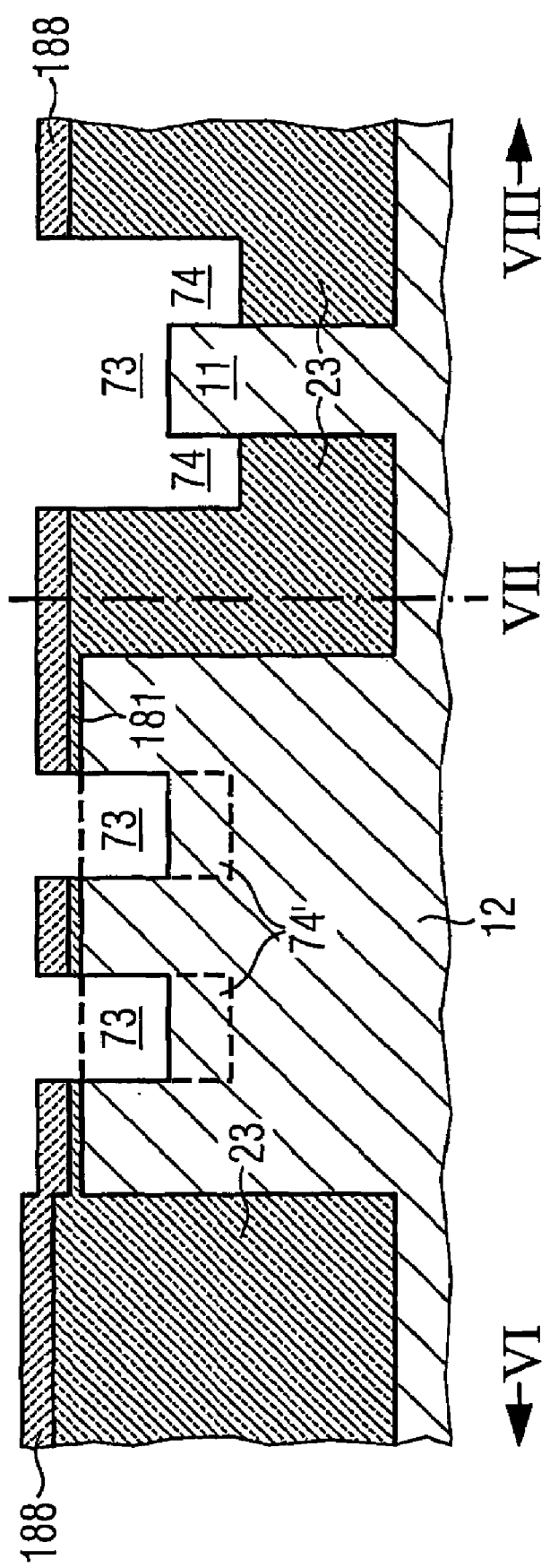

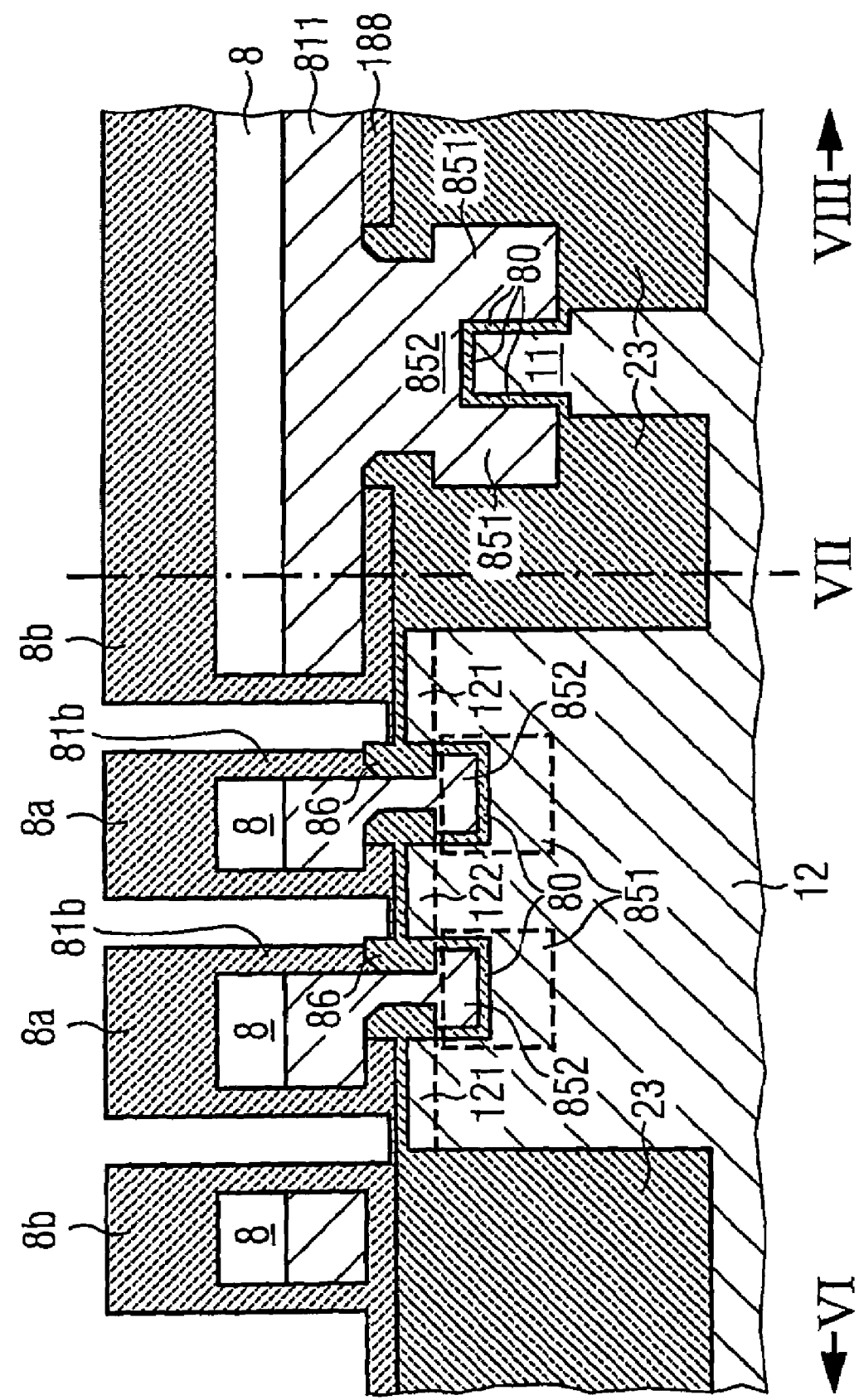

TRANSISTOR, MEMORY CELL ARRAY AND METHOD OF MANUFACTURING A TRANSISTOR

CROSS-REFERENCE TO RELATED APPLICATIONS

This Utility Patent Application is a continuation-in-part of U.S. patent application Ser. No. 10/939,255, entitled "TRANSISTOR, MEMORY CELL ARRAY AND METHOD OF MANUFACTURING A TRANSISTOR," and having a filing date of Sep. 10, 2004 now U.S. Pat. No. 7,132,333; and claims the benefit of German Patent Application No. DE 10 2004 031 385.7 filed on Jun. 29, 2004, both of which are incorporated herein by reference.

FIELD OF THE INVENTION

The present invention relates to a transistor, a memory cell array including a plurality of memory cells incorporating the transistor, as well as a method of manufacturing a transistor.

BACKGROUND

Memory cells of a dynamic random access memory (DRAM) comprise a storage capacitor for storing an electrical charge which represents an information to be stored, and an access transistor for addressing the storage capacitor. The access transistor includes a first and a second source/drain regions, a conductive channel adjacent to the first and second source/drain regions as well as a gate electrode controlling an electrical current flowing between the first and second source/drain regions. The transistor usually is formed in a semiconductor substrate. The information stored in the storage capacitor is read out or written in by addressing the access transistor. There is a lower boundary of the channel length of the access transistor, below which the isolation properties of the access transistor in an non-addressed state are not sufficient. The lower boundary of the effective channel length $L_{eff}$ limits the scalability of planar transistor cells having an access transistor which is horizontally formed with respect to the substrate surface of the semiconductor substrate.

Vertical transistor cells offer a possibility of enhancing the channel length while maintaining the surface area necessary for forming the memory cell. In such a vertical transistor cell the source/drain regions of the access transistor as well as the channel region are aligned in a direction perpendicular to the substrate surface. One of the problems involved with such a vertical transistor cell is the difficulty in providing a surface contact to a stacked capacitor. Accordingly, such a vertical transistor is difficult to integrate with a stack capacitor.

A concept, in which the effective channel length $L_{eff}$ is enhanced, refers to a recessed channel transistor, as is for example known from U.S. Pat. No. 5,945,707. In such a transistor, the first and second source/drain regions are arranged in a horizontal plane parallel to the substrate surface. The gate electrode is arranged in a recessed groove, which is disposed between the two source/drain regions of the transistor in the semiconductor substrate. Accordingly, the effective channel length equals to the sum of the distance between the two source/drain regions and the two fold of the depth of the recess groove. The effective channel width $W_{eff}$ corresponds to the minimal structural size F.

Another known transistor concept refers to the FinFET. The active area of a FinFET usually has the shape of a fin or a ridge which is formed in the semiconductor substrate between the two source/drain regions. A gate electrode encloses the fin at two or three sides thereof.

Memory devices usually comprise a memory cell array as well as a peripheral portion. The peripheral portion includes circuitry for operating the memory cell array. With shrinking ground rules for the memory cells a problem arises, that the peripheral portion consumes much space and, in addition, suffers from reliability problems which are for example due to the scaling of the bitline voltage and the wordline voltage. Accordingly, a transistor is desirable, which solves the problems mentioned above and which can as well be used in the peripheral portion of a memory device.

SUMMARY

Embodiments of the invention provide a transistor, a memory cell array, and a method of manufacturing a transistor. In one embodiment, the invention provides a transistor, which is formed at least partially in a semiconductor substrate, including a first and a second source/drain regions, a channel region connecting said first and second source/drain regions, said channel region being disposed in said semiconductor substrate, and a gate electrode disposed along said channel region and being electrically insulated from said channel region, for controlling an electrical current flowing between said first and second source/drain regions, wherein said channel region includes a fin-region in which the channel has the shape of a ridge, said ridge including a top side and two lateral sides in a cross section perpendicular to a line connecting said first and second source/drain regions, wherein said top side is disposed beneath a surface of said semiconductor substrate and said gate electrode is disposed along said top side and said two lateral sides.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A to 1C illustrate exemplary embodiments of a transistor of the present invention.

FIGS. 3A to 3L illustrate another embodiment of a memory cell array of the present invention.

FIGS. 4A to 4J illustrate another embodiment of a memory cell array of the present invention.

FIGS. 5A to 5K illustrate another embodiment of a memory cell array of the present invention.

DETAILED DESCRIPTION

Figure 2A:
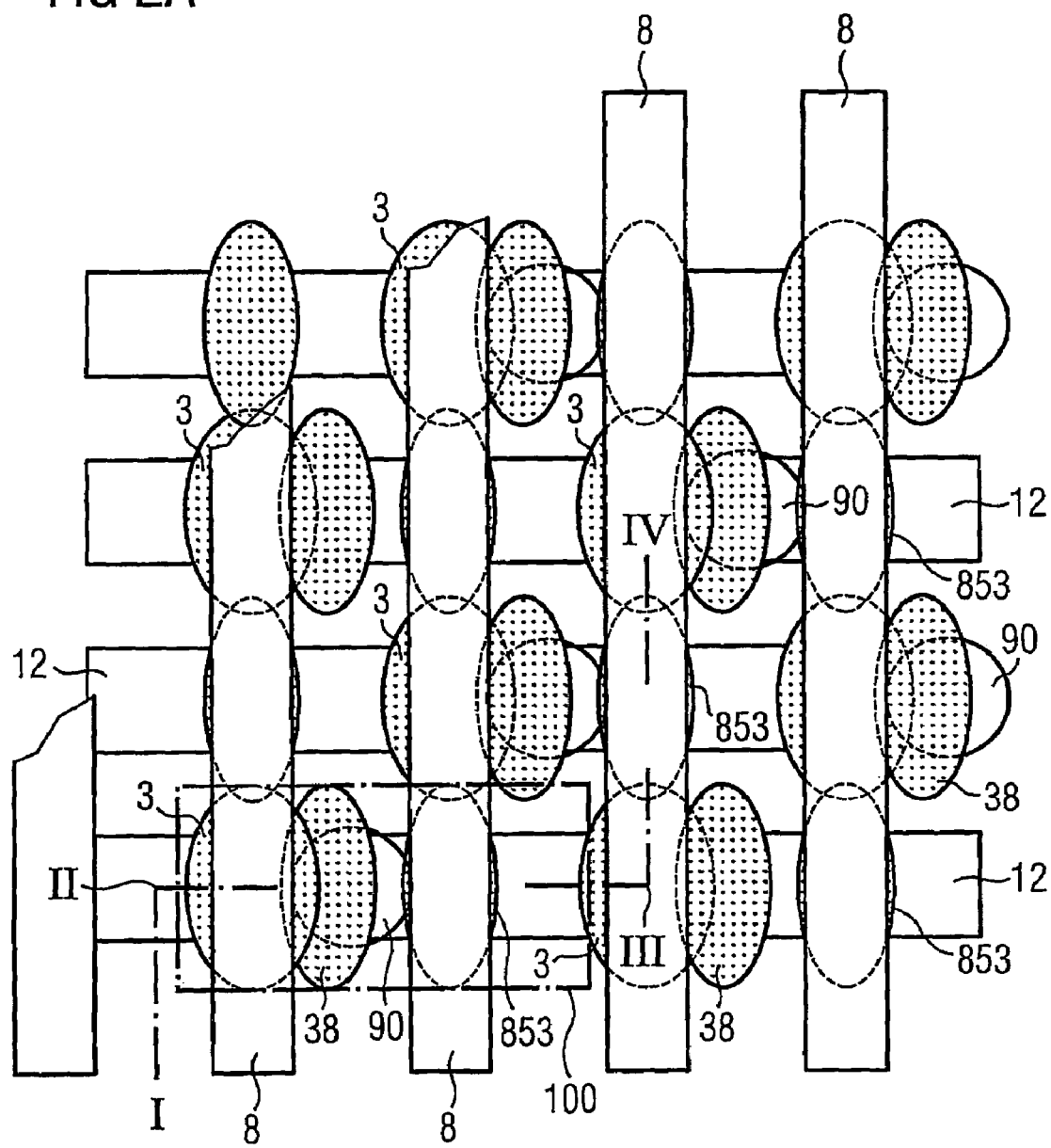
FIGS. 2A to 2W illustrate one embodiment of a memory cell array of the present invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a transistor that eliminates the problems involved with conventional transistors. The present invention provides a memory cell array as well as a method of manufacturing a transistor.

These and other needs are achieved by a transistor, said transistor being formed at least partially in a semiconductor substrate, including a first source/drain region, a first contact region which is adapted to connect the first source/drain region with an electrode of a storage capacitor, a second source/drain region, a second contact region which is adapted to connect the second source/drain region with a bitline, a channel region connecting said first and second source/drain regions, said channel region being disposed in said semiconductor substrate, and a gate electrode disposed along said channel region and being electrically insulated from said channel region by a gate insulating layer, said gate electrode controlling an electrical current flowing between said first and second source/drain regions, wherein said channel region includes a fin-region in which said channel region has the shape of a fin and in which the gate electrode is disposed at three sides of the channel region, wherein a current path connecting said first and second contact regions includes a first vertical region in which the direction of said current has a component in a first vertical direction, a horizontal region in which the direction of said current has a horizontal component, and a second vertical region in which the direction of said current has a component in a second vertical direction, said first vertical direction being opposed to said second vertical direction.

Accordingly, the transistor of the present invention is implemented as a FinFET, having an active area with the shape of a ridge or a fin. Thereby, the conductive channel connecting first and second source/drain regions can be fully depleted, whereby an off-current of the transistor is reduced. In addition, since the current path additionally includes a vertical component, the off-current can further be reduced.

The present invention additionally provides a transistor, said transistor being formed at least partially in a semiconductor substrate, including a first source/drain region, a second source/drain region, a channel region connecting said first and second source/drain regions, said channel region being disposed in said semiconductor substrate, a first direction being defined by a line connecting said first and second source/drain regions, and a gate electrode disposed along said channel region and being electrically insulated from said channel region by a gate insulating layer, said gate electrode controlling an electrical current flowing between said first and second source/drain regions, wherein said channel region includes a fin-region in which the channel has the shape of a fin, said fin including a top side and two lateral sides in a cross section perpendicular to said first direction, wherein said top side is disposed beneath a surface of said semiconductor substrate and said gate electrode is disposed along said top side and said two lateral sides.

According to a preferred embodiment the distance between said top side and said substrate surface, measured in a direction perpendicular to said substrate surface, is 10 to 200 nm. If the distance between the top side and the substrate surface is smaller than 10 nm the advantageous effects of the present invention will be too weak. On the other hand, if the distance between the top side and the substrate surface is larger than 200 nm, the channel length and, as a consequence, the channel resistance will remarkably be increased.

Moreover, the present invention provides a memory cell array including a plurality of memory cells, a plurality of bitlines which are arranged in a first direction and a plurality of wordlines which are arranged in a second direction intersecting said first direction, a memory cell including a storage capacitor, a transistor, which is at least partially formed in a semiconductor substrate, said transistor including a first source/drain region, a second source/drain region, a channel region connecting said first and second doped regions, said channel region being disposed in said semiconductor substrate and a gate electrode disposed along said channel region and being electrically insulated from said channel region, said gate electrode controlling an electrical current flowing between said first and second source/drain regions, wherein said channel region includes a fin-region in which the channel has the shape of a fin, said fin including a top side and two lateral sides in a cross section perpendicular to a line connecting said first and second source/drain regions, wherein said top side is disposed beneath a surface of said semiconductor substrate and said gate electrode is disposed along said top side and said two lateral sides, wherein each of said wordlines is electrically connected with a plurality of gate electrodes, and wherein said second source/drain region of each of said transistors is connected with one of said bitlines via a bitline contact.

In addition, the present invention provides a method of manufacturing a transistor in a semiconductor substrate, including the steps of providing said semiconductor substrate, defining two isolation trenches a surface of said semiconductor substrate, for laterally confining an active area in which the transistor is to be formed, filling said isolation trenches with an insulating material, providing a gate electrode which is insulated from said active area by a gate insulating material, providing a first and a second source/drain regions, wherein a conductive channel is formed between said first and second source/drain regions, a first direction being defined by a line connecting said first and second source/drain regions, wherein said step of providing a gate electrode includes the steps of defining a groove in said active area, said groove extending from said surface of said semiconductor substrate in a direction perpendicular to said surface to a first depth, thereafter, defining a pocket in each said isolation trenches at a position adjacent to said groove so that said two pockets will be connected with said groove and said groove is disposed between said two pockets, said two pockets extending to a second depth larger than said first depth, providing a gate insulating material at an interface between said active area and said groove and at an interface between said active area and said pockets, depositing a gate electrode material so as to fill said groove and said two pockets, partially removing said gate electrode material so that said gate electrode material is removed from the portions outside said groove and said two pockets.

According to the present invention, since the step of providing a gate electrode includes the step of forming a groove in the active area thereby defining the recessed channel portion, it is possible to align the recessed channel with the gate electrode.

According to a preferred embodiment, the method further includes the step of thinning the active area at a portion between said first and second depths in a direction parallel to said substrate surface and perpendicular to said first direction.

Thereby, it is possible to locally thin the active area at the channel region which will later be enclosed by the gate electrode, while maintaining the area of the active region outside the gate electrode region. In particular, the width of the source/drain regions is maintained. As a consequence, the junction contact area will not be thinned whereby a contact resistance is reduced.

According to another embodiment the two pockets are defined by wet etching. Accordingly, the two pockets can be formed in a self-aligned manner since they will only be formed at the portion adjacent to the groove portion of the gate electrode. In addition, in case the groove portions are defined by wet etching, it is possible to implement the method in such a manner that the passing wordlines of the memory cell array will be at a position near the surface of the semiconductor substrate so that an influence of the passing wordlines on the adjacent active area will be decreased.

According to another embodiment of the present invention, the step of providing a gate electrode includes the steps of defining a pocket in each of said isolation trenches, said two pockets extending to a second depth, thereafter, defining a groove in said active area at a position adjacent to the position of said pockets, so that said groove is disposed between said two pockets and is electrically connected with said two pockets, said groove extending from said surface of said semiconductor substrate in a direction perpendicular to said surface to a first depth, wherein said second depth is larger than said first depth, providing a gate insulating material at an interface between said active area and said groove and at an interface between said active area and said pockets, depositing a gate electrode material so as to fill said groove and said two pockets, partially removing said gate electrode material so that said gate electrode material is removed from the portions outside said groove and said two pockets. In this case, it is especially preferred that the pockets are formed parallel to each other so as to make an alignment of the pockets and the groove portion of the gate electrode easier.

The transistor of the present invention can in particular be employed in a DRAM memory cell including a capacitor and an access transistor. Nevertheless, the transistor of the present invention can as well be employed in the core circuitry of a memory device. In particular, the transistor of the present invention can form part of a word line driver.

In addition, the transistor of the present invention can be employed in any kind of circuits or applications.

FIG. 1A illustrates a cross-sectional view of the transistor 16 along a direction connecting first and second source/drain regions 121, 122.

The transistor 16 includes a first and a second source/drain regions 121, 122 and a channel 14 connecting the first and second source/drain regions 121, 122. The conductivity of the channel is controlled by the gate electrode 85. The active area 12 has the shape of a fin or a ridge and three sides of the fin are enclosed by the gate electrode.

The first and second source/drain regions 121, 122 are disposed in the surface region of a semiconductor substrate 1. The gate electrode 85 includes a groove region 852 and two plate-like portions 851. The groove region of the gate electrode 85 is disposed in a groove etched in the substrate surface 10. Accordingly, the top side of the active area is disposed at a deeper depth than the surface 10 of the semiconductor substrate. The plate-like portions extend in a plane which lies before and behind the depicted cross-section and therefore are illustrated with broken lines. The lower part of the groove region 852 is electrically insulated from the silicon material by the gate oxide layer 80. The first and second source/drain regions 121, 122 are electrically insulated from the groove-portions 852 by the silicon nitride spacer 86. In addition, the sacrificial silicon oxide layer 181 is disposed between the silicon nitride spacer 86 and the first and second source/drain regions 121, 122. The first contact region 93 is provided so as to electrically connect the first source/drain region 121 with the storage capacitor, and a second contact region 94 is provided so as to electrical connect the second source/drain region with a bit line (not illustrated).

The detailed implementation of the first and second contact regions 93, 94 will be described later with respect to the first to fourth embodiments of the present invention.

The gate electrode 85 usually is made from polysilicon. The first and second source/drain regions 121, 122 are implemented as lightly n⁻ doped silicon region and, consequently, exhibit an excellent electrical conductivity. Optionally, the first source/drain region 121 or both source/drain regions 121, 122 may additionally comprise a lightly doped region (not illustrated), which is disposed between the channel region and the highly doped regions, respectively. The channel 14 is lightly p⁻ doped and therefore insulates the first from the second source/drain regions unless a suitable voltage is applied to the gate electrode 52.

A current path between the first and the second contact regions 93, 94 first extends in a first vertical direction, i.e., downwards, thereafter in a horizontal direction, and then upwards that is in a second vertical direction which is opposite to the first vertical direction. Differently stated, the current path includes the channel region 14 as well as the distance from the boundary of the source/drain region 121 to the contact region 93, 94.

Accordingly, a current flowing from the first to the second contact region 93, 94, will first have a weakly gated vertical path, thereafter, a strongly gated vertical path, followed by a strongly gated horizontal path, a strongly gated vertical path and, thereafter, a weakly gated vertical path. Differently stated, since the current path includes a portion extending in a recess which is formed in the substrate surface, a minimum distance between the heavily doped first and second source/drain regions 121, 122 is increased in comparison with a FinFET in which the active area is disposed along the substrate surface and in which the current path includes only a horizontal path. As a consequence, an electrical field at the source/drain region—channel junction and, consequently, a leakage current is reduced. Moreover, the highly doped regions 121, 122 are screened from the gate electrode 852 by the spacer portion 86, so that the influence of the electric field of the gate electrode on the heavily doped regions is reduced.

FIG. 1B illustrates a cross-section of the transistor in a direction perpendicular to the direction of FIG. 1A. In particular, there is shown a section across the fin region 11 of the active area that is a portion of the active area having a narrow width, the fin region being surrounded on three sides thereof by the gate electrode. In the fin region 1 the active area has the form of a ridge or a fin. The active area has a top side 11a and two lateral sides 11b, the length of the top side 11a being smaller than the length of the lateral sides 11b.

In FIG. 1B, the plate-like portions 851 of the gate electrode 851 are disposed along the lateral sides 11b of the fin, whereas the groove-like portion 852 of the gate electrode is disposed along the top side 11a of the fin. The gate electrode 85 is insulated from the fin region 11 by the gate oxide 80. As can be seen from FIG. 1B, the current path 15 is in a direction perpendicular to the plane depicted in FIG. 1B.

Due to the narrow width of the fin region, the transistor body can be fully depleted, so that the off-current of the transistor can be improved. According to a preferred embodiment of the present invention, the fin region can be locally thinned so that the width of the channel region is made smaller than the width of the first and second source/drain regions. As a consequence, the off-current of the transistor can be further improved with respect to the known transistor while the contact area of the source/drain regions is not decreased. As a result the contact resistance is not increased.

In the structure illustrated in FIGS. 1A and 1B, the length $L_{eff}$ of the channel corresponds to the distance between first and second source/drain regions. In addition, the width of the channel corresponds to the width of the region the conductivity of which is controlled by the gate electrode. Accordingly, the width of the channel corresponds to the sum of the double of the fin height and the fin width or, differently stated, to the double of the length of the lateral side and the length of the top side of the ridge. In particular, the channel length $L_{eff}$ can be 30 to 150 nm. Moreover, the height of the fin can be 20 to 100 nm and the fin width can be 10 to 50 nm.

Accordingly, the transistor of the present invention provides an improved on-current in comparison with known transistors, since the width of the channel is increased whereby the resistance is reduced. Moreover, the transistor exhibits a larger slope of the subthreshold characteristics and a remarkably reduced body effect. Thereby, the on-current is further increased.

The transistor additionally provides an improved off-current due to its larger channel length and the larger slope of its subthreshold characteristics, in comparison to a known transistor.

In summary, the transistor illustrated in FIGS. 1A and 1B combines an improved on-current with a decreased off-current.

FIG. 1C illustrates a modification of the transistor structure illustrated in FIG. 1A. In FIG. 1C, the first source/drain region includes a heavily doped portion 121" and a lightly doped region 121'. The lightly doped region 121' extends to the same depth as the second source/drain region 122.

By providing the lightly doped region 121' between the heavily doped region 121" and the channel 14, the electrical field can be reduced. Accordingly, a junction leakage current can be reduced.

Generally speaking, the leakage current correspond to the current flowing from the storage capacitor to the second source/drain region or the silicon body when the gate electrode is not addressed. Since especially the electric fields at the first source/drain region—channel junction highly influence the leakage current, it is advantageous to reduce the electric field at the first source/drain region—channel junction. By reducing the leakage current, the retention time, i.e., the time during which an information is recognizably stored in the memory cell, can be increased.

Accordingly, as the inventors of the present invention found out, an asymmetric arrangement of first and second source/drain regions, in particular, the arrangement illustrated in FIG. 1C in which the first source/drain region 121 includes a lightly and a heavily doped portion and the lightly doped portion 121' extends to the same depth as the second source/drain region 122 is highly advantageous.

Nevertheless, it lies within the scope of the present invention that also the second source/drain region 122 includes a lightly and a heavily doped portion wherein the lightly doped region is arranged between the heavily doped region and the channel region. In particular, the first and second source/drain regions including lightly and heavily doped portions can be arranged in a symmetric manner.

According to the embodiment illustrated in FIG. 1C, the lower side of the lightly doped first source/drain region 121' is disposed beneath the lower edge of the groove portion 852 of the gate electrode or than the top side of the fin region. As a consequence, the effective width of the first source/drain region can be remarkably increased. Since this width mainly determines an on-current, the on-current characteristics of the transistor are further improved.

The heavily doped first source/drain region 121 which will later be connected with the storage capacitor is shielded from the gate electrode by the thick spacer 86'. Accordingly, the electric field at the junction, which is connected with the storage load will be reduced. As a consequence, the retention time will further be increased.

As has been mentioned above, the transistor as described above can be employed as a transistor forming part of a memory cell. Moreover, the transistor can form part of a word line driver.

In particular, the transistor which is employed in a peripheral portion of a memory device, has less severe restrictions with respect to the leakage current of the transistor. According to the present invention, it is intended, that the transistor as defined in the claims clearly encompasses all transistors including the features as defined therein, independently from the leakage current characteristics thereof.

FIGS. 2A to 2W illustrate a first embodiment of the present invention, in which a memory cell array including a transistor of the present invention and a trench capacitor are implemented.

FIG. 2A illustrates a plan view on the memory cell array, including a plurality of memory cells 100, each memory cell including a trench capacitor 3 and a transistor 16. A plurality of word lines 8 is arranged in a first direction, and a plurality of bit lines is arranged perpendicularly to the word lines 8. Also illustrated in FIG. 2A are the sites I, II, III and IV, which illustrate the directions along which the cross-sectional views illustrated in FIG. 2B, for example, are taken.

More specifically, the cross-sectional view from I to II illustrates a cross-section perpendicular to a bit line between two adjacent word lines 8, whereas the cross-sectional view from II to III illustrates a cross-section perpendicular to the word lines along a bit line 9, and the cross-sectional view from III to IV illustrates a cross-section perpendicular to the bit line 9 along a word line 8.

Figure 2B:
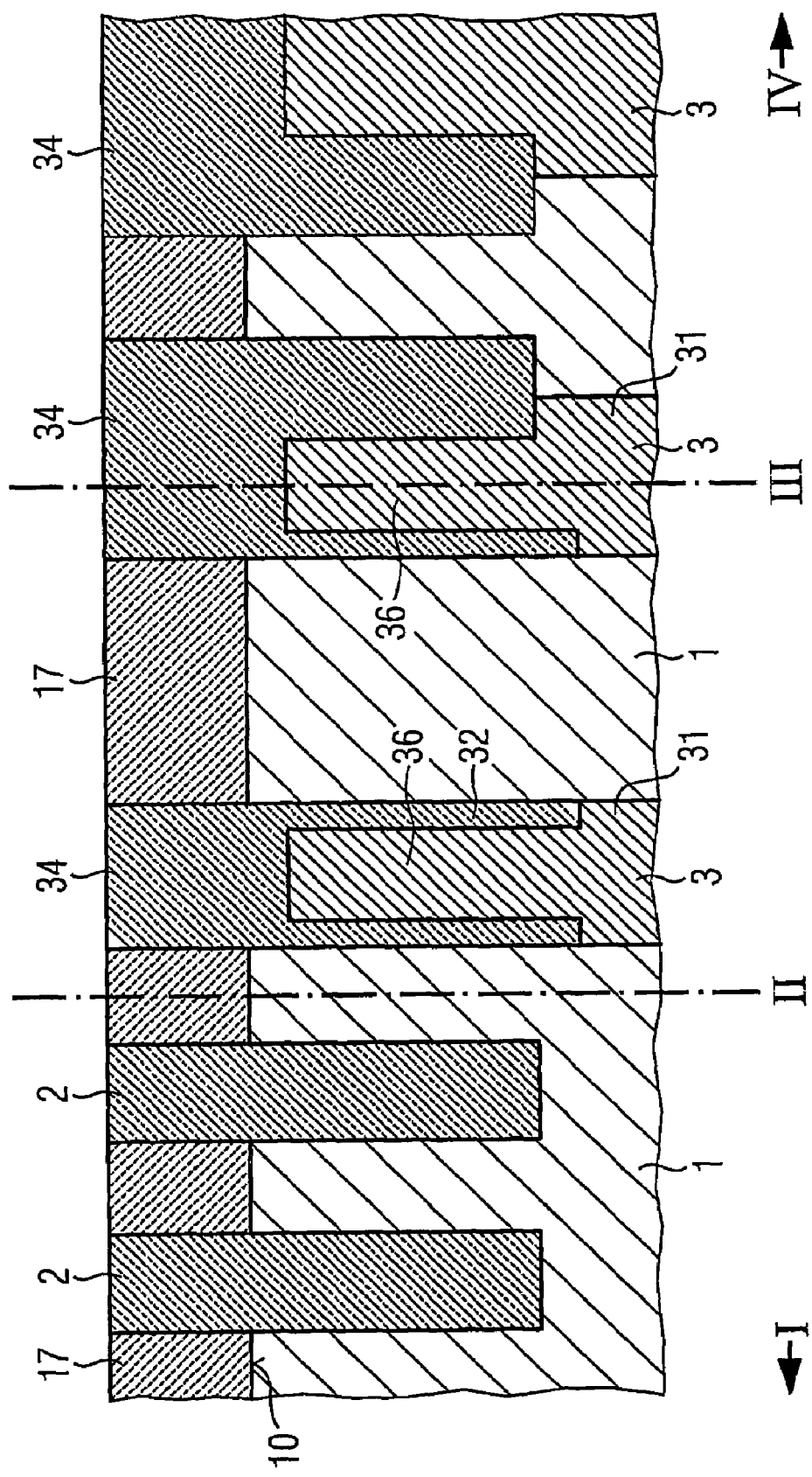

FIG. 2B illustrates three cross-sectional views which are taken from site I to II, from II to III, and III to IV of a memory cell array after defining the capacitor trenches. The structure illustrated in FIG. 2B can for example be obtained by depositing first, a pad oxide layer (not illustrated), and a nitride layer 17 as commonly used in the art, on a semiconductor substrate 1, by generally well known methods. Thereafter, the capacitor trenches are photolithographically defined by known methods. In particular, openings corresponding to openings in a trench mask are etched into a hard mask layer (not illustrated) deposited above the silicon nitride layer 17. Thereafter, the openings are etched into the silicon nitride layer 17, the pad oxide layer as well as the silicon substrate 1.

In addition, a first capacitor electrode, as well as the capacitor dielectric are formed by generally known methods. Thereafter, a polysilicon filling 31 is filled into the capacitor trenches, the polysilicon fill is recessed and an isolation collar 32 is formed in the upper part of the trench capacitor, in order to suppress a parasitic transistor, which otherwise could be formed at this portion. The resulting structure is filled with a second polysilicon filling and planarized by known methods.

Thereafter the polysilicon filling is recessed in a manner similar to the recess 3 etching step which is performed when forming a buried strap. In particular, the polysilicon filling is etched 30 nm below the substrate surface 10.

A plan view on the arrangement of capacitor trenches is illustrated in FIG. 2C, in which a plurality of capacitor trenches 3 are arranged in a checkerboard manner. Differently stated, the capacitor trenches are arranged in rows, in which two neighbouring trenches have an equal distance and the trenches of two adjacent rows are arranged in a staggered manner so that the trenches of a row are disposed at a position in the middle between two adjacent trenches of the adjacent rows. The size of a memory cell 100 is 2 F in a first direction and 4 F in a second direction, wherein F denotes the minimal structural size obtainable in the corresponding technology.

Next, the active areas are defined photolithograghically and isolation trenches 2 are etched so as to expose the active areas. It is intended that the final width of the active areas is equal to 0.8 F. For example, F can be 100, 80 or 50 nm or assume any desired value. Thereafter, the active areas are oxidized by a thermal process and the trenches between adjacent active areas are filled with a commonly used STI fill. In the present example the isolation trenches are filled with a silicon dioxide layer which also fills the upper part of the capacitor trenches 3 and forms the trench top oxide 34.

Figure 2D:
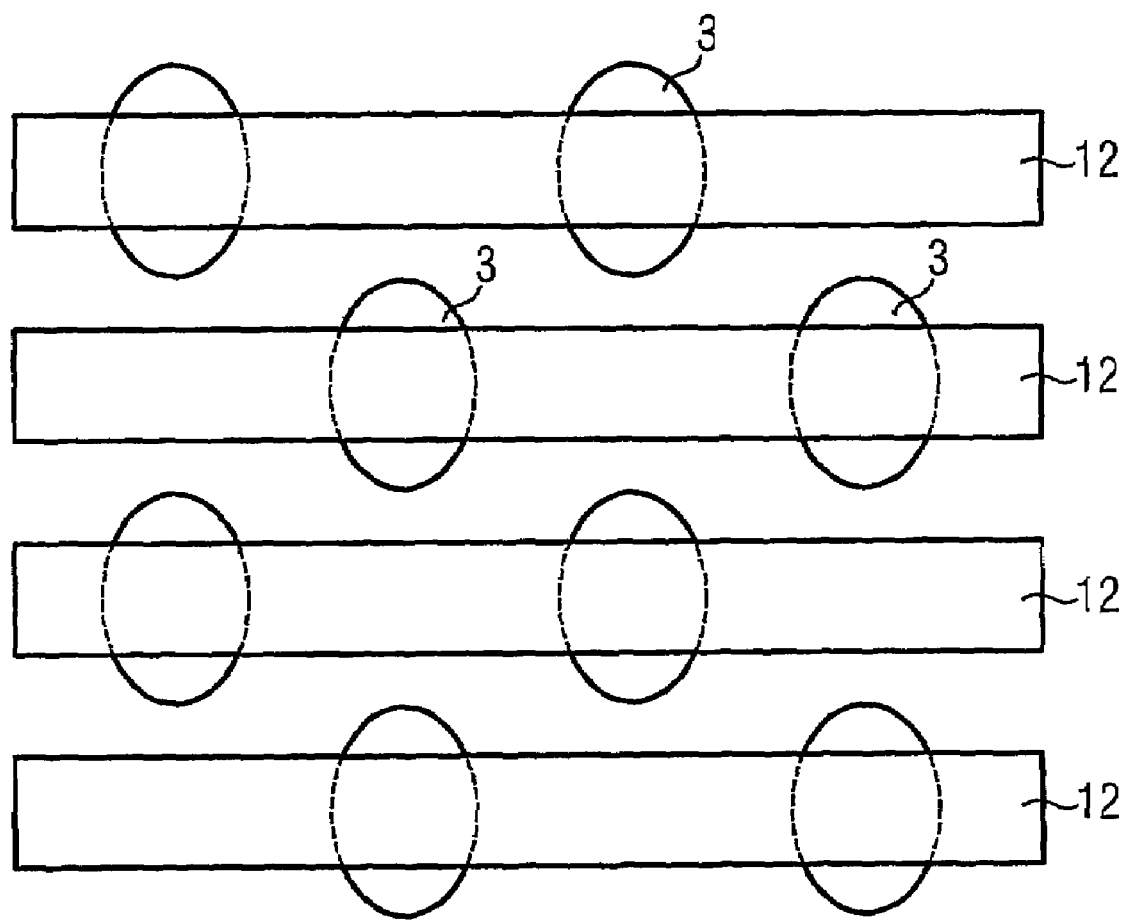

After defining the active areas, the arrangement illustrated in FIG. 2D is obtained, in which reference numeral 12 denotes the active areas. It is to be noted that in the plan view of FIG. 2D, after etching the isolation trenches, the upper part and the lower part of each of the capacitor trenches 3 are etched as well.

Next, the semiconductor substrate 1 is shortly dipped in diluted HF, for example, so as to remove a surface oxide layer (oxide deglaze step). It is intended that the final step height at the isolation trenches is 0 nm. Thereafter, the silicon nitride layer 17 and the pad oxide layer (not illustrated) are removed by known methods. Thereafter, a sacrificial oxide layer 181 is thermally grown, and the implantation processes in order to form the doped well regions, which are commonly used in memory cell are performed.

Figure 2E:
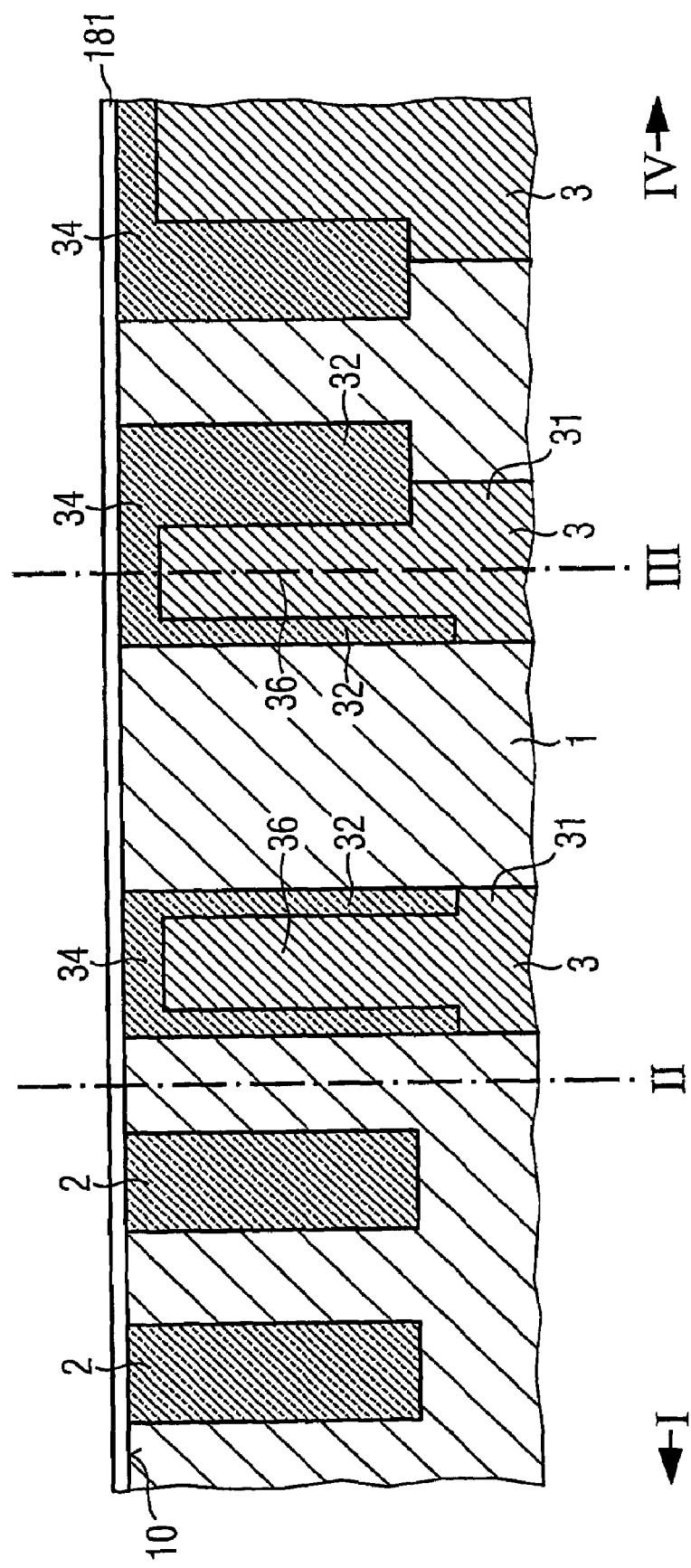

At this point, possibly a blanket light source/drain implant for the drift region, i.e., the weakly gated portion (not illustrated) of the current path could be performed. These process steps result in the structure illustrated in FIG. 2E.

Next, a silicon nitride layer 182 having a thickness of about 10 nm is deposited by known methods so as to act as a liner layer in a following damascene process. Thereafter, a silicon oxide layer 183 having a thickness of about 100 nm is deposited by known methods. Finally, a polysilicon layer 184 having a thickness of about 80 nm, acting as a mask layer is deposited by known methods. The resulting structure is illustrated in FIG. 2F.

Using a GC array mask (not illustrated) having a pitch of 1.4×2.2 F, the openings for providing the gate electrodes are photolithograghically defined by known methods. Thereafter, the polysilicon layer 184 is etched at the defined portions, and thereafter, the silicon oxide layer 183 is etched, stopping on the liner layer 182. After removing the silicon nitride layer 182, an etching step is performed so as to etch silicon and silicon oxide, until a depth of 40 nm below the silicon surface 10 is achieved. The resulting structure is illustrated in FIG. 2G.

Figure 2H:
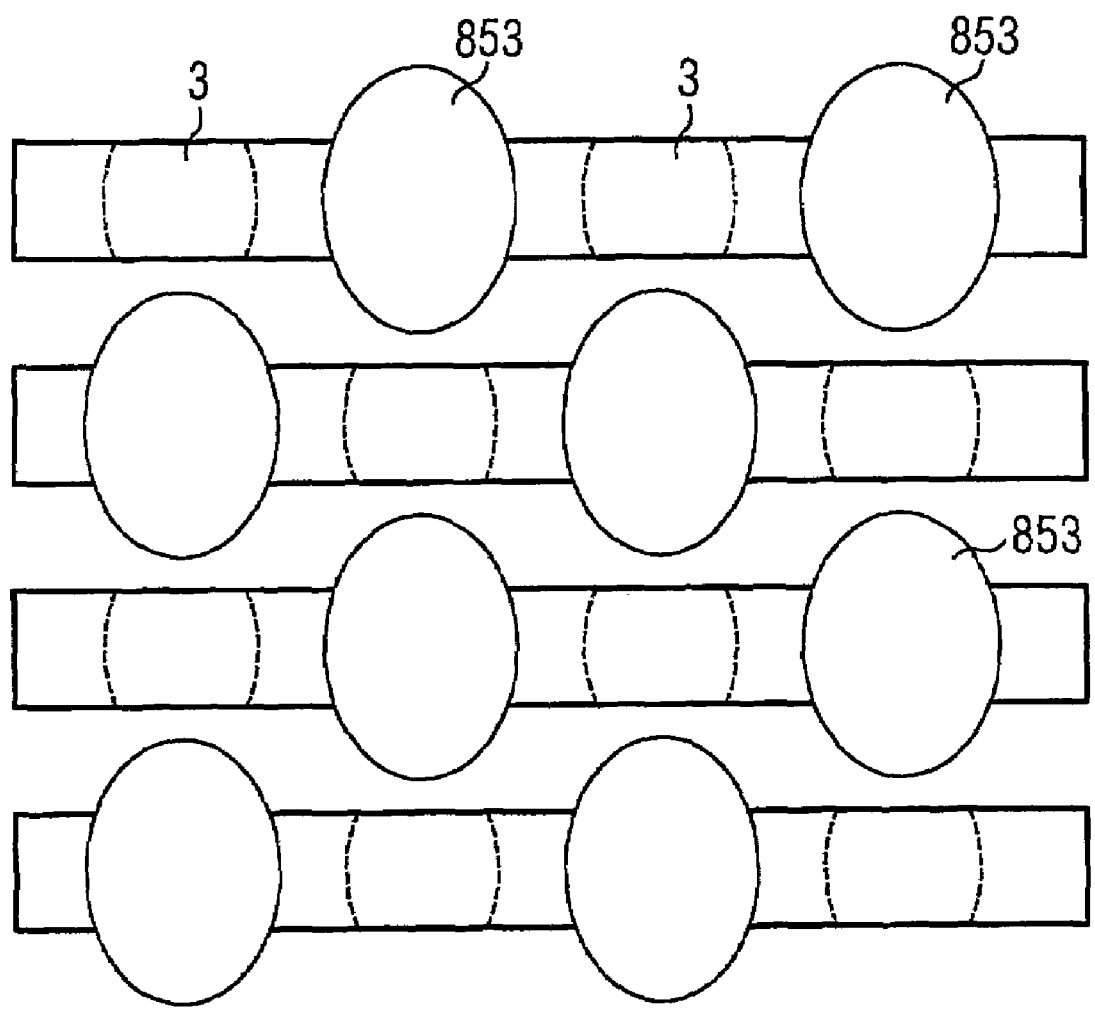

FIG. 2H illustrates a plan view of the resulting structure, in which in the spaces between two neighbouring trenches in one active area row is disposed one gate electrode 853.

Thereafter, a further sacrificial oxide layer 181' is thermally grown on the exposed silicon portions, in particular, the bottom and the lower part of the sidewalls of the trenches defined for the gate electrodes 853. Thereafter a silicon nitride spacer layer 86 is deposited and etched so that a final thickness of 0.2 F remains at the sidewalls of the defined GC mask openings.

The sacrificial oxide layer 181' is advantageous since thereby an oxide interface is provided between the silicon portions in which later the source/drain regions will be formed and the nitride spacer. As a consequence, in the transistor to be formed, there will be less surface states and, thereby, less leakage current in comparison to a transistor in which the source/drain regions are directly adjacent to the silicon nitride spacer.

The steps described above will result in the structure illustrated in FIG. 2I.

Thereafter, the gate electrode regions are further etched. In particular, the bottom part of the sacrificial oxide layer 181' is etched. In addition, the silicon oxide layer 32 is etched selectively to silicon and silicon nitride. As a consequence, in the cross-sectional region between III and IV, pockets are formed in the silicon oxide layer 32. The pockets extend to a depth of 100 to 120 nm below the substrate surface 10.

Thereafter an isotropic etch is performed so as to remove the silicon portions adjacent to the pockets formed in the previous step. Thereby, the fin regions forming part of the active regions are thinned, for example 10 to 15 nm on each side so as to achieve a final fin width of 30 nm. As a consequence, the channel can be fully depleted by applying an appropriate voltage to the gate electrode. Nevertheless, since the fin has only locally be thinned at the portions adjacent to the gate electrode, the contact area of the source/drain regions has not been decreased and, consequently, the contact resistance has not been increased. In particular, due to the damascene process as described, the thinned active area and the gate electrode are formed in a self-aligned manner.

The resulting structure is illustrated in FIG. 2J. As can be seen from the cross-sectional view between II and III, the defined GC region 854 extends to a deeper depth than the side wall spacers 86. In addition, as can be seen from the cross-sectional view between III and IV, the defined GC region 854 includes a central portion and two side wall portions which extend to a deeper depth than the central portion.

After an optional step of forming a sacrificial oxide layer (not illustrated) for reducing an ion channeling effect, and performing an ion implantation step for doping the channel region, if needed, the gate oxide layer 80 is grown. Thereafter, a polysilicon layer 185, having a thickness of 40 nm, which is in situ doped with phosphorous, is deposited.

Figure 2K:
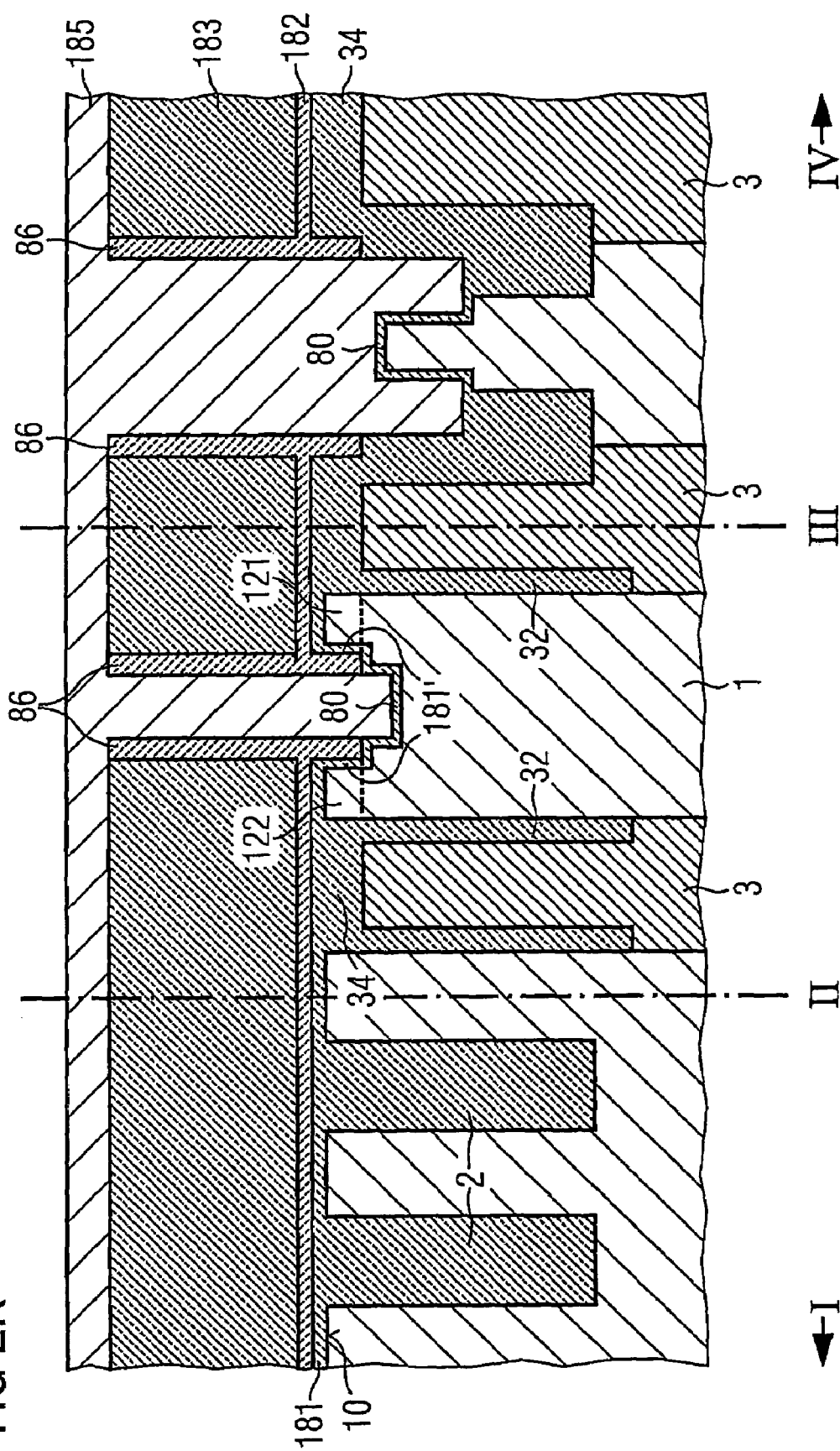

The resulting structure is illustrated in FIG. 2K.

Thereafter, the polysilicon layer 185 is etched to 70 nm below the polysilicon surface that is illustrated in FIG. 2K, forming the gate electrode 85. Thereafter, a silicon nitride layer 186 is deposited so as to fill the regions above the gate electrode 85.

The resulting structure is illustrated in FIG. 2L. As is depicted in FIG. 2L, the gate electrode 85 includes a groove portion 852 and two plate portions 851.

After removing the silicon nitride layer 186 from the surface, the silicon oxide layer 183 is removed, and the source/drain-implants defining the first and second source/drain regions 121, 122 are performed. Thereafter, a silicon oxide layer 183 is again deposited and the GC connect lines are provided. To this end, first, the silicon nitride filling 186 is removed exposing the gate electrode 852. Thereafter an additional $Si_3N_4$ spacer 87 having a thickness of 0.2 F is deposited. Accordingly an inner spacer 87, which is thicker than the spacer 86 encloses the GC connect lines. Finally, a doped polysilicon layer 187 is deposited, so as to fill the openings for the GC connect lines 83.

The resulting structure is illustrated in FIG. 2M. In the next steps, the surface strap regions will be defined. In particular, the strap regions are photolithograghically defined by known methods, so as to open the polysilicon layer 187 at predetermined portions. Taking the patterned polysilicon layer 187 is a mask, the silicon oxide 183 is etched selectively with respect to polysilicon and silicon nitride. Thereafter, a silicon nitride liner break through step is performed, and finally the trench top oxide layer 34 is etched selectively with respect to polysilicon/silicon nitride.

The resulting structure is illustrated in FIG. 2N.

FIG. 2O illustrates a plan view on the resulting memory cell array. The strap mask openings 35 are formed between a capacitor trench 3 and a defined GC region 854.

Thereafter, the exposed GC SiN spacer is removed, a pad oxide layer (not illustrated) is grown and a silicon nitride spacer 37 acting as a strap spacer is deposited and etched. Thereafter, as an optional step, a node implant step can be performed so as to reduce the contact resistance between the inner capacitor electrode and the surface strap. These steps will result in the structure illustrated in FIG. 2P.

Figure 2Q:
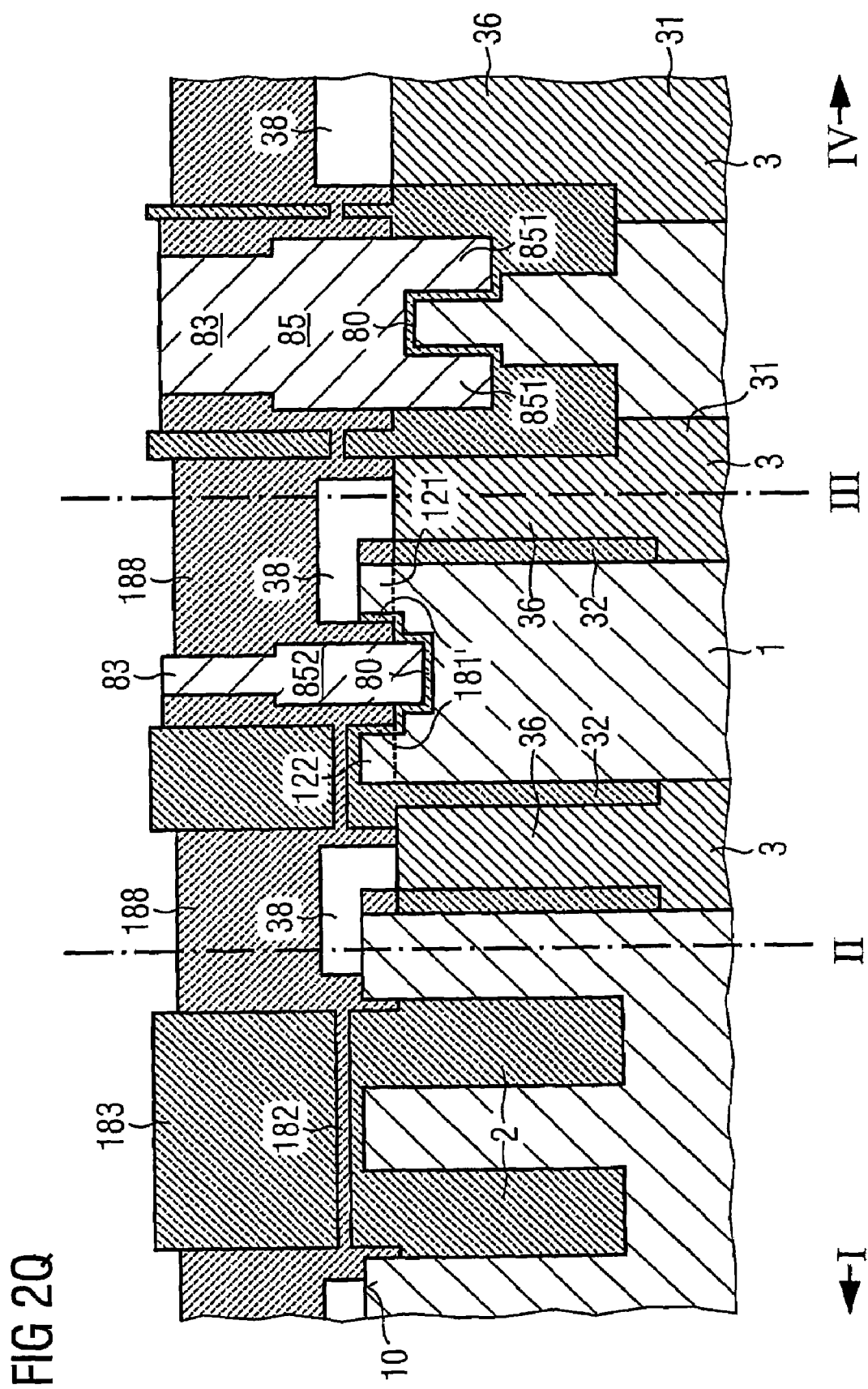

In order to form a strap connecting the inner capacitor electrode 31 with the first source/drain region 121 of the transistor, a TiN liner (not illustrated) is deposited, followed by a metal layer deposition step. Thereafter, the deposited material is etched so as to form the metal strap 38. Then, the polysilicon mask layer 187 is removed and a silicon nitride liner 188 having a thickness of 50 nm is deposited so as to fill the portions above the metal straps 38. Thereafter, the silicon nitride liner is etched by 60 nm, whereby a smooth surface is provided. The resulting structure is illustrated in FIG. 2Q.

Thereafter, the steps of forming the word lines 8 are performed. First, by performing a CMP step (chemo-mechanical polishing) the surface is planarized, polishing the oxide with an over-polish on silicon nitride. Thereafter, a tungsten layer 8 as well as a silicon nitride cap layer 81 are deposited. The word lines are photolithograghically defined by known methods and etched. After forming the side wall spacers 81 as well as filling the spaces between adjacent word lines with a BPSG-material 82, the structure illustrated in FIG. 2R is obtained.

FIG. 2S illustrates a similar view which is obtained if instead of a buried strap contact 33 a surface strap 38 for connecting the inner capacitor electrode 31 with the first source/drain region 121 is used. In FIG. 2S, similar components are denoted by the same reference numerals as in FIG. 2R. As can be seen from FIG. 2S in comparison with FIG. 2R, the gate groove has to be etched much deeper in FIG. 2S than in FIG. 2R in order to provide the same length of the current path. In particular, the gate electrode 85 extends to a depth of at least 50 nm below the surface 10 of the silicon substrate 1.

Figure 2R:
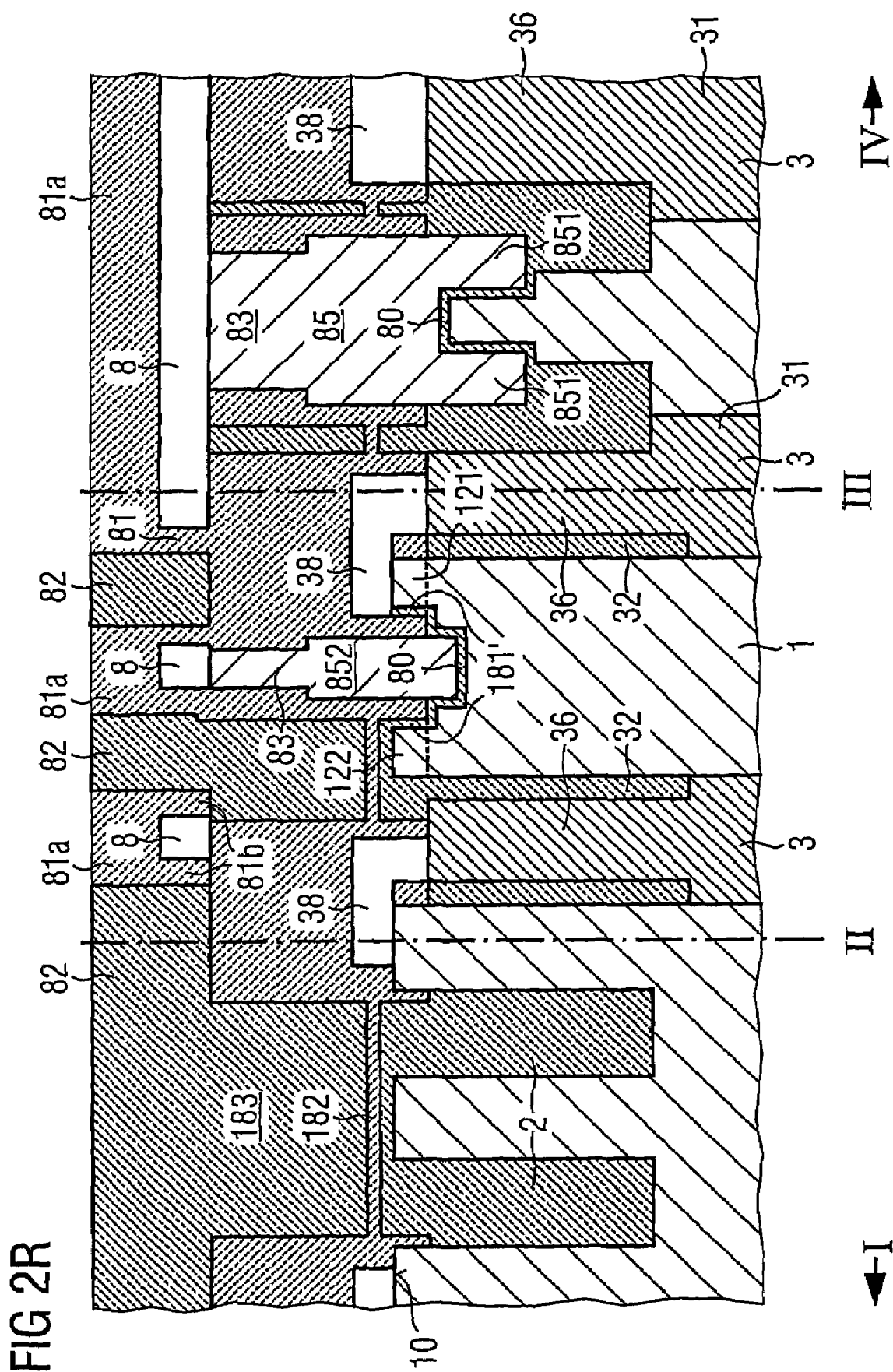
Figure 2T:
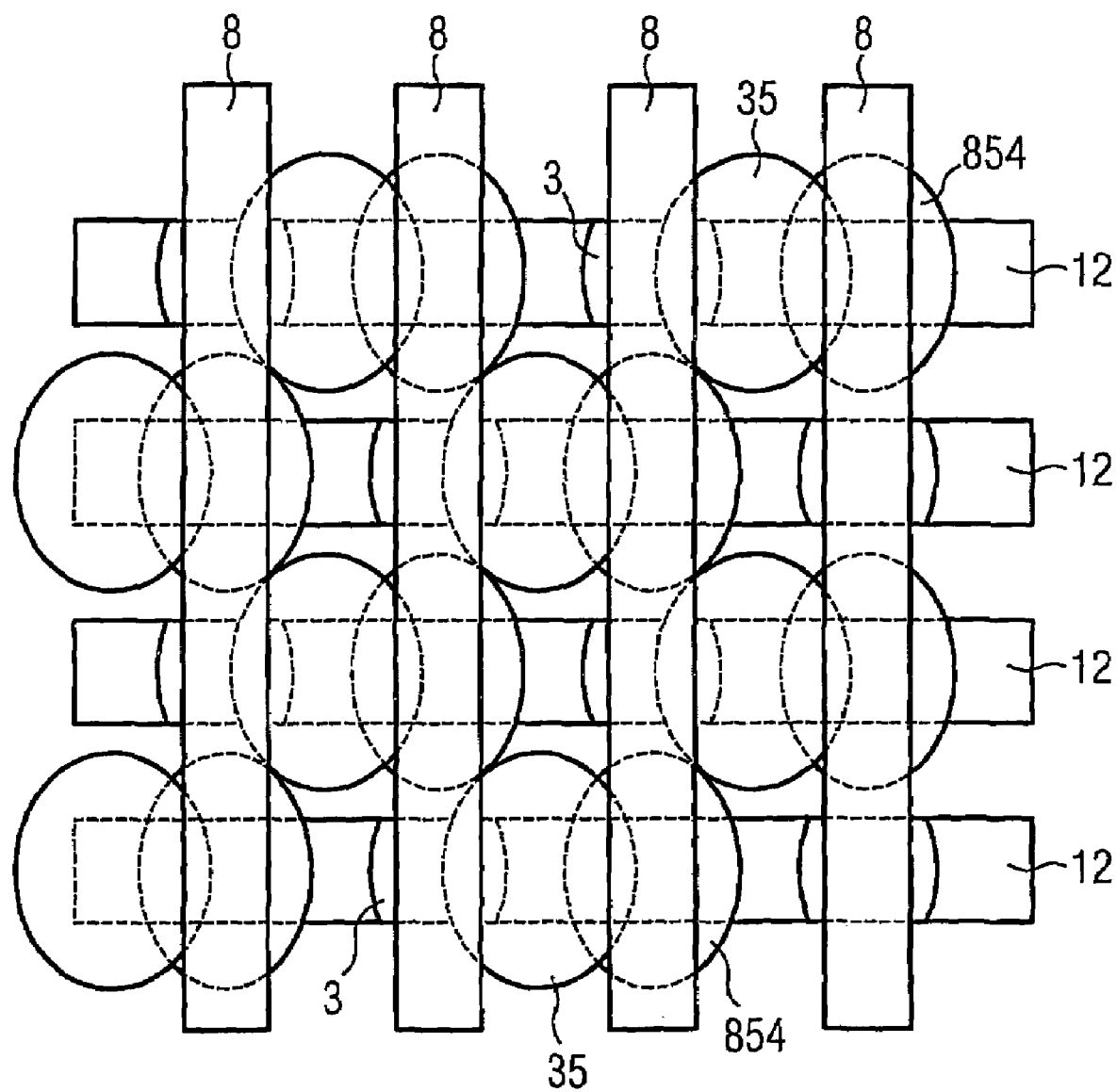

FIG. 2T illustrates a plan view on the memory cell array including the structures illustrated in FIG. 2R. The word lines 8 are provided so as to connect the gate electrodes 854 of a column with one another.

Next, a BPSG layer 91 acting as a bitline insulator layer is deposited. Then, the openings for providing the bit line contacts 61 are lithographically defined by known methods and etched. Thereafter, the openings for the bit line contacts 90 are lithographically defined and etched. Then, an implantation step at the bottom of the bit line contact opening is performed so as to improve the contact resistance. Finally, the bit line contact opening is filled and planarized. In addition, the M0 layer is deposited by general known methods, lithographically patterned and etched so as to provide the bit lines 9.

Thereafter the usually performed steps of providing the higher metallization layers are performed.

Figure 2U:
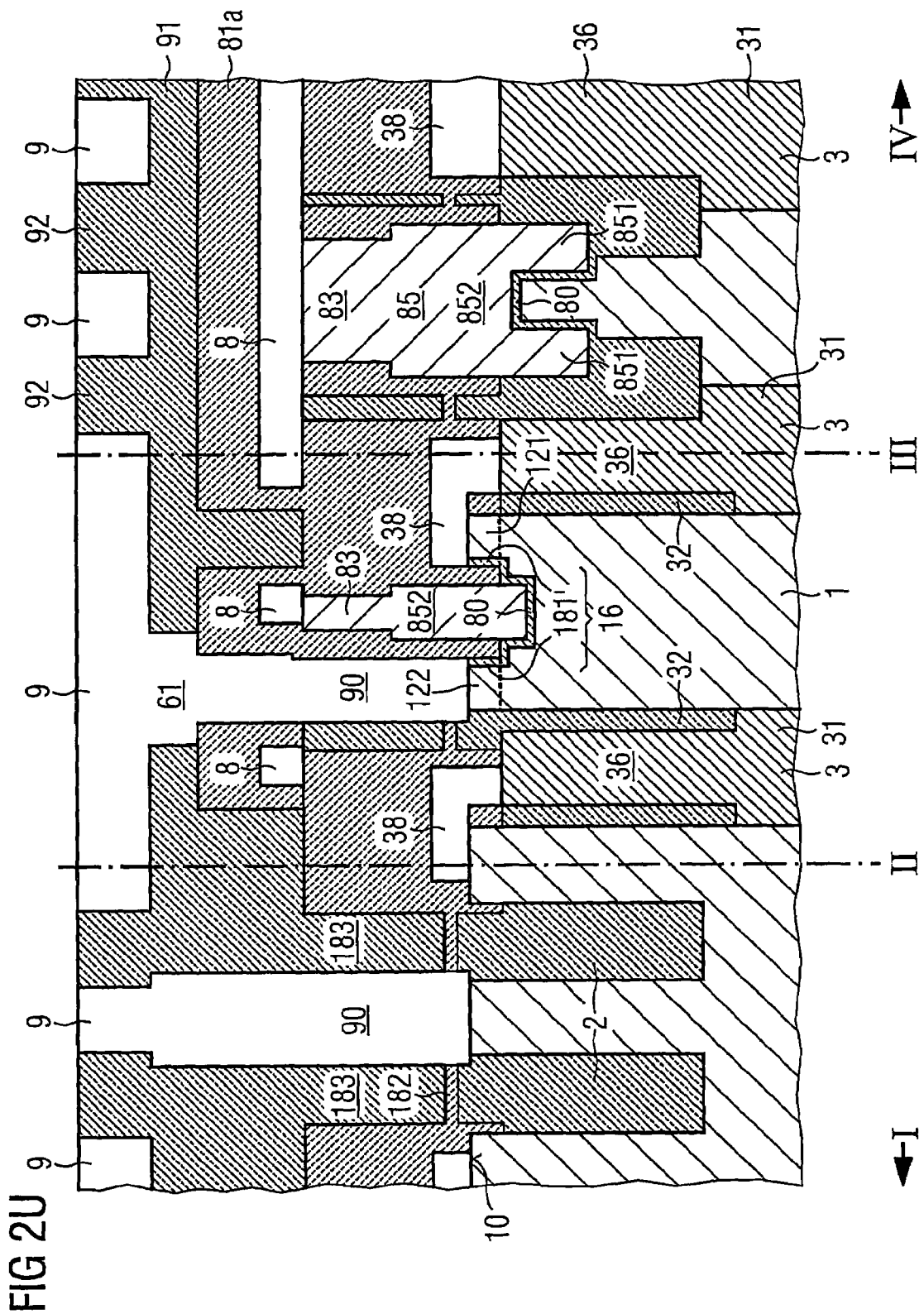
Figure 2V:
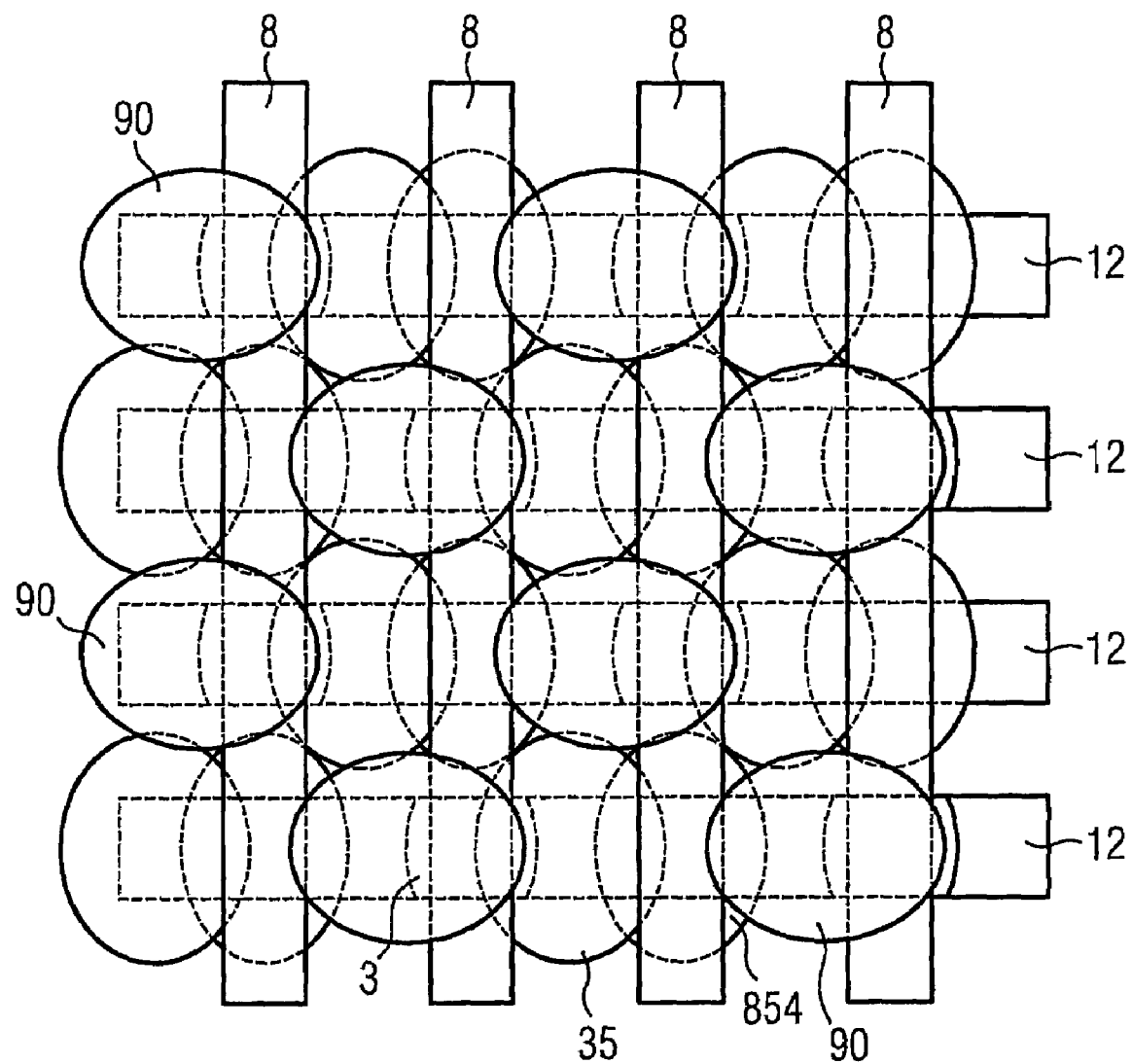

FIG. 2V illustrates a plan view on the memory cell array after forming the bit line contacts 90. Moreover, FIG. 2W illustrates the plan view on the memory cell array after patterning the bit lines 9.

In FIG. 2U, in the cross-section between II and III, a transistor 16 is formed between the first and the second source/drain regions 121 and 122. The first source/drain region 121 is connected via the surface strap 38 and the polysilicon fill 36 with the inner capacitor electrode of the trench capacitor 3. The conductivity of the channel between the first and the second source/drain regions 121 and 122 is controlled by the gate electrode 85. A current path between the first and the second source/drain regions 121 and 122 extends from the surface of the first source/drain region 121 to the surface of the second source/drain region 122. In the upper part of the current path the electrical potential of the gate electrode 85 is shielded by the spacer 86, while in the lower part of the current path the conductance is controlled by the gate electrode. An information stored in the trench capacitor is read by the transistor and sent to the bit line 9 via the bit line contact 90.

As can be seen from the cross-section between III and IV, the active area which is enclosed by the gate electrode 85, has a fin region, in which the active region has the shape of a fin or a ridge. The gate electrode surrounds the fin at three sides thereof. In more detail, the gate electrode 85 includes a groove region 852 as illustrated between II and III and two plate-like portions 851 which are adjacent to the sides of the fin.

In the cross-section between III and IV, the fin region which is enclosed by the gate electrode 83 has a more narrow width than the underlying silicon region.

In FIG. 2S, in which the contact between the first source/drain region 121 and the inner capacitor electrode is accomplished by a buried strap 33, the current path likewise a vertical component since in this case the channel is recessed to a deeper depth than in the case of the surface strap.

FIGS. 3A to 3L illustrate a second embodiment of the present invention, in which a memory cell includes a stacked capacitor and the transistor which is described above with reference to FIGS. 1A and 1B.

Figure 3A:
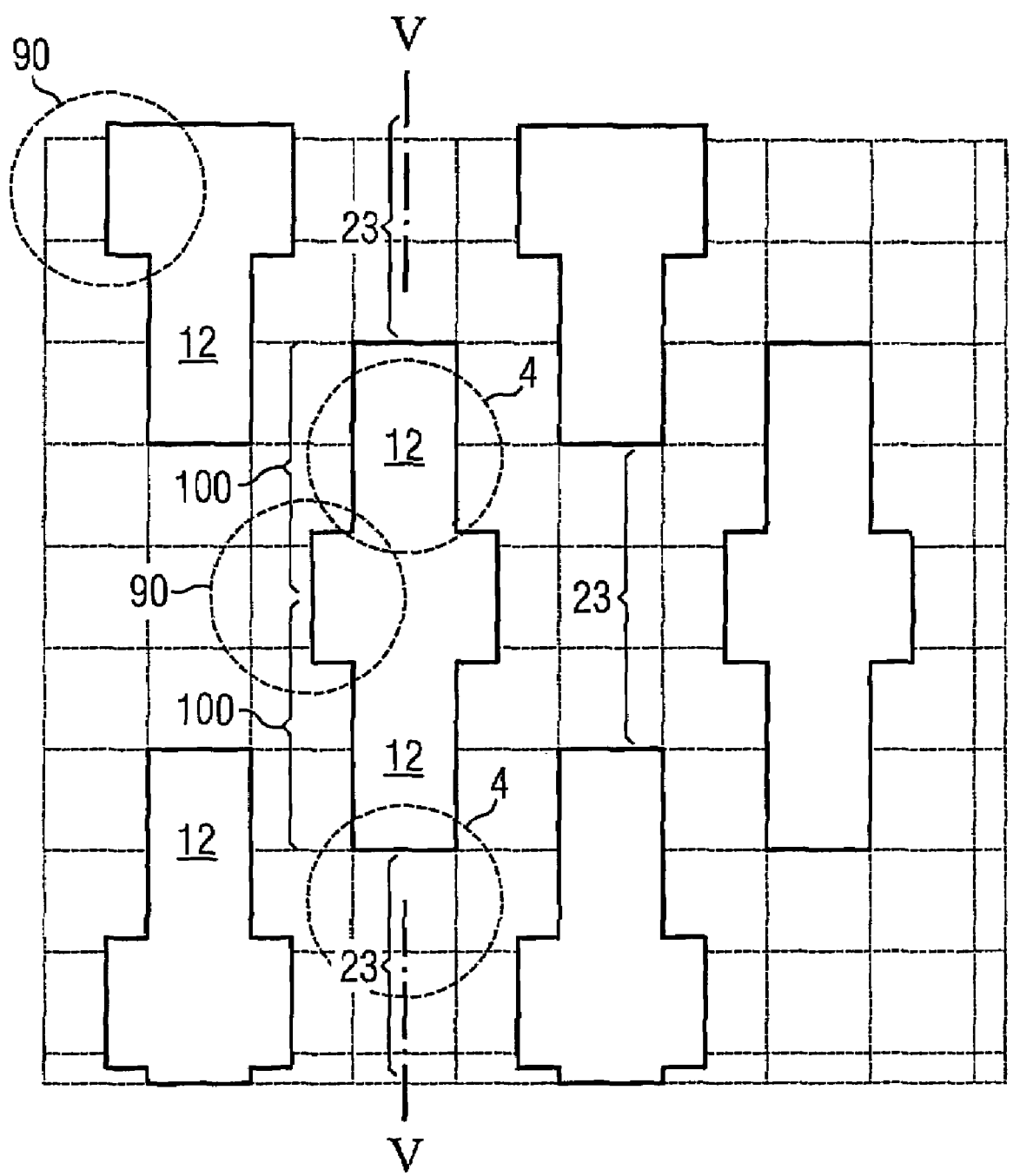

FIG. 3A illustrates a layout of the active areas 12 of the memory cell array. As illustrated in FIG. 3A two active areas 12 in which the transistor is to be formed are disposed adjacent to each other, and they share a common bit line contact 90 which is indicated by broken lines. The stacked capacitors 4 belonging to each of the memory cells 100 are also indicated by broken lines 4. The segments of the active areas 12 are separated from each other by isolation trenches 23.

The sectional views illustrated in FIGS. 3B, 3C, 3F, 3G, and 3J are taken between the points V and V.

For providing the memory cell array according to the second embodiment of the present invention, first, isolation trenches 23 are photolithographically defined and etched in the surface 10 of a semiconductor substrate 1. The isolation trenches 23 are filled with silicon dioxide and, thereafter, the usual implantation steps for providing the well regions are performed. After a thermal oxidation step for providing a sacrificial silicon dioxide layer 181, a silicon nitride layer 182 having a thickness of about 10 nm is deposited, followed by a silicon dioxide layer 183 having a thickness of 100 nm. Thereafter, a polysilicon mask layer (not illustrated) having a thickness of about 80 nm is deposited.

In the next step, the word lines are defined photolithograghically. First a gate electrode mask is used for defining the openings in the polysilicon mask layer (not illustrated). The gate electrode mask as used in the second embodiment contains openings, which have the shape of lines, so that word lines instead of openings, which are separated from each other, are defined, which has been the case in the first embodiment.

Thereafter, taking the patterned polysilicon mask layer as a mask, the oxide layer 183 is selectively etched until the silicon nitride layer 182 is reached. After removing the silicon nitride in the exposed portions, the silicon as well as silicon oxide layer are etched in the exposed portions for about 40 nm below the silicon surface. Thereby, the groove portion of the gate electrode is defined.

After performing a thermal oxidation step for growing a sacrificial oxide layer (not illustrated), a silicon nitride spacer 86 is deposited and etched so that a thickness of 0.2 F is achieved. These steps are performed in a similar manner as described with reference to the first embodiment as illustrated in FIGS. 2F, 2G, 2J, and 2K. Thereafter, as is also described with reference to FIG. 2J, the sacrificial oxide layer is removed and the silicon dioxide layer is removed selectively with respect to silicon/silicon nitride 100 to 120 nm below the silicon surface 10. Thereby, the pockets for the plate-like portions of the gate electrode are defined. Thereafter, an isotropic etch step is performed for fin thinning, in which on each of the edges 10 to 15 nm is etched, so that a final fin width of 30 nm is achieved.

After performing a thermal oxidation step for growing a gate oxide 80, a polysilicon layer (not illustrated) which is in situ doped with phosphorus having a thickness of 40 nm is deposited. The polysilicon material fills the groove portion as well as the pockets so as to provide the two plate-like portions of the gate electrode.

Thereafter, the polysilicon layer is removed from the surface portions, and the silicon dioxide layer 183 is removed from the areas between the wordlines 852. Then, an implantation step for providing the source/drain regions 121, 122 is performed.

Figure 3B:
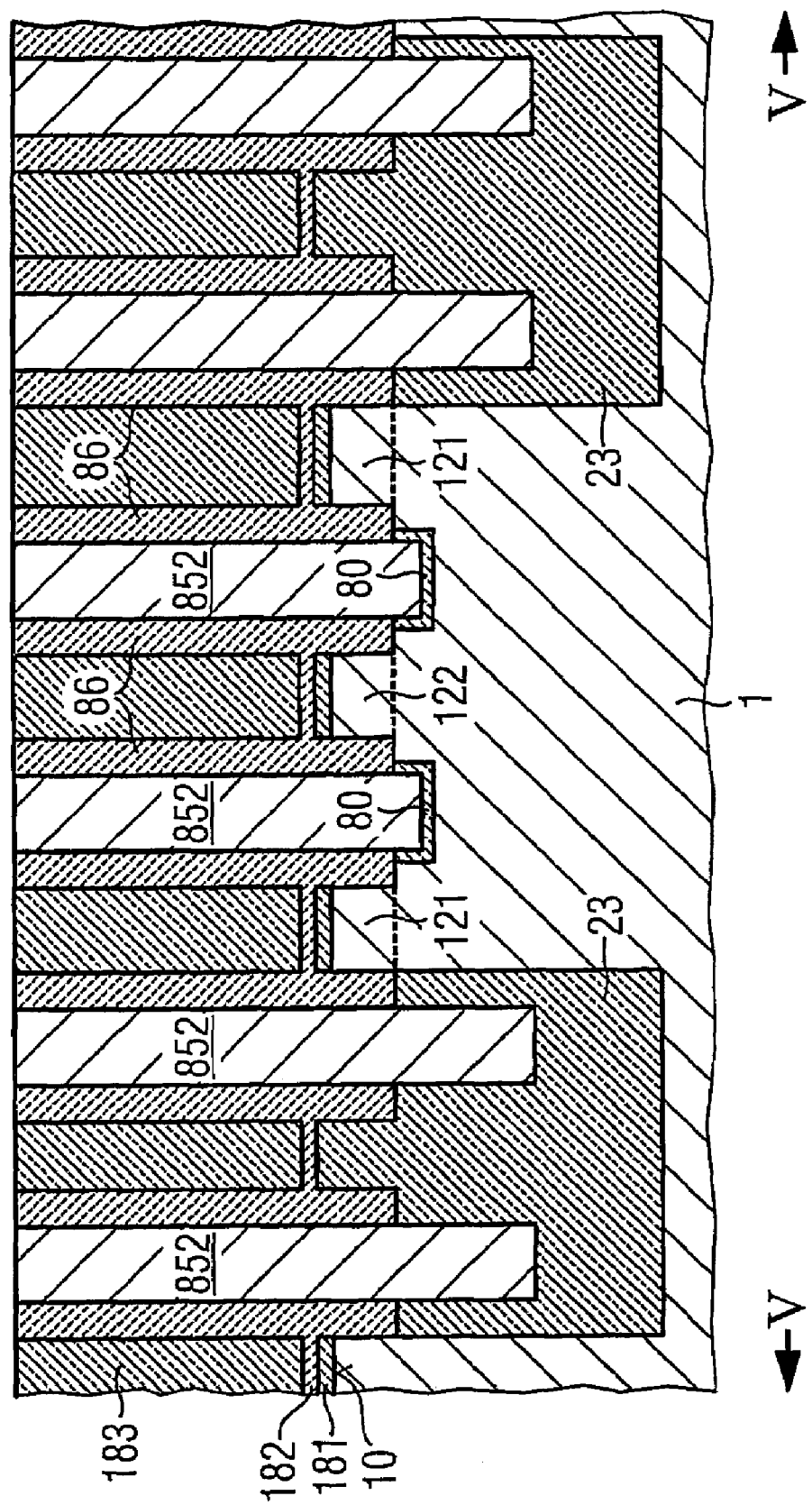

Thereafter, a silicon dioxide layer 183 is filled and a planarization step is performed so as to obtain the structure illustrated in FIG. 3B.

Figure 3C:
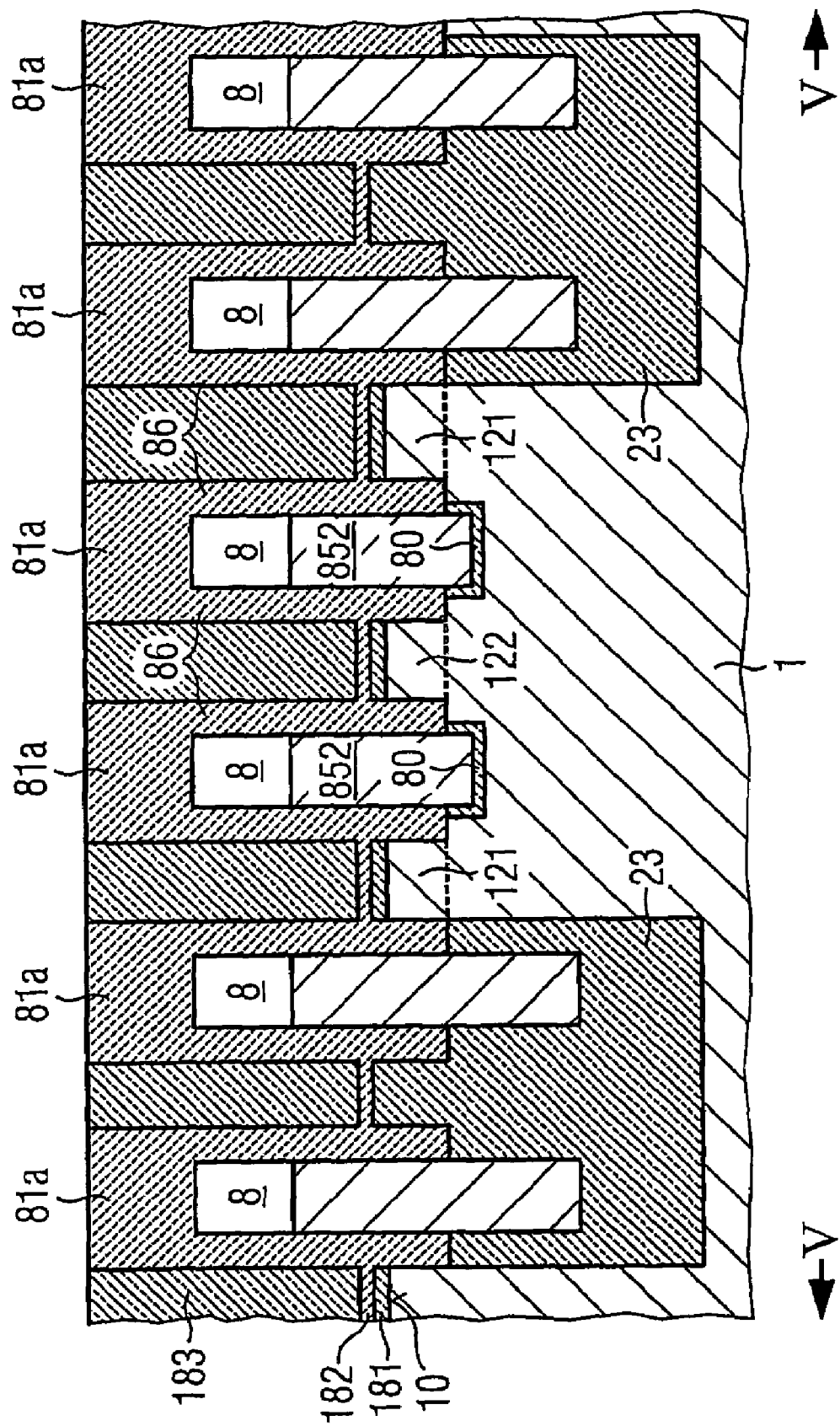

Thereafter, the polysilicon material 852 of the wordlines is recessed, and a tungsten layer is deposited so as to fill the spaces above the polysilicon material 852, planarized and etched below the surface. Then, the spaces above the tungsten lines are filled with a silicon nitride layer, which is also planarized. The resulting structure is illustrated in FIG. 3C, in which the polysilicon lines 852 are covered by the tungsten lines 8 which are insulated by the silicon nitride layer 81a.

Figure 3D:
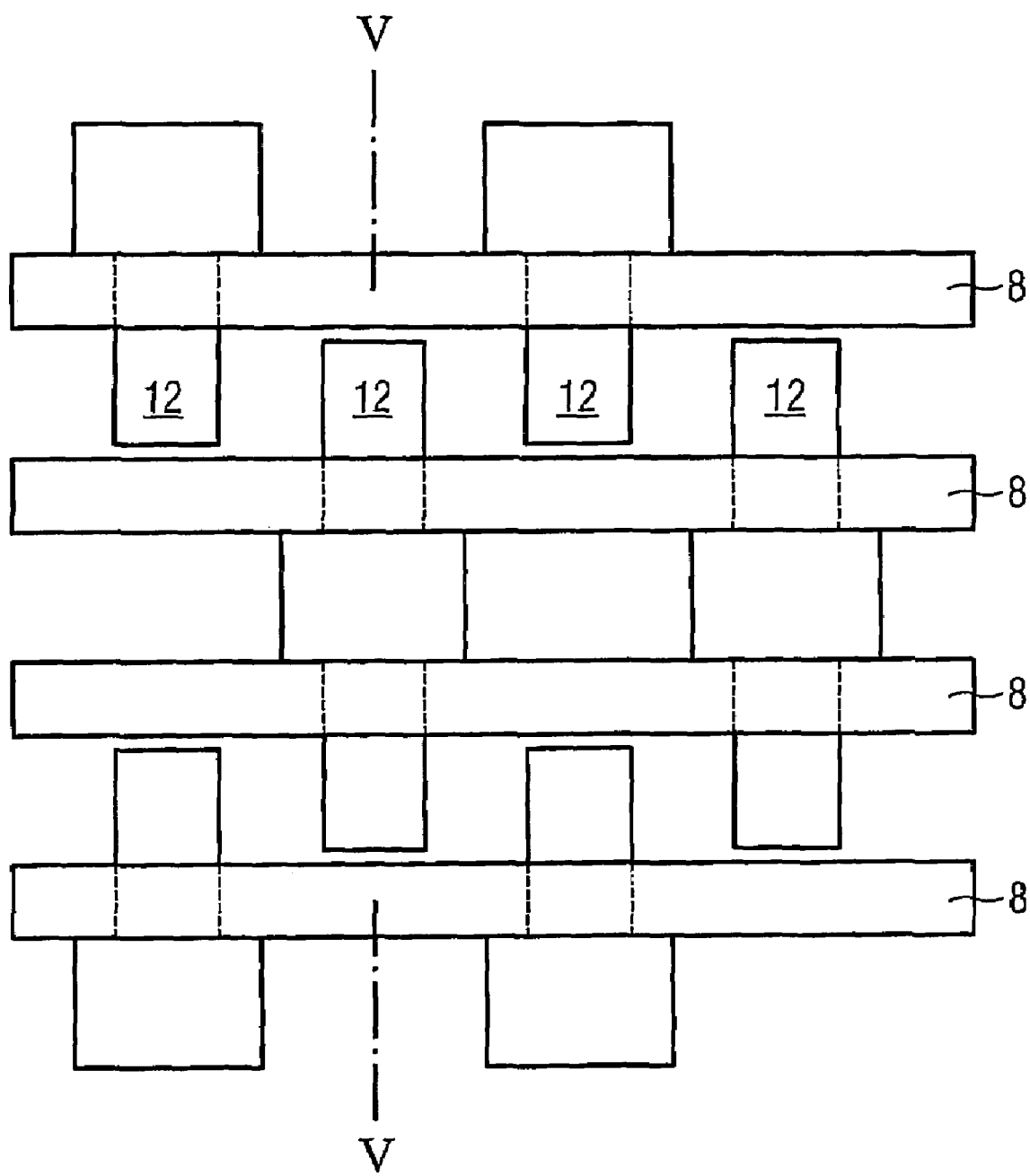

FIG. 3D illustrates a plan view on the resulting cell array from which it can be seen that the word lines 8 are perpendicular to the direction defined by the active areas 12.

In a following step, by using a stripe-like mask 6, contact areas for defining a contact to the bit line as well as to the stacked capacitor are formed. In particular, as can be seen from FIG. 3E, by selectively etching the silicon oxide material at the photolithographically defined portions, openings will be formed at the locations indicated by a "X". Stated differently, the openings are formed at those areas under the openings of mask 6, where the word lines are not formed. The crosses are only indicated along V to V. However, as is clearly to be understood, these openings are also formed at corresponding areas outside V to V.

Thereafter, implantation steps are performed so as to reduce the contact resistance. Finally, the openings 6 are filled by depositing a layer of a conductive material. The layer is planarized to the nitride cap 81.

The resulting structure is illustrated in FIG. 3F.

As can be seen from FIG. 3F, the conductive material provides the bitline contact assisting structure 90 as well as the assisting contact 41 for contacting the stacked capacitor.

In the next step, a silicon dioxide layer 91 is deposited, and, thereafter, the bit line contact openings are lithographically defined by known methods. After forming the corresponding opening in the silicon dioxide layer 91, the opening is filled with a conducting material so as to form a bit line contact 61. After a planarizing step, a tungsten layer 9 and a silicon nitride layer 62 are deposited by known methods. Thereafter, the tungsten layer 9 is photolithograghically patterned so as to form stripes which extend in a direction parallel to the line connecting V with V. Thereafter, side wall spacers (not illustrated) are formed by generally known methods.

Figure 3G:
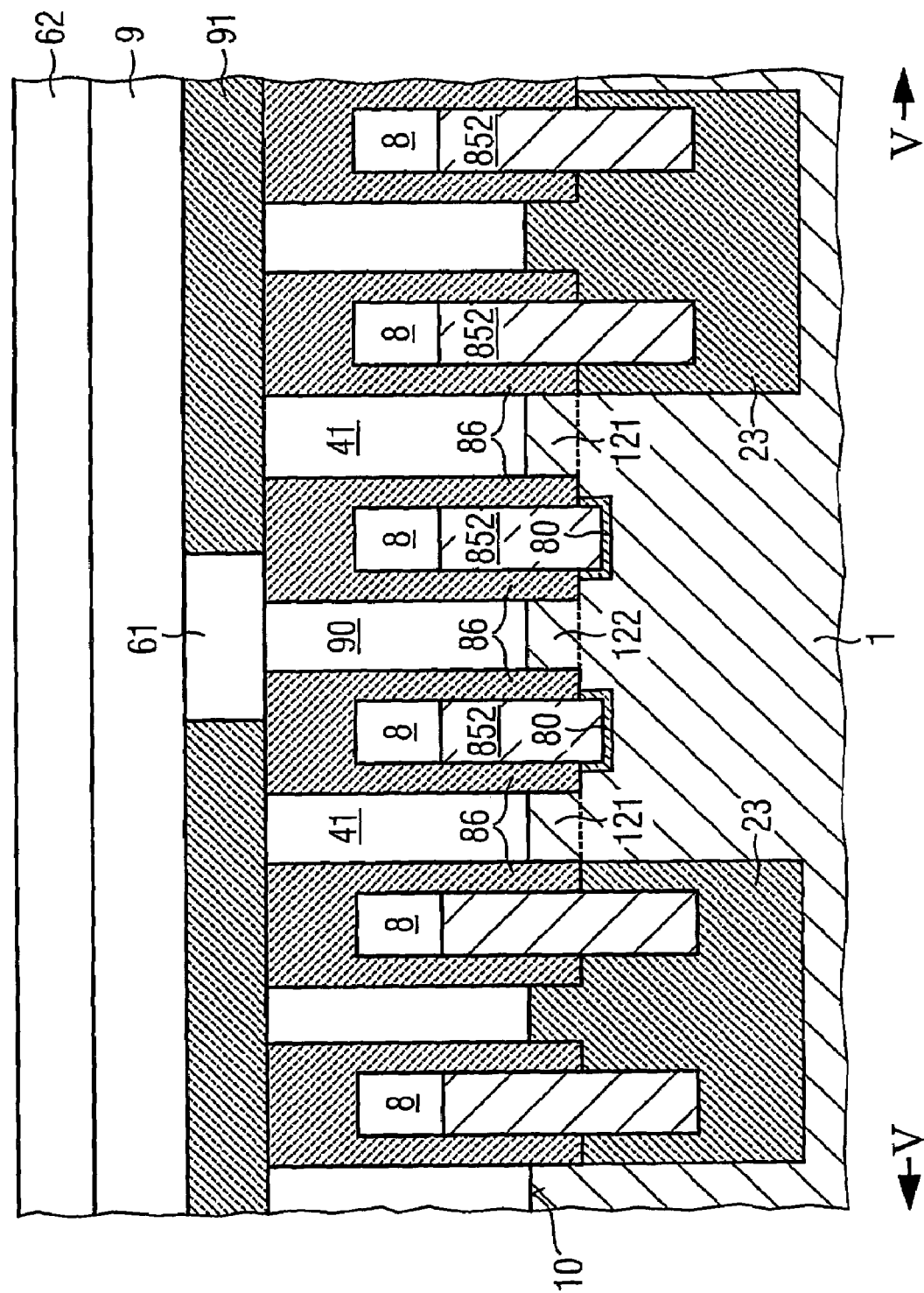

The resulting structure is illustrated in FIG. 3G.

Figure 3H:
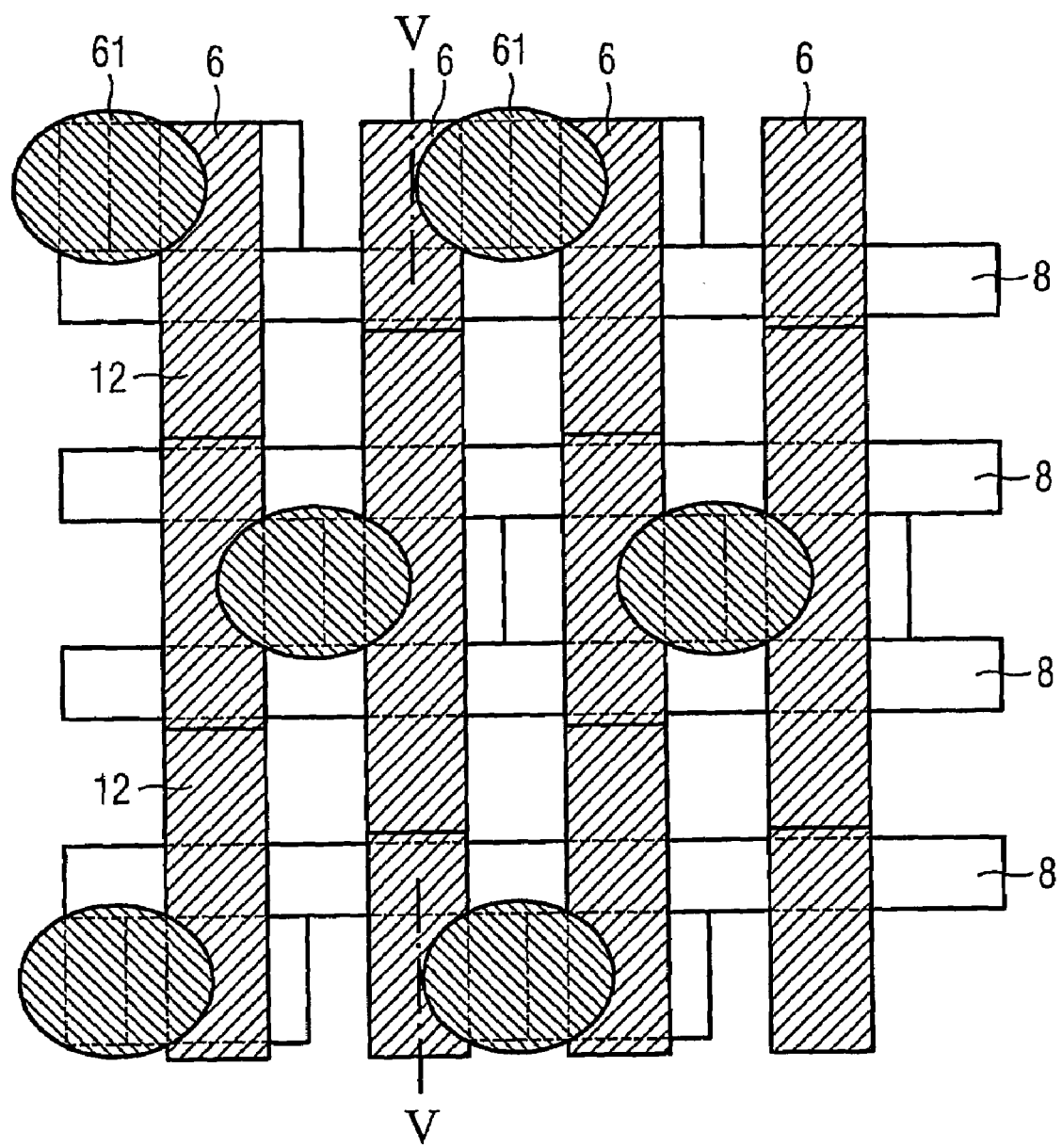

FIG. 3H illustrates a plan view on the memory cell array after defining the bit lines contacts 61. As can be seen, the bit line contacts 61 are formed at the left side of the vertical portions crossing the active areas 12. One bit line contact 61 is formed for two adjacent memory cells.

Figure 3I:
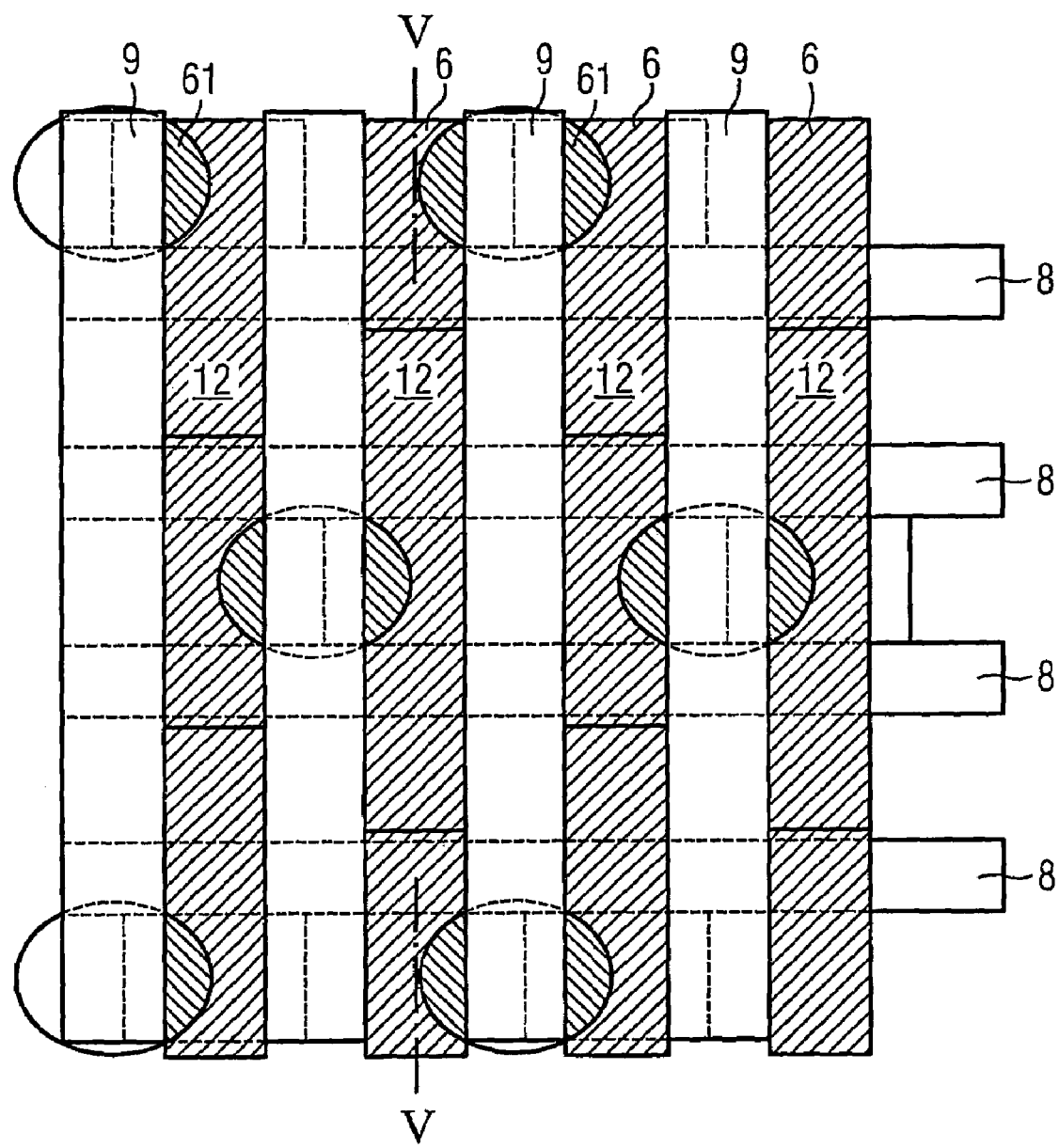

FIG. 3I illustrates a plan view on the memory cell array after defining the bit lines 9. The bit lines 9 are formed perpendicularly to the word lines 8. The bit lines are disposed above the bit line contacts 61, and, in a plan view, they are disposed in the spaces between neighbouring active areas 12.

Figure 3J:
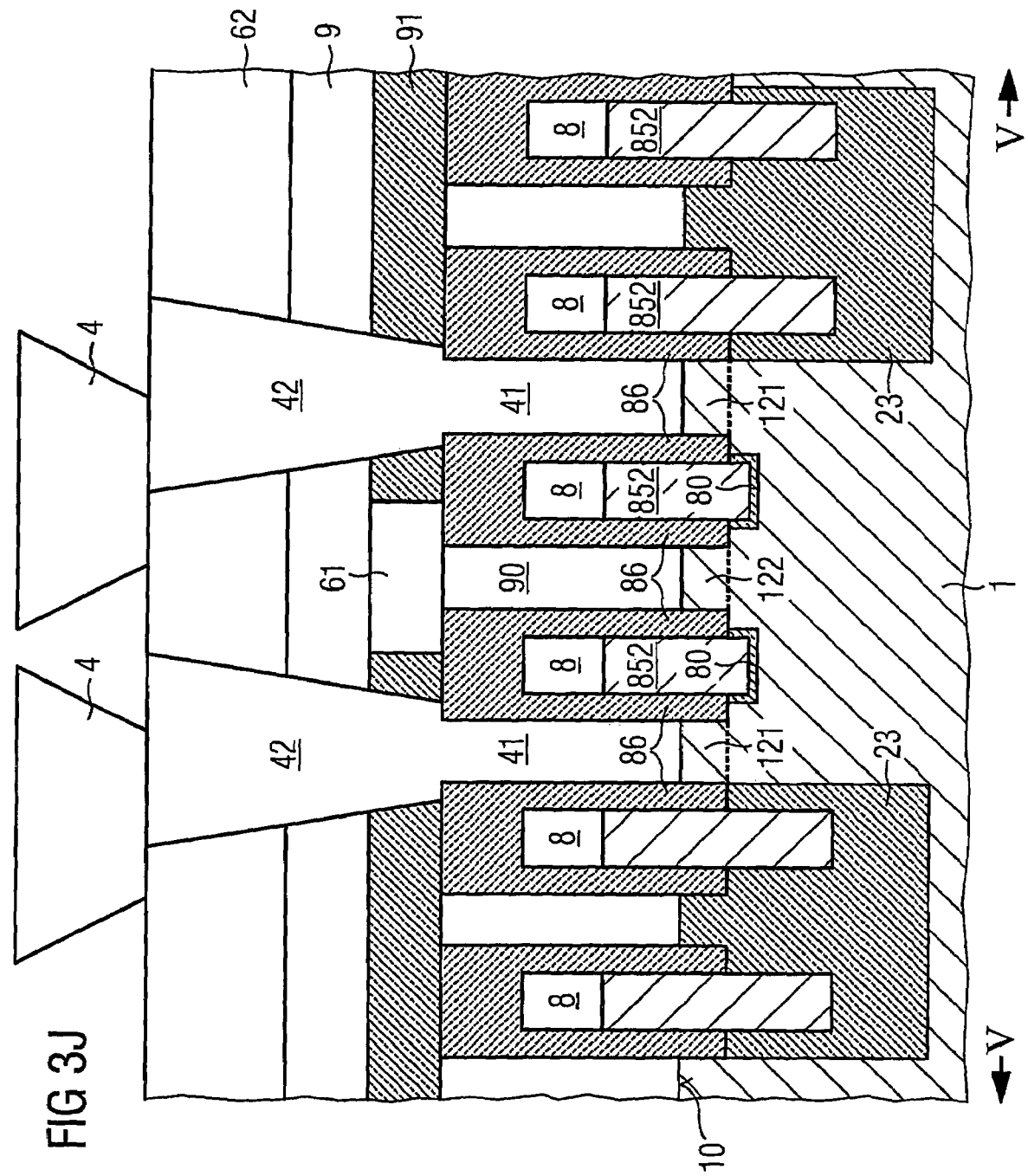

In the next step, the spaces between adjacent bit lines are filled with an oxide layer and the resulting structure is planarized. Thereafter, the capacitor contact structures 42 are photolithograghically defined in the layer stack by generally known methods. In particular, the openings corresponding to the capacitor contacts are etched and filled with a conducting material, for example tungsten. In the next step, the stack capacitor 4 is formed by generally known methods. In particular, an outer capacitor electrode (not illustrated) is formed and electrically connected with a capacitor contact 42, a capacitor dielectric (not illustrated) is provided and, finally, the inner capacitor electrode is provided. The resulting structure is illustrated in FIG. 3J. As can be seen, since the first and second source/drain regions are disposed adjacent to the substrate surface 10, an electrical contact to the stacked capacitor can easily be accomplished.

Figure 3K:
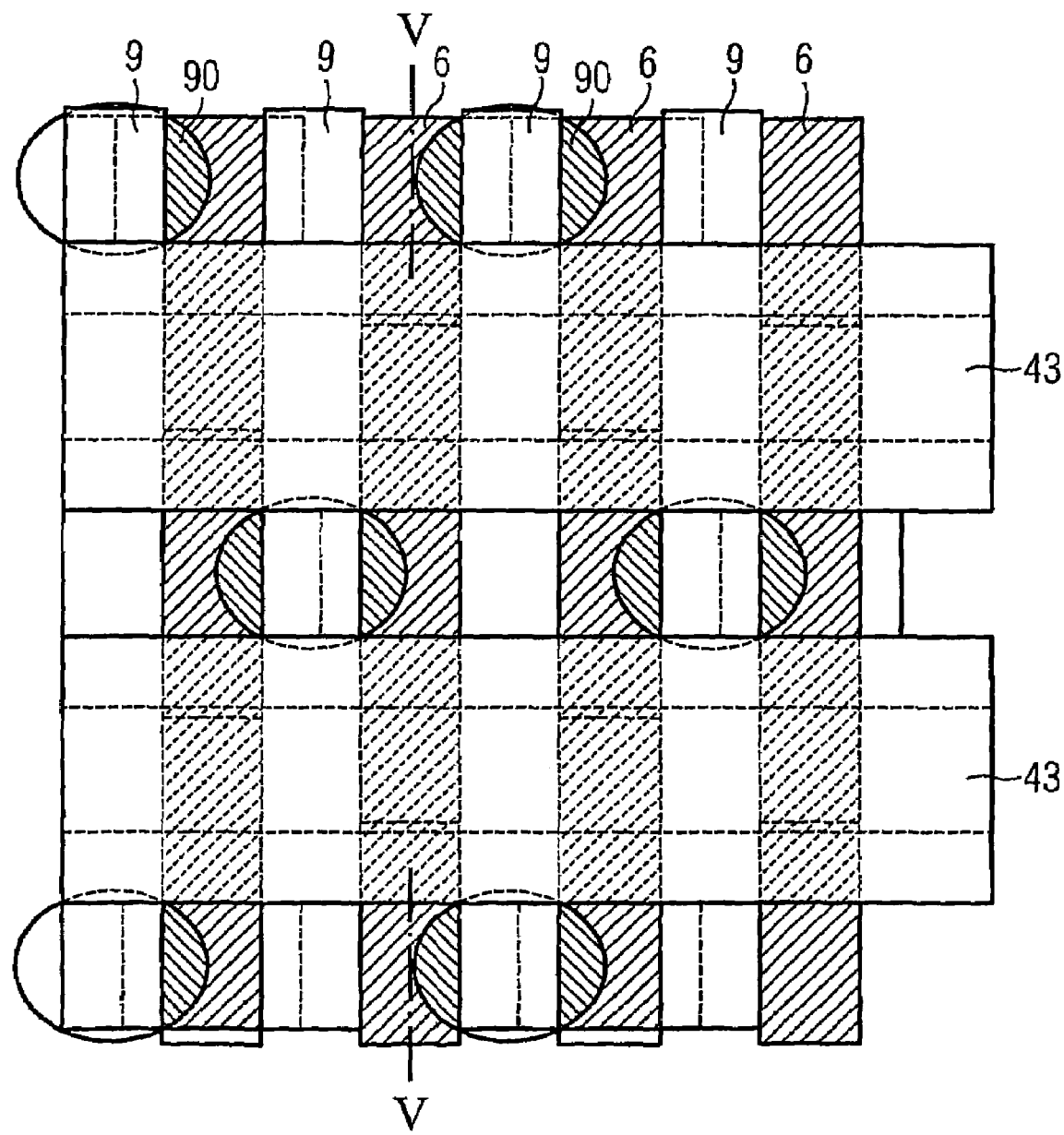

FIG. 3K illustrates a plan view of the memory cell array after forming the capacitor contact structures 42. In particular, the capacitor contact mask 43 has stripe-like openings, which are perpendicular to the bit lines 9. Since the bitline material is etched selectively with respect to the silicon oxide filling the spaces between the bitlines, hole-like openings are formed. The openings opened under the stripes 43 are formed above the active areas 12, so as to contact the first source/drain regions 121.

Figure 3L:
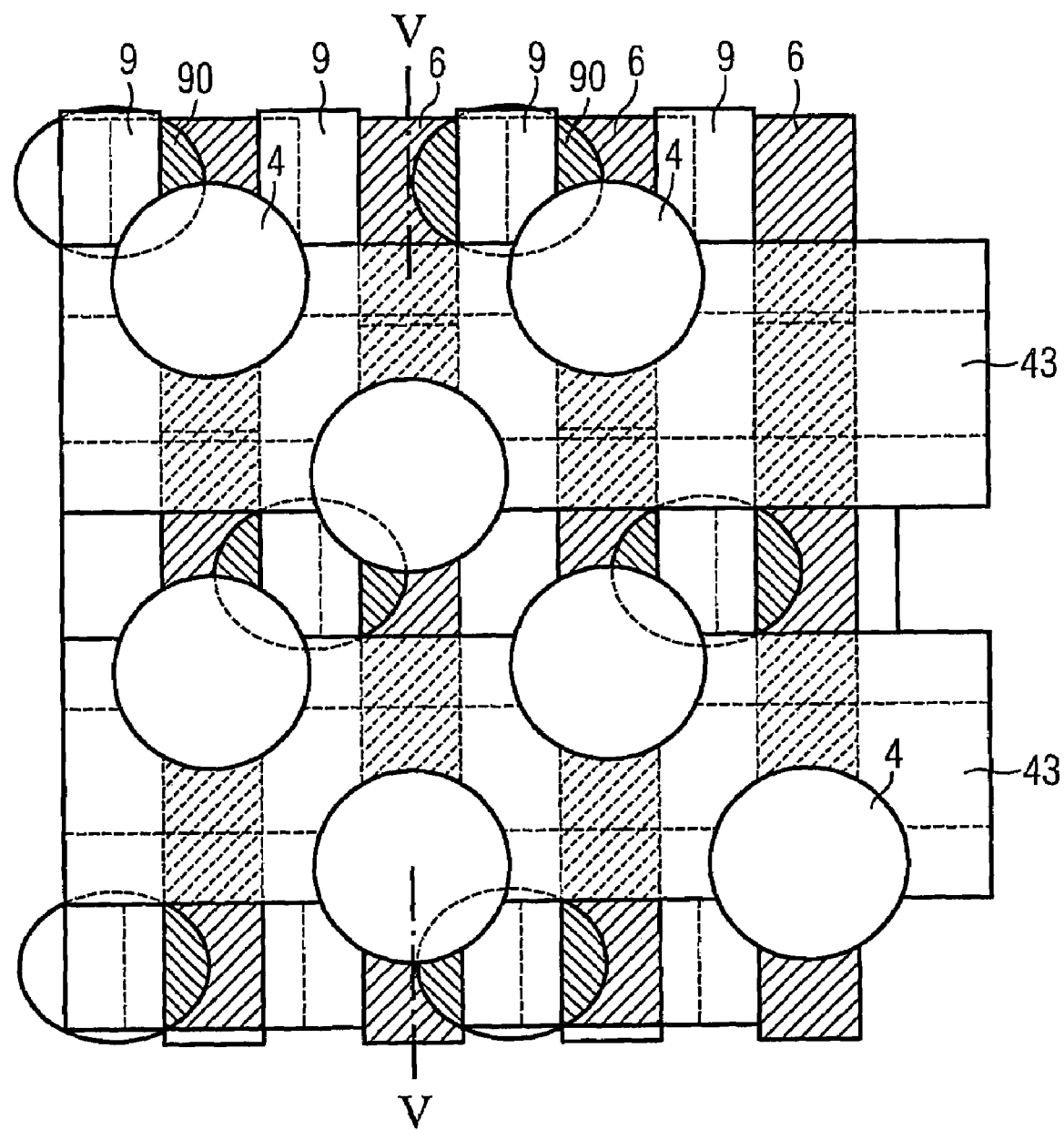

FIG. 3L illustrates a plan view on the memory cell after defining the stacked capacitors 4. The stacked capacitors 4 are arranged in a checkerboard pattern, so that the stacked capacitors of two neighbouring rows are arranged in a staggered manner.

FIG. 4A to 4J discloses a third embodiment of the present invention, in which a memory cell array including the transistor of the present invention as described with reference to FIGS. 1B and 1C, and a stacked capacitor is formed. In particular, according to the third embodiment, the grooves for the gate electrodes are formed at an early process step.

Figure 4A:
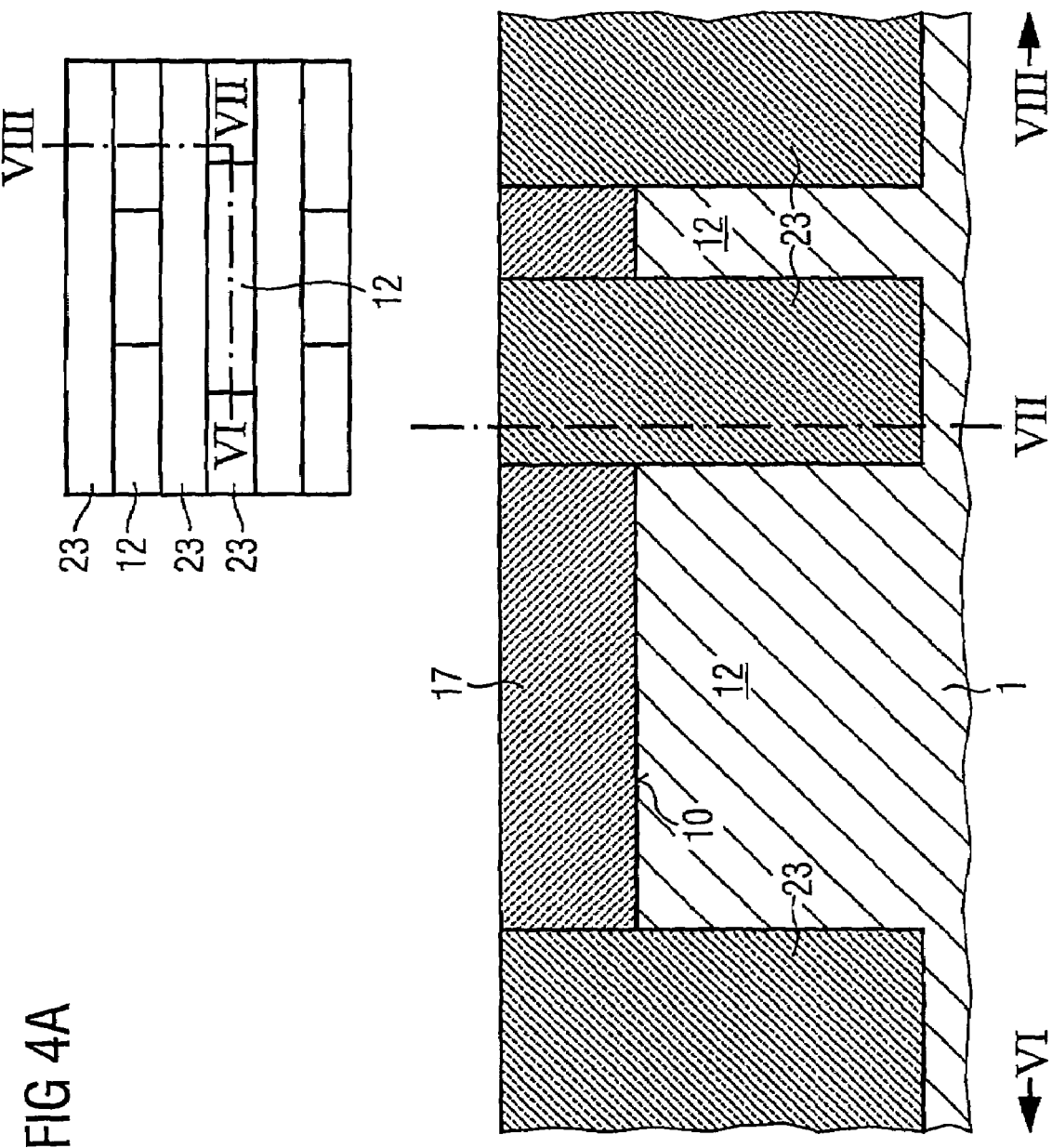

The upper part of FIG. 4A illustrates a plan view on the resulting array, whereas the lower part of FIG. 4A illustrates a cross-sectional view. In particular, the left hand side of the cross-sectional view illustrates the cross-section between points VI and VII as depicted in the upper part of FIG. 4A, whereas the right hand side of the lower part illustrates the cross-section between VII and VIII.

For implementing the third embodiment of the present invention, first, a pad oxide layer (not illustrated) and a silicon nitride layer 17 are deposited on the surface 10 of a semiconductor substrate 1, in particular, a silicon substrate 1. Thereafter, the active areas 12 of the memory cell are photolithograghically defined by known methods and isolation trenches 23 are etched in a common manner so as to expose the active areas 12. The sidewalls of the active areas are oxidized, and the isolation trenches 23 are filled with an insulating material, in particular, a silicon dioxide layer. The resulting surface is planarized. The resulting structure is illustrated in the lower part of FIG. 4A, whereas the upper part of FIG. 4A illustrates a plan view on the array. As can be gathered from the upper part of FIG. 4A, the line connecting VI and VII intersects the active area 12, whereas the line connecting VII and VIII intersects the isolation trenches 23 as well as the active area 12 at the smaller side thereof.

In the next step, the silicon nitride layer 17 as well as the underlying silicon dioxide layer are removed by etching. Thereafter, a thermal oxidation step is performed so as to grow a sacrificial oxide layer on the exposed silicon portions. Thereafter, implantation steps are performed so as to provide the required doped well regions. As an optional step, a further implantation step can be performed so as to provide the lightly n doped first source/drain region 121'.

Thereafter, a hard mask layer or layer stack for defining the grooves for the gate electrodes is deposited. The hard mask layer may for example comprise a first layer 71 of polysilicon or carbon and a second layer 72 of, for example photo-resist material or carbon. The hard mask layer stack is photolithograghically patterned by using a stripe mask having stripes with a width of less than 1 F.

Finally, the hard mask layer stack is etched so as to expose the silicon substrate at the groove portions.

Figure 4B:
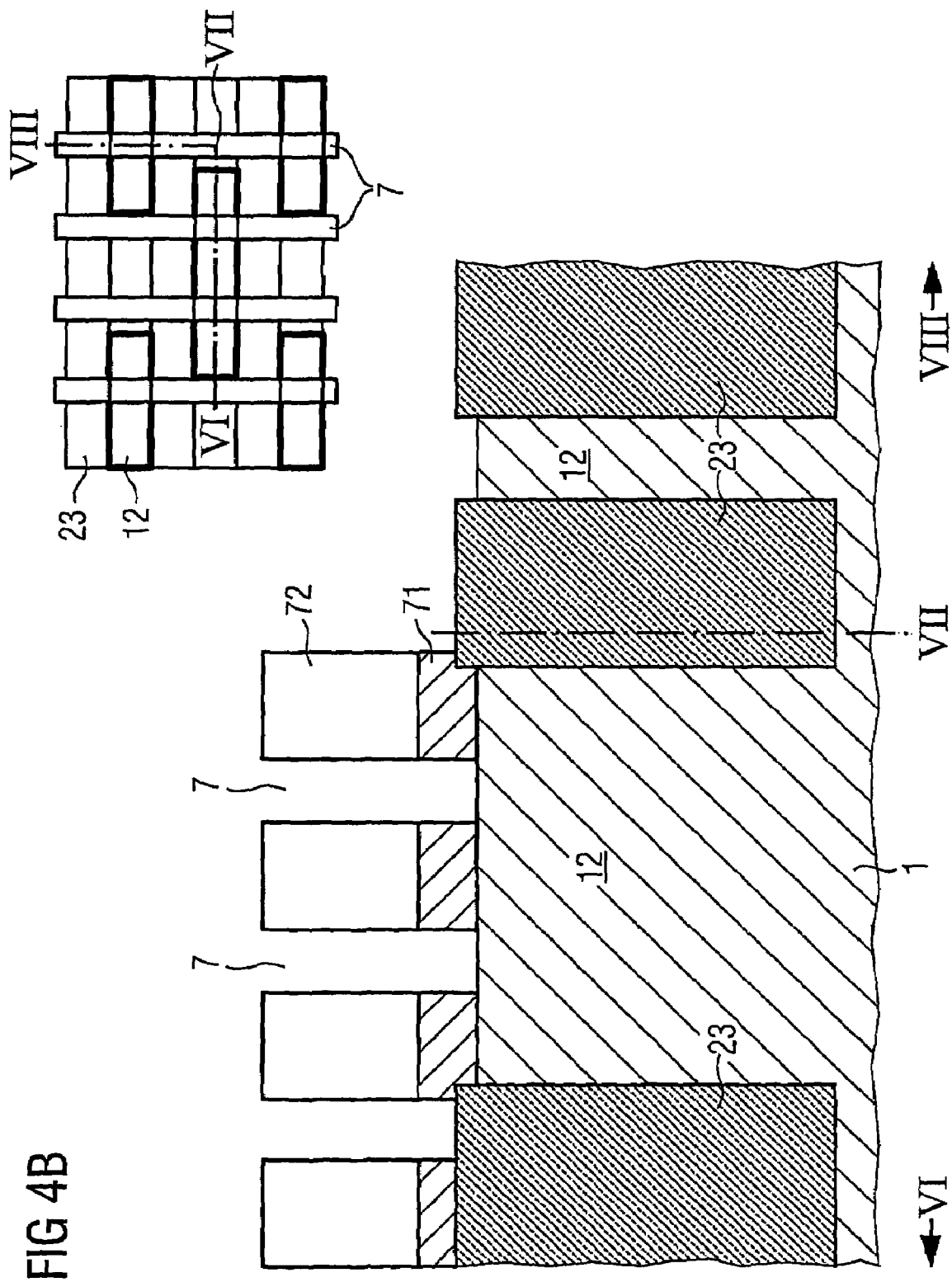

As can be seen from FIG. 4B, the insulation material of the isolation trenches 23 projects with respect to the silicon surface, since in the previous step of planarizing the surface, the surface of the STI portions has been made coplanar with the surface of the pad nitride layer 17. As a consequence, after removing the pad nitride layer 17, the insulation material of the isolation trenches 23 projects or protrudes with respect to the silicon surface 10. During the step of stripping the pad nitride and the pad oxide layer, the material of the isolation trenches has been etched as well.

As can be gathered from the upper part of FIG. 4B, the portions between VII and VIII extend in a groove 7 region, i.e., the region in which the groove has been etched.

In the next step, an etching step is performed, so as to etch the exposed portions of the insulation material in the isolation trenches 23. Thereafter, the second hard mask layer 72 is removed, and a further etching step is performed, so as to etch the groove portions 7 in the silicon substrate material. In particular, the silicon is etched approximately 40 to 150 nm below the substrate surface. The width of the grooves 73 is 0.5 to 0.7 F.

It is preferable to etch the grooves 73 in such a manner so as to avoid sharp corners at the lower portions of the grooves 73. It is particularly preferred that these corners be rounded as is indicated by broken lines in FIG. 4C. As is to be noted from the cross section between VII and VIII of FIG. 4C, silicon residuals 73' may be formed between the silicon grooves 73 and the adjacent isolation trenches 23.

Thereafter, an etching step of isotropically etching silicon is performed. This etching step can be a wet etch or a dry etch step, for example a so-called CDE (chemical downstream etch). Thereby, the grooves formed in the hard mask layer 71 as well as the grooves 73 formed in the polysilicon material are extended laterally. In particular, the diameter of the grooves is extended by 0.2 F, and, further, silicon residuals 73' which might occur between the groove 73 and the adjacent isolation trenches 23, as depicted in the cross-sectional part between VII and VIII in FIG. 4C are removed.

The resulting structure is illustrated in FIG. 4D. As can also be gathered from the upper part of FIG. 4D, the width of the vertical stripes has been broadened.

The final width of the grooves (CD, "critical dimension") now amounts to 0.9 F.

Figure 4E:
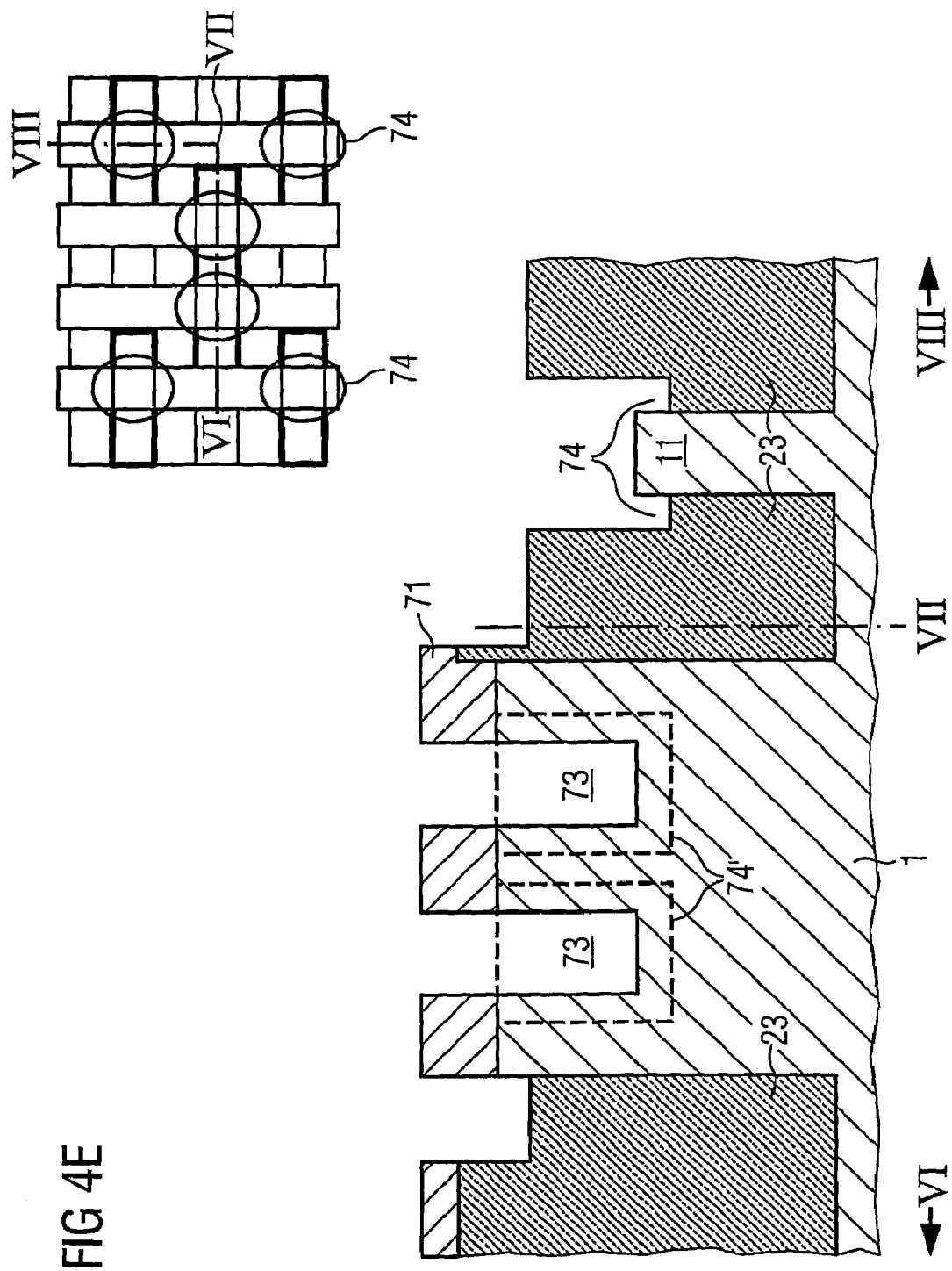

In a next step, a wet etching of silicon dioxide is performed. By this isotropic etching step the exposed oxide regions are etched. As a consequence, the groove in the isolation trench illustrated in the left hand side of FIG. 4E is widened and deepened, and in the part between VII and VIII, pocket structures 74 are formed in the insulation material of the isolation trenches 23. The size of these pockets 74 is indicated by broken lines around the grooves 73 illustrated in the cross-sectional view between VI and VII. In particular, the pocket structures 74 are formed around the fin regions 11. Since this step is performed as a wet etching step, the formation of the pocket structures is accomplished in a self-aligned manner with respect to the groove.

Next, an anisotropic etching step is performed so as to further etch silicon dioxide. In particular, about 25 nm silicon dioxide are etched so that the total depth of the pockets 74 amounts to 40 nm below the groove. As a consequence, as can be seen from the cross section between VII and VIII of FIG. 4F, the depth of the fin region 11 amounts to approximately 40 nm. This is also illustrated in the left hand side of this Figure between VI and VII, by reference numeral 74". The area etched in the former isotropic etching step is indicated by reference numeral 74'. The height corresponding to the oxide surface in the right hand side of this Figure is indicated by the broken line 75. As an optional step, a further silicon etching step can be performed so as to thin the fin region 11. By the selective anisotropic etching step, the etched portions are deepened by they are not broadened.

Figure 4G:
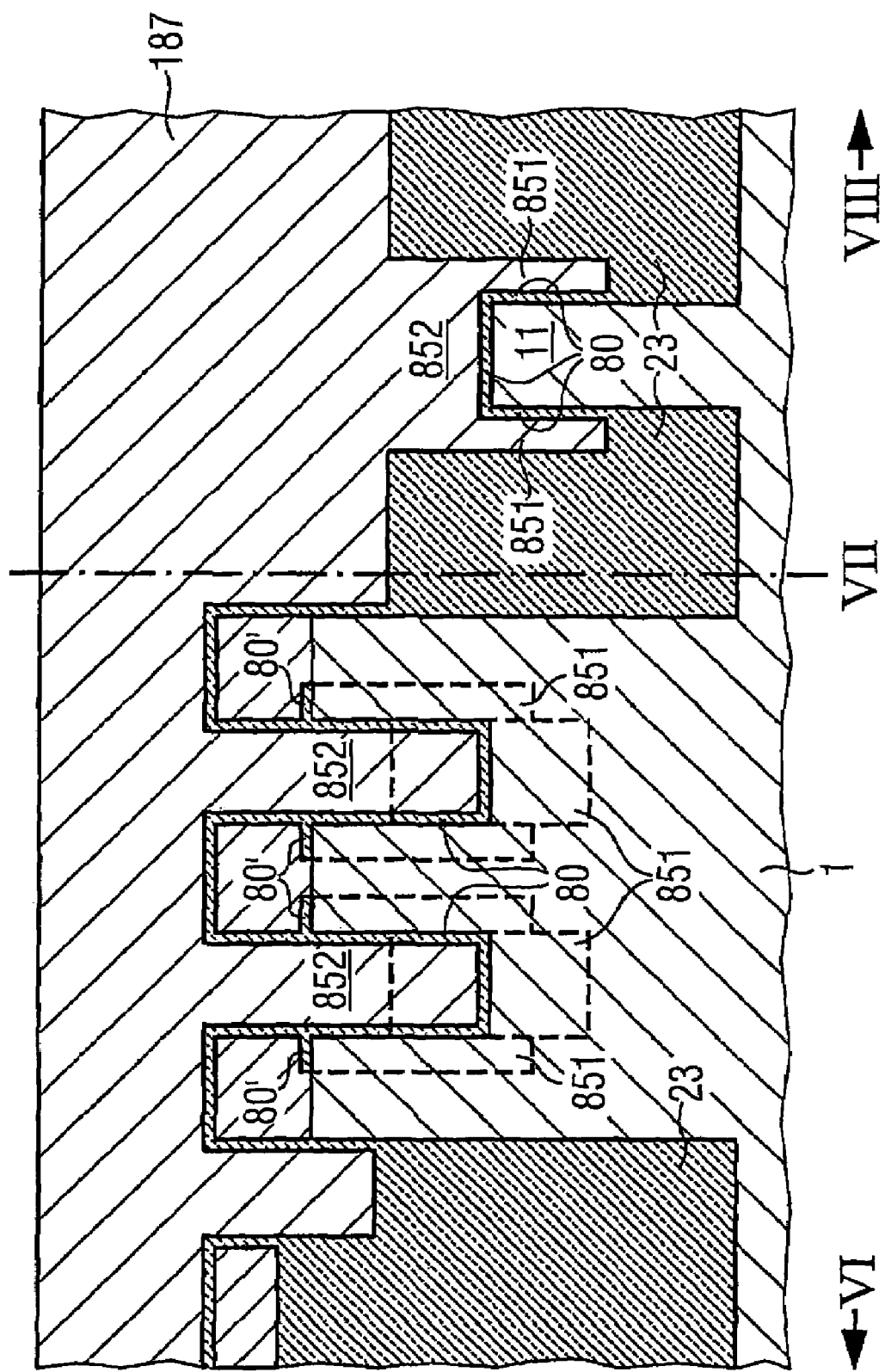

In a next step, a gate oxide 80 is thermally grown by known methods. In FIG. 4G, the portions 80' indicated in the cross sectional view between VI and VII, indicate the gate oxide portions which are grown above the regions 74' and would correspond to a cross-section, which is taken in another plan before or behind the illustrated plane. In addition, a polysilicon layer 187 forming the gate electrode is deposited by known methods.

In a next step, the polysilicon material 187 of the gate electrode is isotropically etched to a depth of about 40 nm below the silicon surface 10. Thereafter, as an optional step, an angled implantation step so as to provide the lightly n⁻ doped first source/drain region 121' can be performed, making use of the fact that the upper part of the grooves 73 is exposed.

In a next step, a silicon nitride layer is deposited and etched so as to form a spacer 86. The spacer has a thickness of about 0.2 F. By this step, also spacer portions 86' are formed between VII and VIII.

Figure 4H:
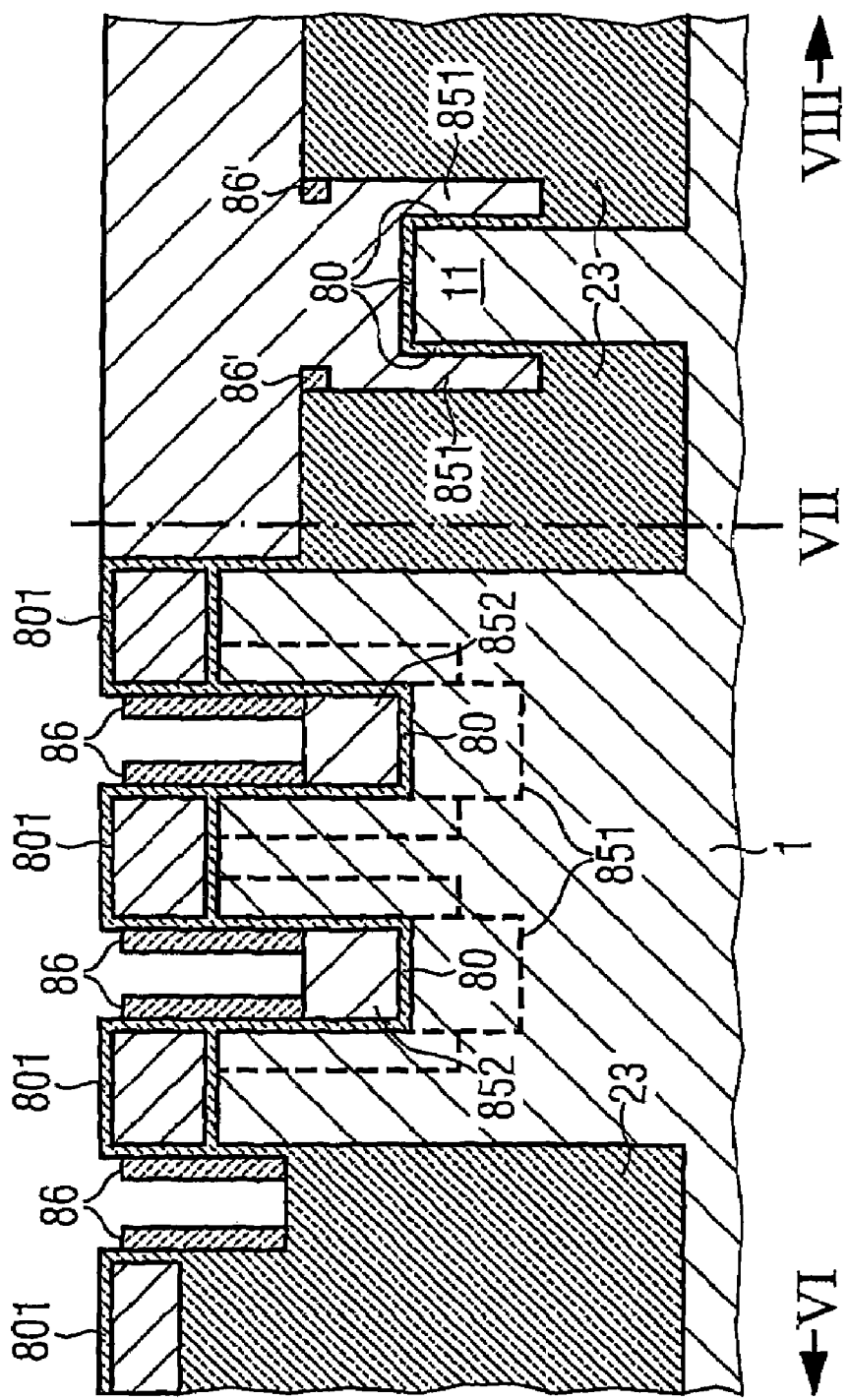

The resulting structure is illustrated in FIG. 4H.

Thereafter, the exposed portions of the silicon dioxide layer 801 are etched. Then, a polysilicon layer 811 is deposited so as to fill the spaces between the silicon nitride spacers

86. Thereafter, a tungsten layer 82 as well as a further silicon nitride layer 81 are deposited by generally known methods.

Figure 4I:
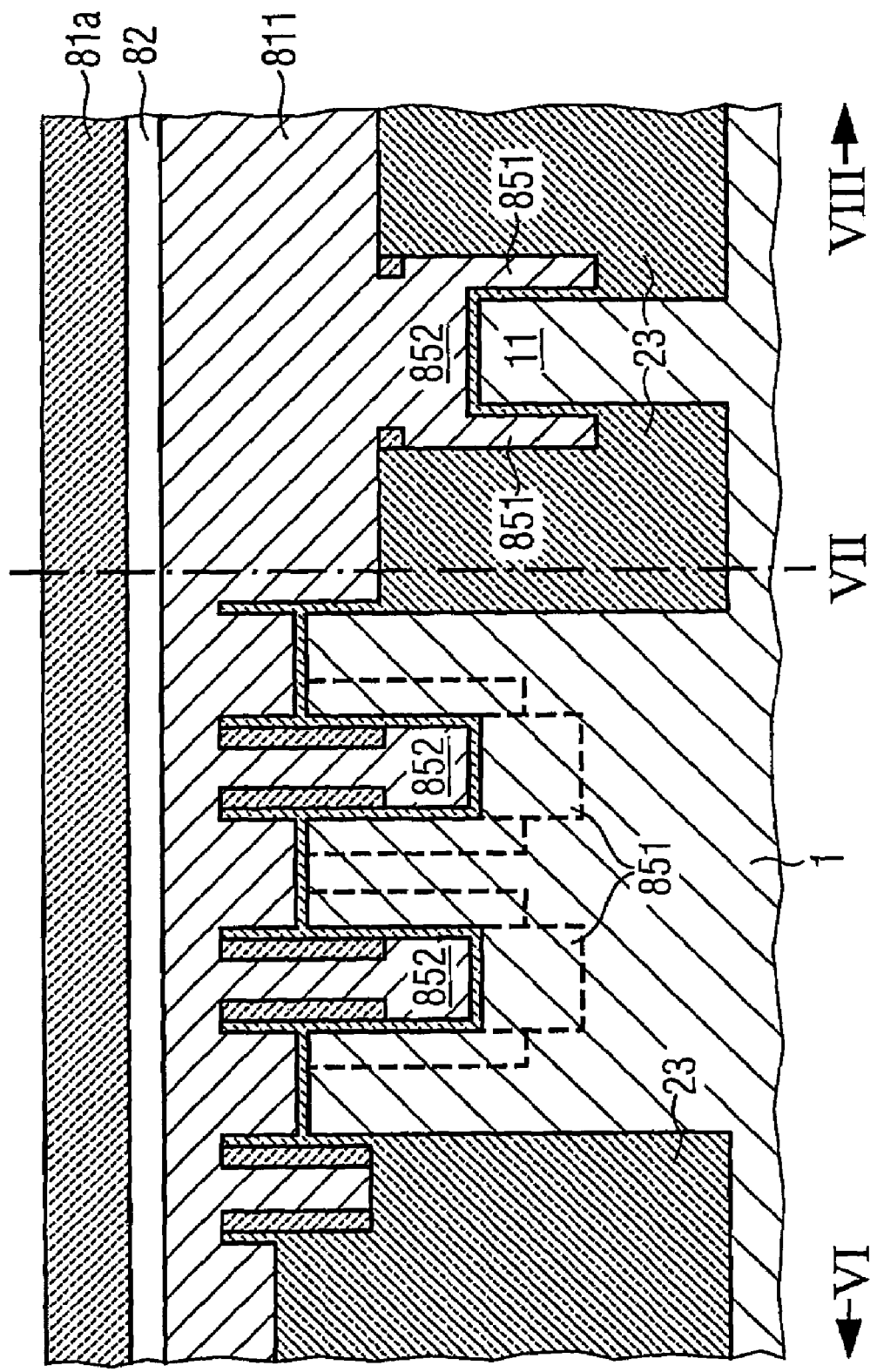

The resulting structure is illustrated in FIG. 4I.

In a next step, the word lines will be patterned. Before patterning the word lines, the implantation steps for defining the first and the second source/drain regions can be performed so as to form the first and second source/drain regions 121, 122. This implantation step could be as well performed after defining the word lines.

For patterning the word lines, first the silicon nitride layer 81 will be etched so as to form stripe-like portions 81a, thereafter, the tungsten layer 82 will be etched so as to form stripes and finally the polysilicon layer 811 will be etched so that a gate electrode stack is formed. When etching the polysilicon layer 811, special care has to be taken, that an over-etch step which is usually performed, does not extend to a deep depth since otherwise the resulting transistor will be degraded. In particular, an over-etching depth of about 20 to 30 nm below the silicon surface is considered to be the maximum over-etching depth.

As a further alternative, the source/drain regions can also be defined at this point of the process.

Figure 4J:
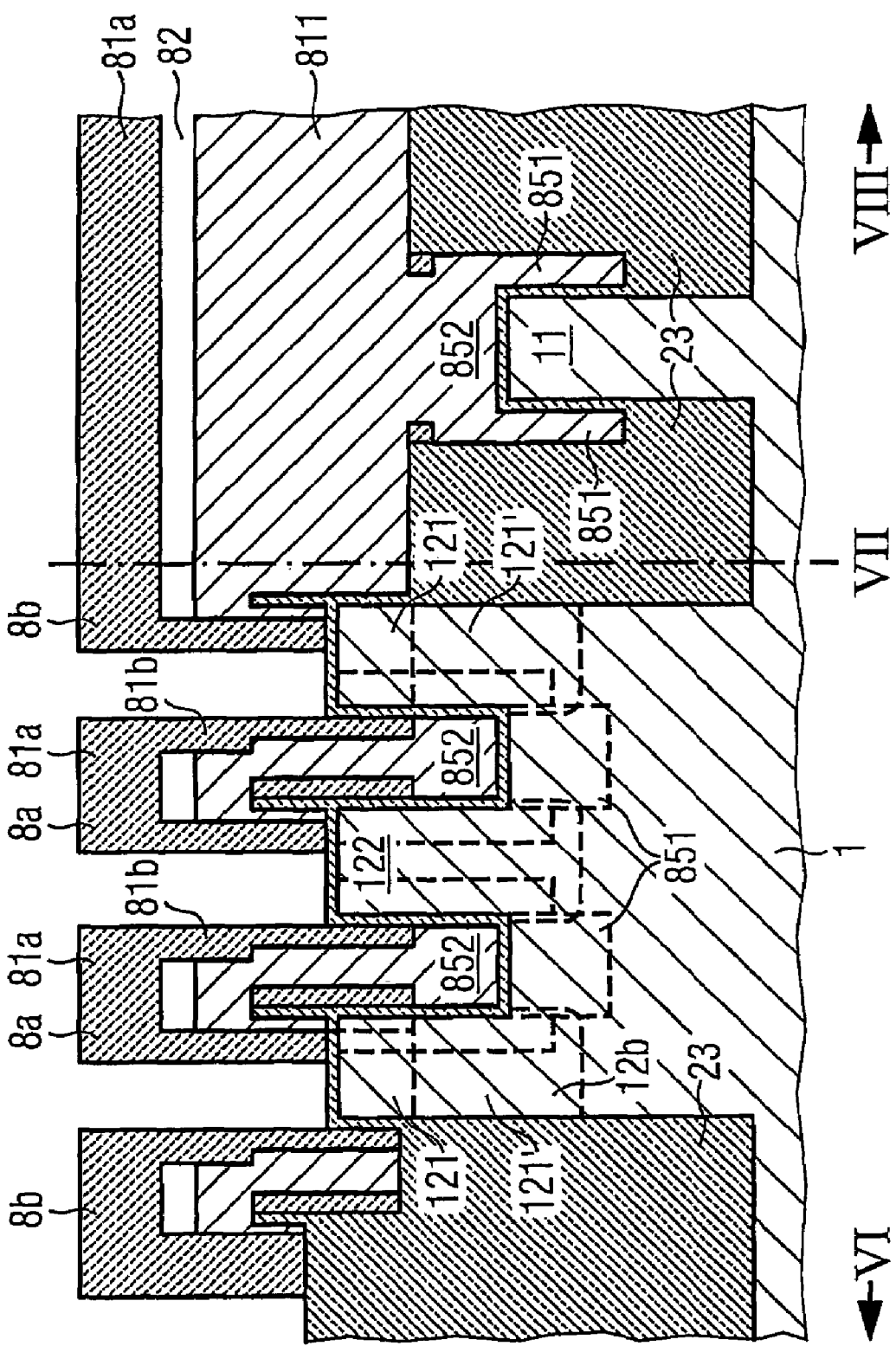

The resulting structure is illustrated in FIG. 4J.

Thereafter the usual process steps of finishing the memory cell array will be performed. In particular, process steps similar to those described with respect to FIG. 3F to FIG. 3L will have to be performed.

When comparing the structures illustrated in FIG. 3F with the structure illustrated in FIG. 4J, it becomes apparent that in FIG. 4J the passing word lines 8b do not extend to such a deep depth as the corresponding passing word lines 8b in FIG. 3F. This is due to the different manufacturing process. In particular, according to the third embodiment, first, the groove portion is defined and then, the pockets are etched by an isotropic etching step, whereby the STI filling of the isolation trenches is not etched at those portions where the gate electrode is not to be formed.

To be more specific, according to the third embodiment, first, silicon is etched selectively with respect to silicon oxide/silicon nitride. Thereafter, silicon oxide is isotropically etched, and, then, silicon oxide is anisotropically etched. Accordingly, it is possible to define the passing wordlines 8b near the substrate surface.

As a consequence, the active areas 12b, which are disposed near the passing word lines 8b are not influenced by the passing word lines 8b. Differently stated, in the active areas 12b which are disposed near the passing word lines 8b, usually a parasitic transistor can be formed which acts as a charge pumping device. In particular, the traps existing at the interface between the single crystalline silicon and the silicon dioxide layer of the isolation trenches 23 might cause a DC current which disturbs the memory action. Since, as is illustrated in FIG. 4J, the passing word lines 8b do not extend to such a deep depth, this problem can be avoided.

As illustrated in FIG. 4J, the first source/drain region includes a slightly doped portion 121'. As a matter of course, this slightly doped portion can as well be omitted.

The fourth embodiment of the present invention is directed to a DRAM memory cell array including a capacitor which is implemented as a stacked capacitor, and a transistor as is illustrated with reference to FIGS. 1A and 1B. In the memory cell array of the fourth embodiment, the disturbing influence of the passing word lines is further reduced by arranging the passing word lines on the surface of semiconductor substrate 1. To be more specific, according to the fourth embodiment, first, the pockets are defined in the isolation trenches, while the portions of the isolation trenches in which the pockets are not to be formed, are masked. Thereafter, the groove portions are defined. By the succession of manufacturing steps, it is possible to arrange the passing wordlines on the substrate surface.

The first step corresponds to the step which is described with reference to FIG. 4A, and the description thereof therefore is omitted.

After defining the active areas 12 and the isolation trenches 23, the silicon nitride layer 17 is removed. Thereafter a thermal oxidation step is performed so as to grow a sacrificial silicon dioxide layer 181. Thereafter, implantation steps are performed so as to provide the doped well portions which are usually present in a memory cell, and as an optional step, the LDD implantation steps can be performed so as to define the lightly doped portions of the first and second source/drain regions.

Thereafter, a silicon nitride layer 188 is deposited by generally known methods. In a next step, a polysilicon layer 51 is deposited by generally known methods. On the surface of this polysilicon layer 51, a photoresist material 52 is deposited, and the photoresist layer 52 is photolithograghically patterned so as to form openings 53, having a length of 4 F and a width of 1 F. Thereafter, the polysilicon layer 51 is etched, so that the openings 53 also penetrate through the polysilicon layer 51.

Figure 5A:
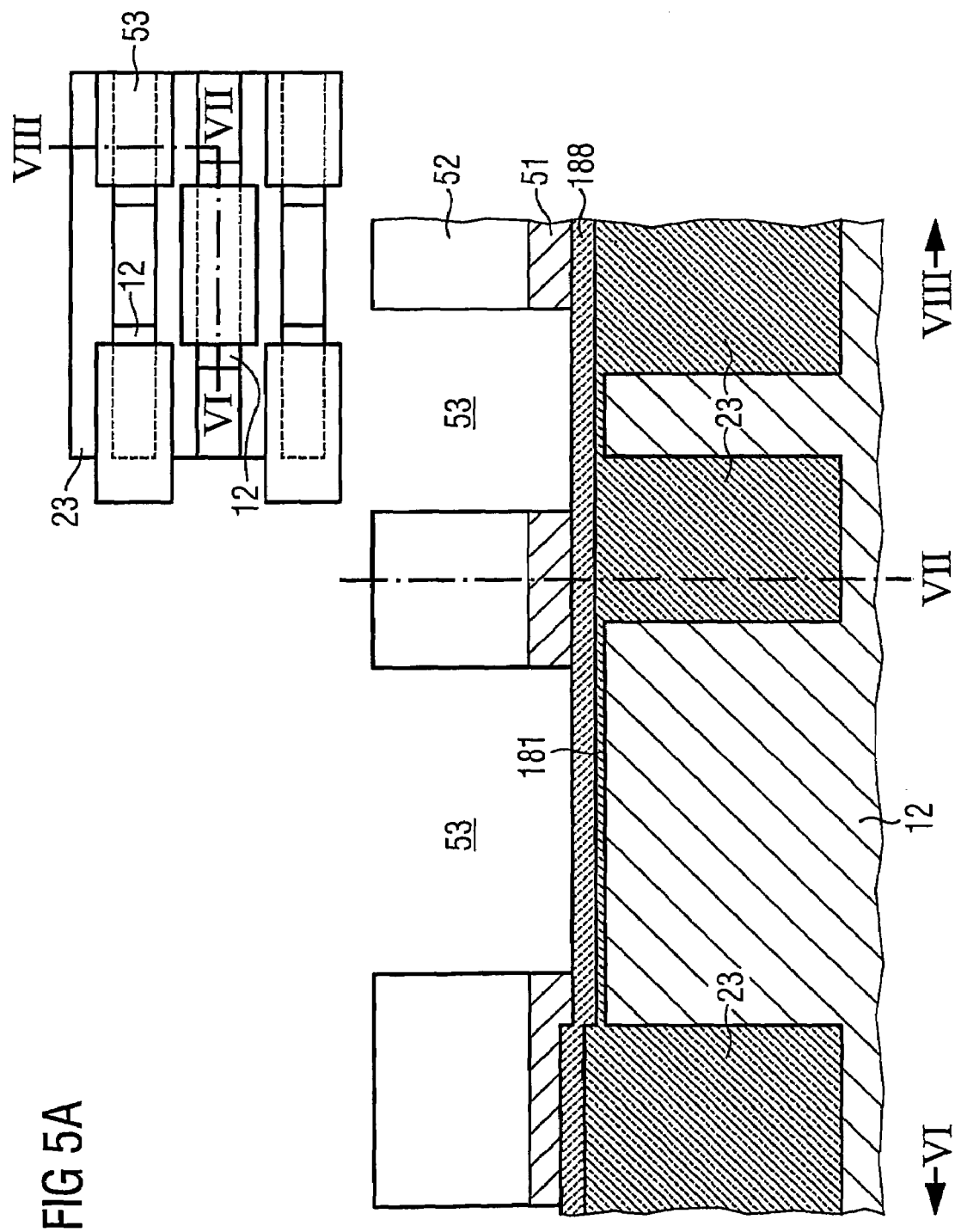

The resulting structure is illustrated in FIG. 5A, wherein the lower portion of FIG. 5A illustrates a cross-sectional view whereas the upper part of FIG. 5A illustrates a plan view on the memory cell array.

A plurality of active areas 12 are arranged in rows, and neighbouring rows are spaced apart by isolation trenches 23. The segmented active area portions 12 of a certain row are also insulated from each other by isolation trenches 23. The whole memory cell array is covered by a layer stack including the polysilicon layer 51 and the photoresist material 52, except for the central portions of the active areas 12. In the upper part of FIG. 5A the points VI, VII and VIII are illustrated, along which the cross-sectional views of the lower part of FIG. 5A are taken. On the way from VI to VII the active area 12 and, in particular, the opening 53 is traversed.

Thereafter, similar steps as described with reference to FIG. 4B are performed. In particular, a carbon hard mask layer 71 is deposited, followed by a layer of photoresist material 72. Thereafter, the grooves for the gate electrodes 85 are photolithographically defined by commonly used steps. After patterning the photoresist layer 72, the carbon hard mask layer 71 is etched and grooves 7 are formed.

Figure 5B:
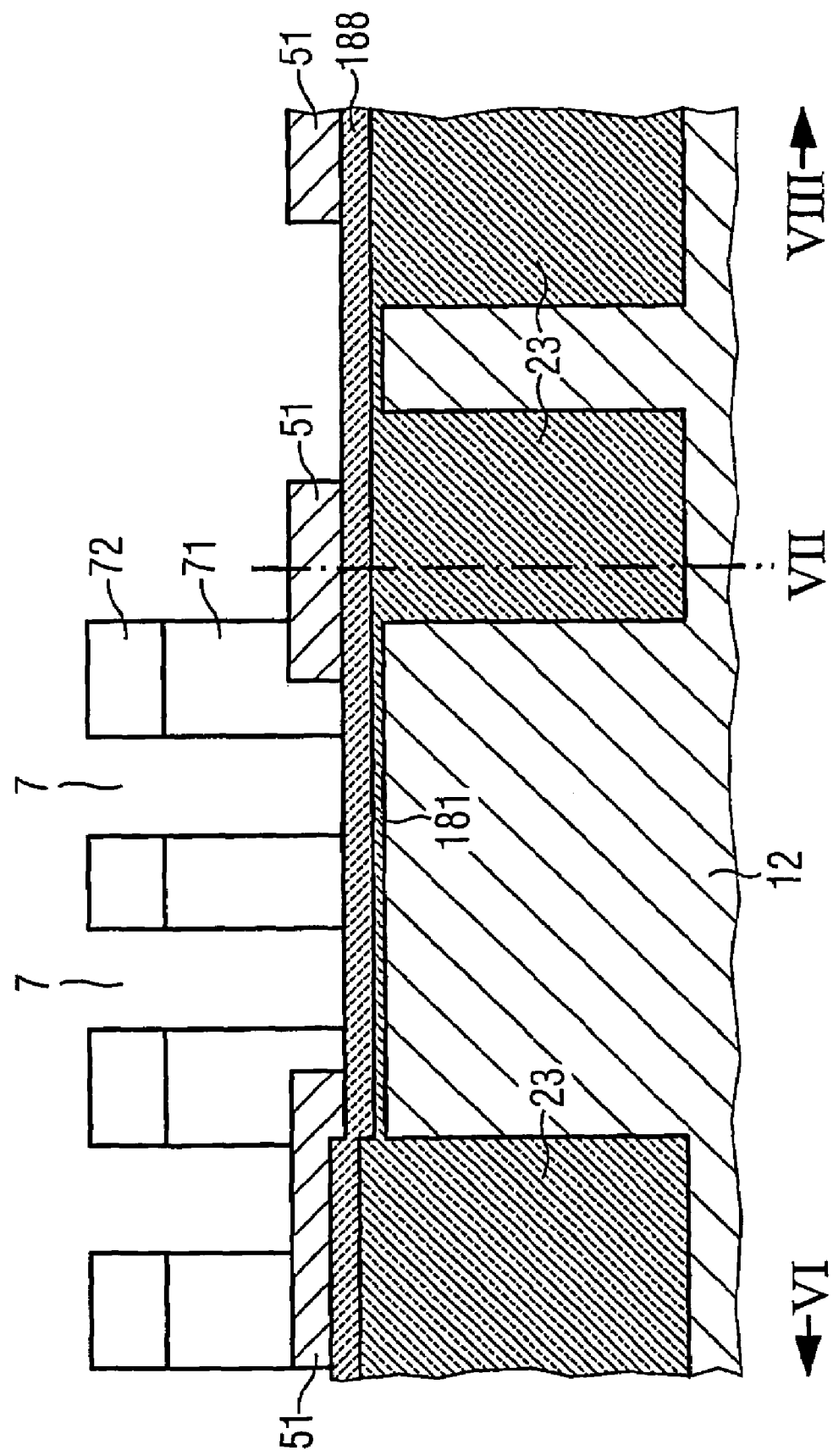

As can be seen from FIG. 5B, above the active area 12, the grooves 7 extend to the surface of the silicon nitride layer 188, whereas above the isolation trenches 23 the grooves stop on the polysilicon hard mask portions 51.

Figure 5C:
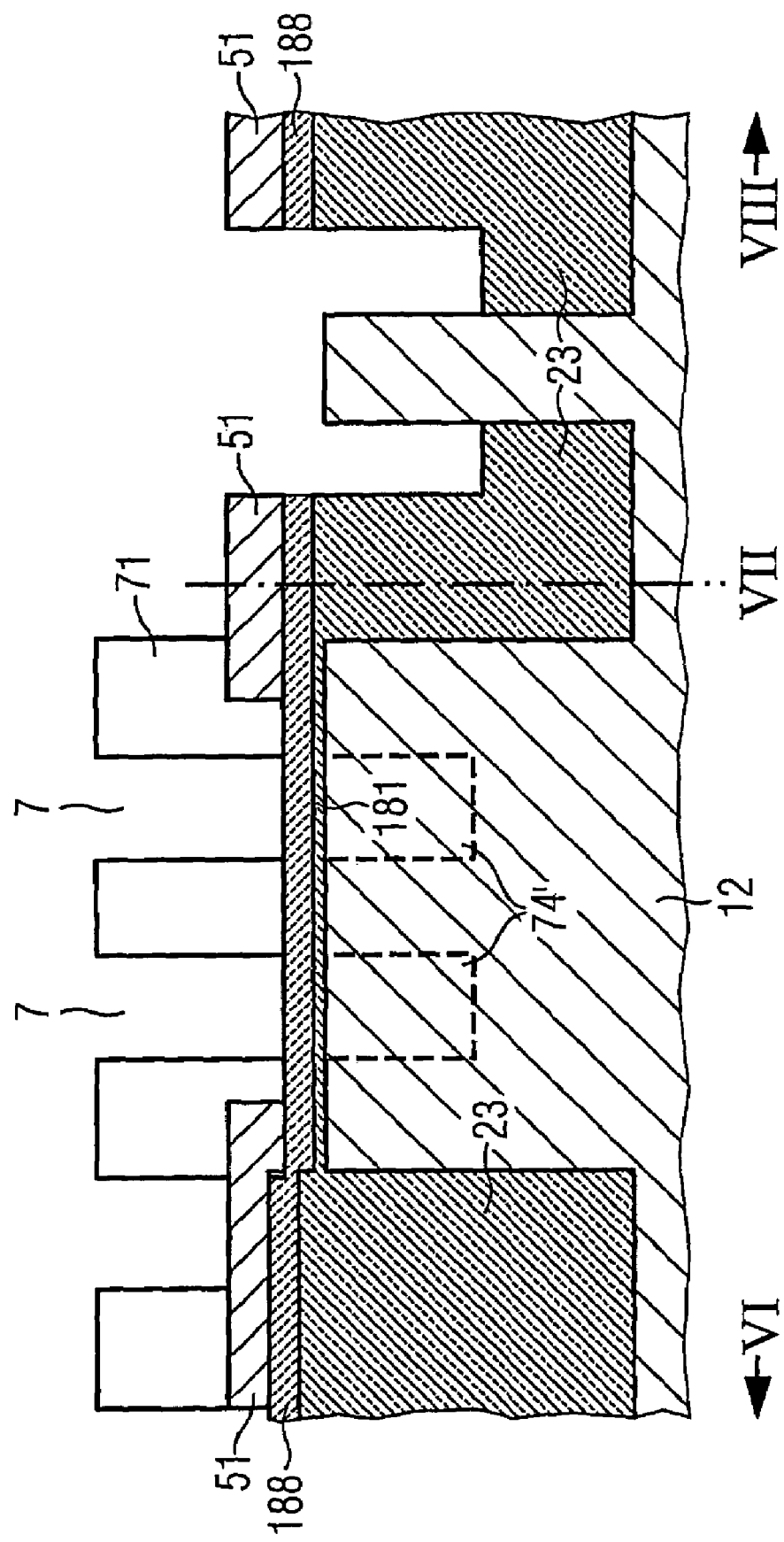

In the next step, an etching step of etching silicon dioxide and silicon nitride selectively with respect to polysilicon, silicon and carbon will be performed. As a consequence, the exposed portions of the silicon dioxide layer 181 and the silicon nitride layer 188 will be etched. Accordingly, in the section between VI and VII the silicon substrate surface 10 will be exposed in the groove portions, whereas in the cross-sectional part between VII and VIII pockets 74 will be etched around the active area 12. The position of the pockets between sites VI and VII is indicated by a broken line 74'. The duration of the etching step will be in accordance with the desired depth of the plate-like portions of the gate electrode. This is illustrated in FIG. 5C.

In the next step, the groove portion of the gate electrode 852 will be defined. In particular, silicon is anisotropically etched selectively with respect to silicon dioxide so as to define the grooves 73. The depth is about 80 nm below the silicon surface 10. By this step, preferably, also the remaining portions of the polysilicon hard mask layer 51 will be removed. As an optional step, an additional isotropic etching step can be performed so as to etch silicon, whereby the fin region 11 will be thinned. The hard mask portions 71 are removed by selectively etching or an ashing step in an $O_2$ plasma. The resulting structure is illustrated in FIG. 5D.

As illustrated in the cross-sectional part between VI and VII, grooves 73 are formed in the silicon material of the active area 12. As can be seen from the cross-sectional part between VII and VIII, pockets 74 are formed in the silicon dioxide layer. Between the pockets 74, there is the fin portion, having a smaller width than the underlying silicon material. Above the fin portion 11, the silicon material is also recessed so as to form the groove 73. According to the fourth embodiment of the present invention, the grooves 73 can only be etched at those portions at which previously the pockets 74 have been defined. Accordingly, the components of the gate electrode are formed in a self-aligned manner.

Figure 5E:
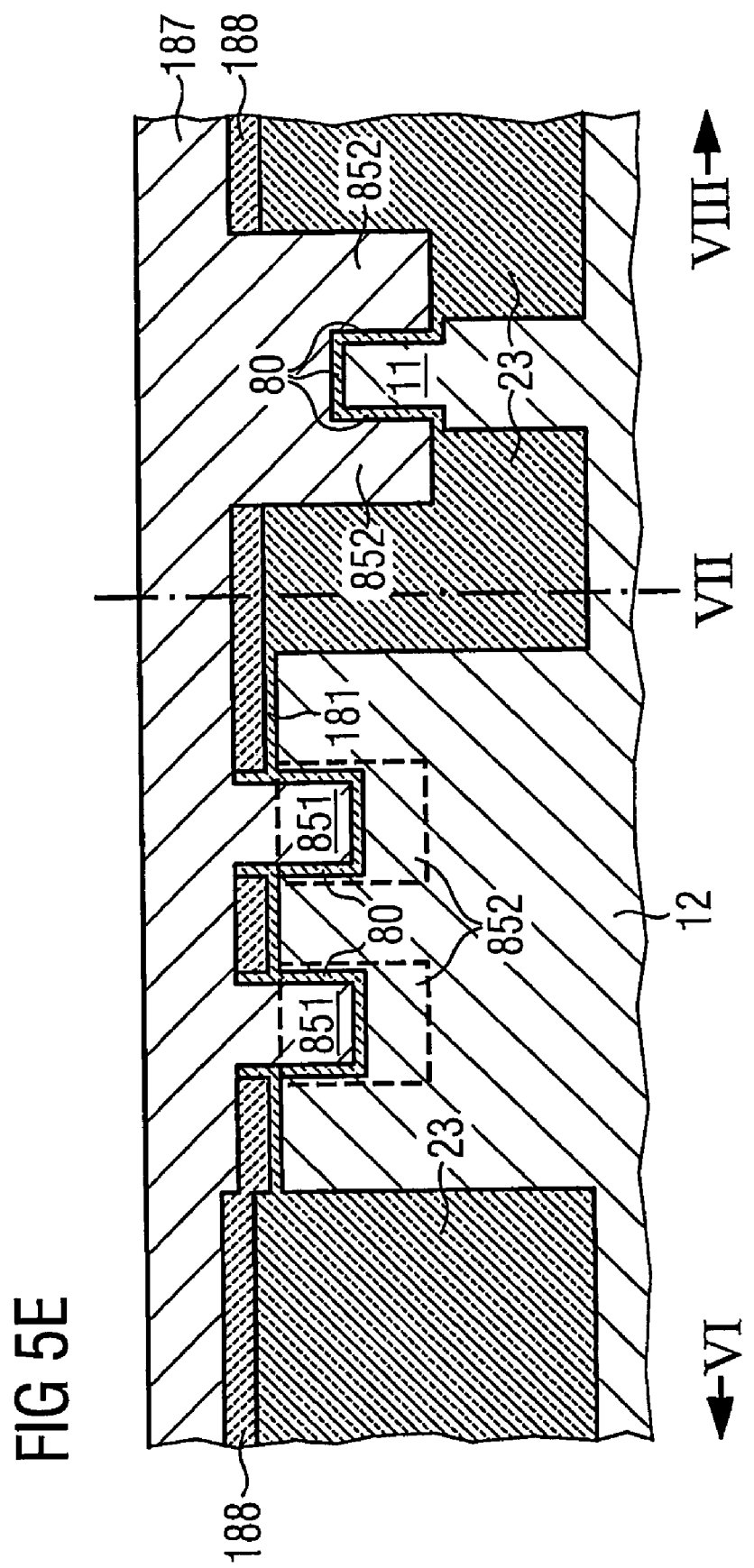

In a next step, optionally a sacrificial oxide layer can be thermally grown and subsequently be removed so that holes may be filled. In addition, implantation steps can be performed so as to form the first and second source/drain regions 121 and 122. Thereafter, the gate oxide layer 80 will be grown by known methods. In a next step, a polysilicon layer 187 is deposited. The resulting structure is illustrated in FIG. 5E.

Thereafter, the polysilicon layer 187 is etched, so as to form a recess which extends to a depth of about 40 nm below the silicon surface 10. As an optional step, an angled array implant step (LDD implant) can be performed in order to form a slightly n$^-$ doped portion of the source/drain region which is self-aligned to the spacer depth.

Figure 5F:
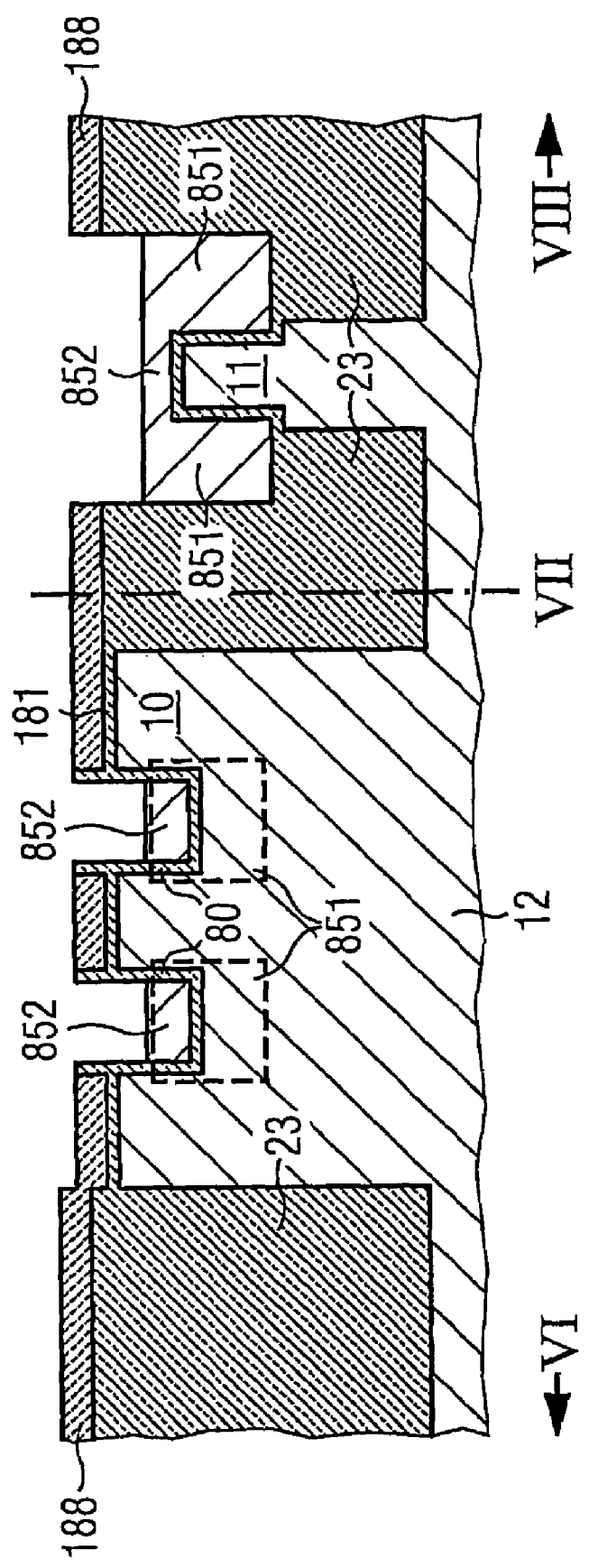

The resulting structure is illustrated in FIG. 5F.

In the next step the inner spacer 86 will be formed. In contrast to the embodiments previously described, the spacer used at this process step can be made of silicon dioxide. The use of silicon dioxide is advantageous since $SiO_2$ has screening properties which are improved with respect of the screening properties of $Si_3N_4$. As a consequence, cross-talking between the word lines and other adjacent conductive parts in the active area 12 will be reduced.

Figure 5G:
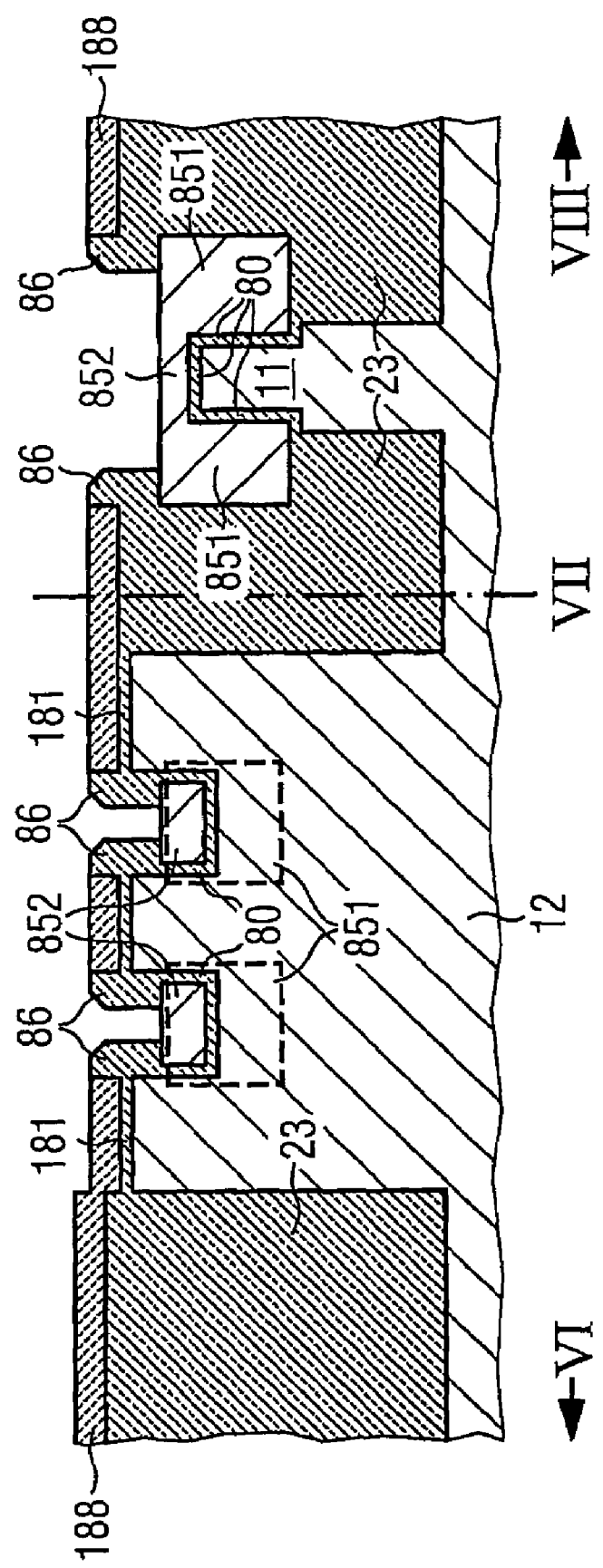

Since silicon nitride is easier to handle, silicon nitride is usually used as the spacer material. According to the fourth embodiment of the present invention, due to the improved manufacturing process, $SiO_2$ can be used instead of $Si_3N_4$. The spacer 86 has a width of 0.2 to 0.3 F, which depends on the width of the resulting transistor. The resulting structure is illustrated in FIG. 5G.

Figure 5H:
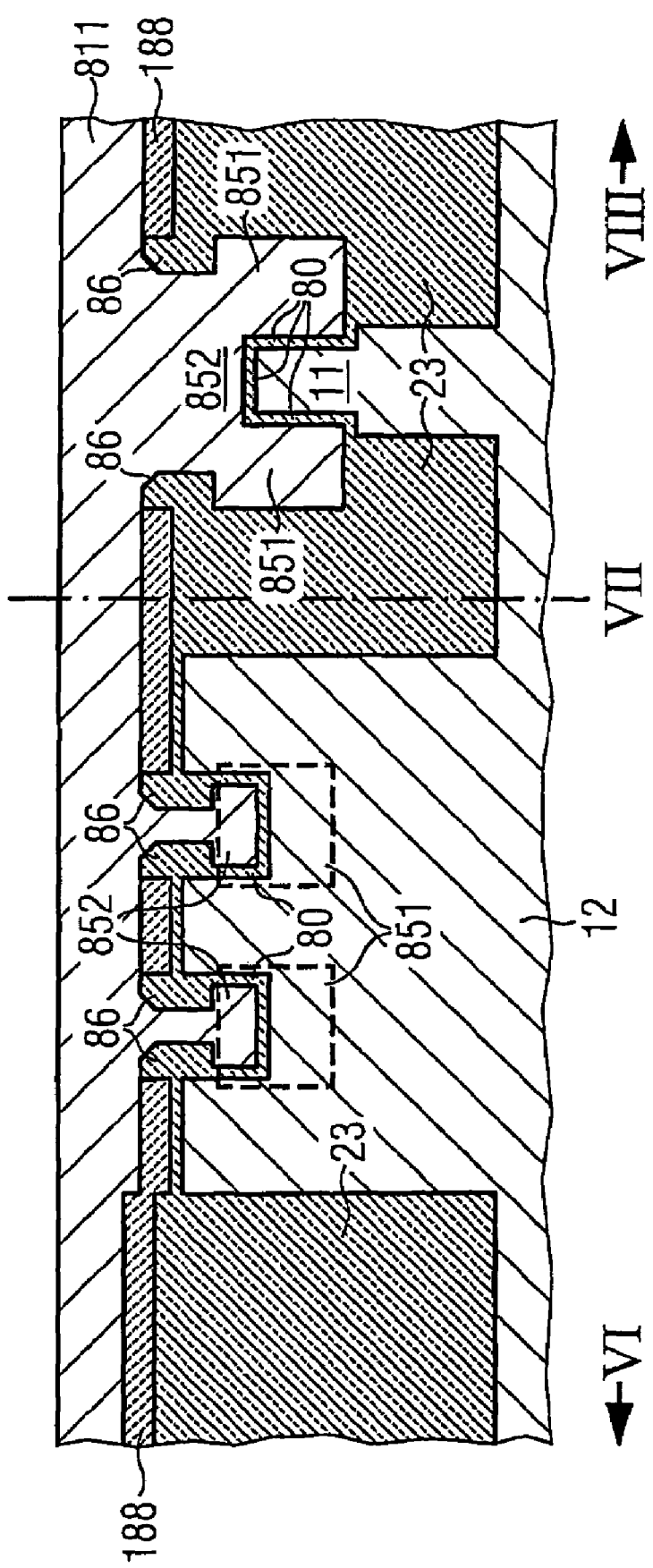

Thereafter, a further polysilicon layer 811 is deposited, as illustrated in FIG. 5H.

Figure 5I:
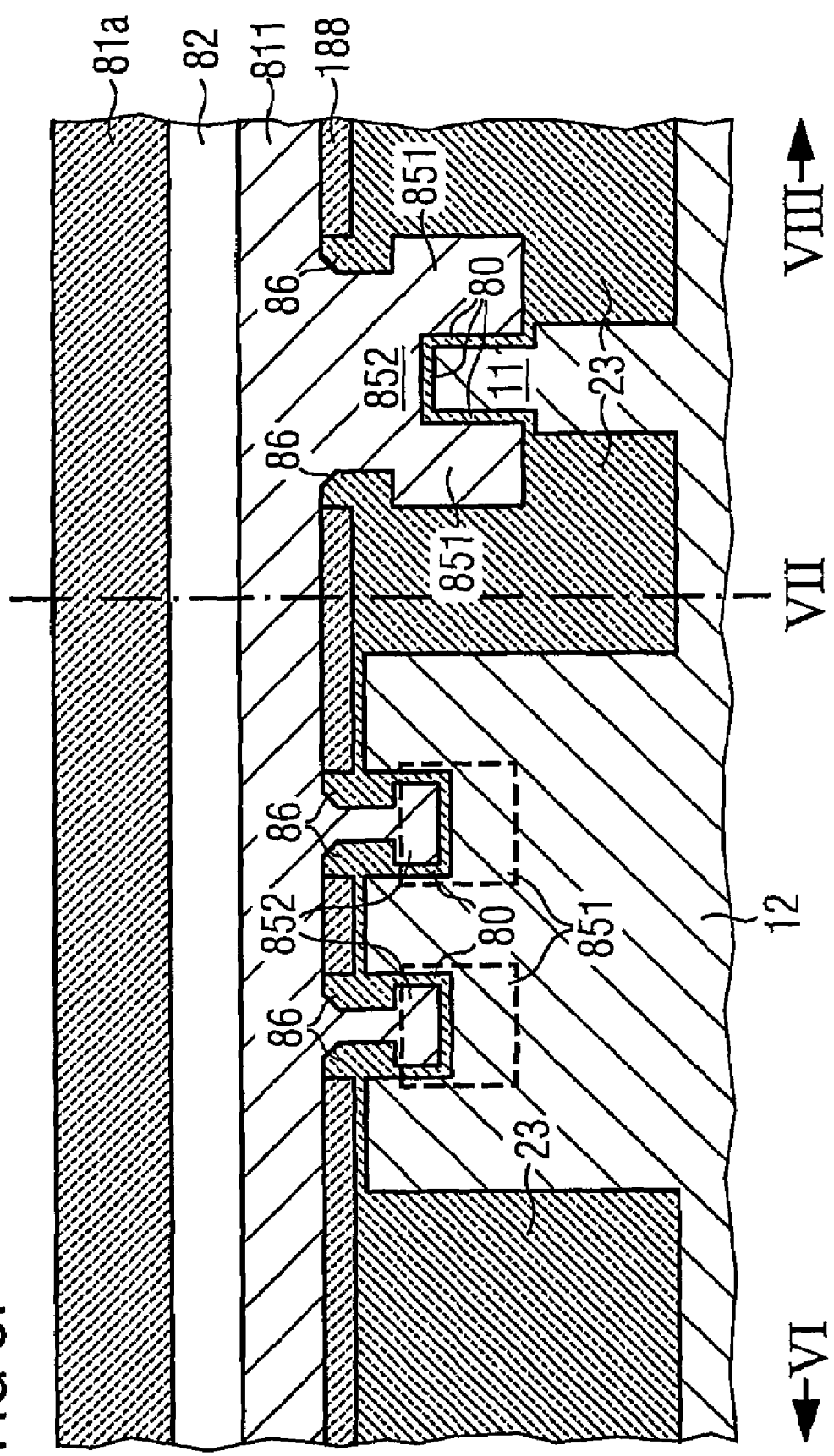

Next, the word lines will be defined in the manner which is similar to the manner described with respect to FIG. 4I. First, a tungsten layer 82 as well as a silicon nitride cap layer 81 are deposited by known methods (see FIG. 5I).

Figure 5J:
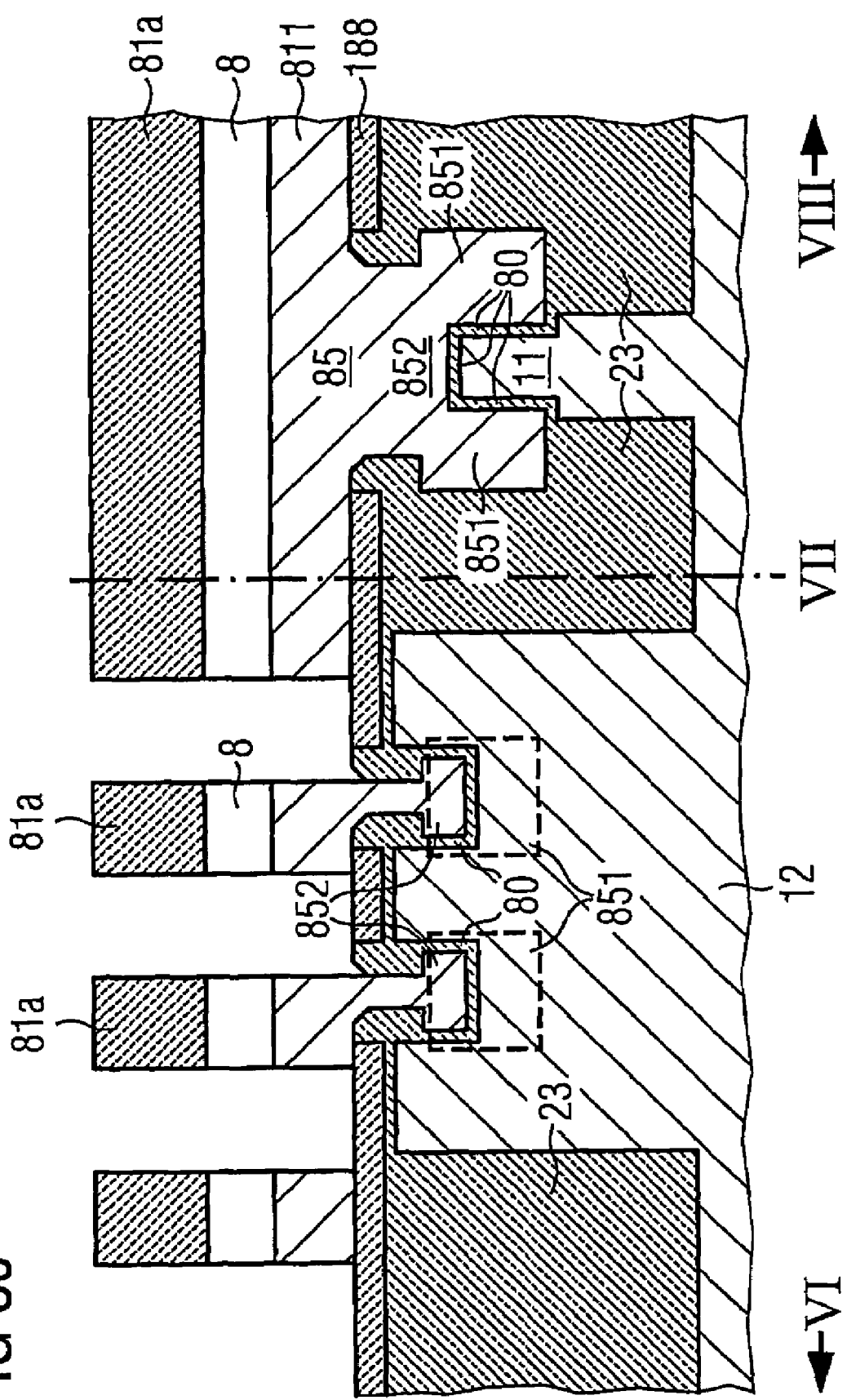

Thereafter, the layer stack is photolithograghically patterned, so as to form single word lines 82 having a silicon nitride cap 81a on top. This is illustrated in FIG. 5J.

In the next step, a silicon nitride layer will deposited and etched so as to form a spacer 81b. Thereafter, the HDD implantation step so as to form the first and second source/drain regions 121 and 122 can be performed. Thereafter, the usual steps for completing the memory cell array will be performed. In particular, the steps described with respect to FIG. 3F to FIG. 3L will be performed so as to provide the bit lines, the bit line contacts, the stacked capacitors as well as the connectors between stack capacitor and first source/drain regions 121.

When comparing the transistor structure illustrated in FIG. 5K with the transistor structure illustrated in FIG. 4J, it can be gathered that the passing word lines 5b are disposed on the substrate surface and, consequently, further screened from the neighbouring active area 12. In particular, the passing word line 8b does not extend into the silicon substrate 1, so that the influence of the passing word line 8b on the neighbouring active area 12b can be minimized.

A further difference between the structure illustrated in FIG. 5K and the structure illustrated in FIG. 4J is that the spacer 86 is made of silicon dioxide in FIG. 5K whereas it is made from silicon nitride in FIG. 4J. Nevertheless, according to the fourth embodiment of the invention, the spacer 86 could as well be made of silicon nitride.

Although the first source/drain region 121 is illustrated as only one region in FIG. 5K, it is clearly to be understood that the first source/drain region 121 may comprise a lightly doped portion 121' as is also illustrated in FIG. 4J, and a heavily doped portion 121. In addition, as is also illustrated in FIG. 4J, the second source/drain region 122 can extend to a deeper depth.

Figure 6:
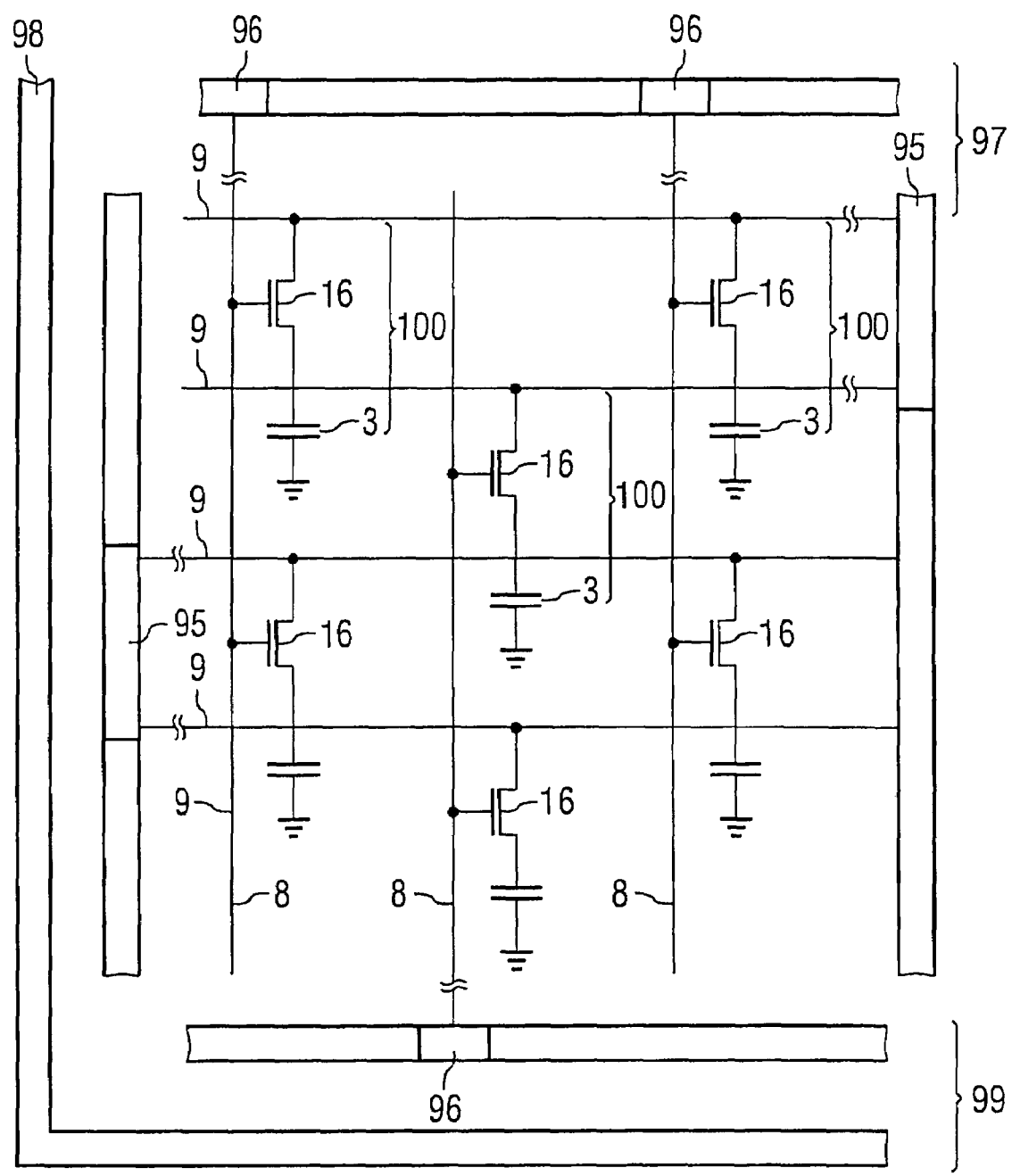
FIG. 6 illustrates a plan view of a memory device in which the transistor of the present invention can be employed.

FIG. 6 illustrates a plan view of an exemplary memory device which can be manufactured by the method of the present invention. In the central portion of FIG. 6, the memory cell array including memory cells 100 is illustrated. As is understood, the specific layout of the memory cell array is arbitrary. In particular, the memory cells 100 can be arranged, for example, in a checkerboard pattern or any other suitable pattern. As is illustrated in FIG. 6, a memory cell array is arranged so that a single memory cell 100 has an area of 8 F$^2$ (4 F×2 F) so that it can be implemented in a folded bit line configuration. The memory device of FIG. 6 further includes the peripheral portion 99. Usually, the peripheral portion 99 includes the core circuitry 97 including word line drivers 96 for addressing the word lines 8 and sense amplifiers 95 for sensing a signal transmitted by the bit lines 9. The core circuitry 97 usually includes other devices for controlling and addressing the individual memory cells 100. The peripheral portion 99 further includes the support portion 98 which usually lies outside the core circuitry 97.

When shrinking the ground rules of the DRAM memory cells so as to obtain a minimal structural feature size F of less than 100 nm, the wordline voltage as well as the bitline voltage can not be scaled at the same degree, in particular, because the required signal margin for conventional sense amplifiers is limiting the scaling of this voltage. In addition, the requirements for speed of the memories are increasing. As a consequence, higher drive voltages for the array are advantageous, but require higher voltages to be dealt with in the core circuitry 97 and, in particular, the word line drivers 96. Usually, the operation voltages are scaled with the ground rule to fulfill the requirements of reliability. If the voltages are not scaled, extensive reliability fails are expected.

However, in order to get along with higher voltages, it is necessary to increase the transistor lengths which finally results in increased chip size required for the core circuitry. Nevertheless, an increase of chip size of the core circuitry results in a reduced productivity gain during the shrinking process. In addition, a problem arises, that the components of the core circuitry 97 need to be arranged at the same pitch as the individual memory cells. Accordingly, it becomes necessary to further reduce the size of the word line drivers, for example.

As the inventors of the present invention further found out, the requirements of an increased transistor length as well as of an decreased chip size can be fulfilled, if a transistor according to the present invention is provided as well in the peripheral portion and, in particular, in the core circuitry 97 of a memory device.

If the transistor of the present invention is used as an array access transistor for the DRAM memory cells as well as in the peripheral portion of the memory device, the same process flow can be used for simultaneously forming the transistor in the memory cell array as well as in the peripheral portion, except for different implantation steps for forming the first and second source/drain regions and for performing the well implants and the channel implants. As a result, the complexity of the process is not substantially increased.

By using the transistor of the present invention in the peripheral portion, high voltage devices can be used in the core circuitry for example, without sacrificing reliability limits and without spending chip area.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising a transistor that comprises:
    a first and a second source/drain region disposed in an active area, a first direction defined by a line connecting the first and second source/drain regions;
    isolation trenches disposed adjacent to the active area; and
    a gate electrode that is disposed in a groove formed in a semiconductor substrate, wherein in a cross-sectional view perpendicular to the first direction the gate electrode comprises plate-like portions disposed at lateral sides of a channel region of the transistor, wherein the plate-like portions face each other at the channel region, the plate-like portions being disposed in pockets that are arranged in the isolation trenches.

2. The integrated circuit according to claim 1, further comprising a spacer made from an insulating material, the spacer being arranged at an interface between the gate electrode and the first and second source/drain regions and having a thickness larger than that of a gate insulating layer electrically insulating the channel region and the gate electrode.

3. The integrated circuit according to claim 2, wherein the insulating material of the spacer is selected from the group consisting of silicon dioxide and silicon nitride.

4. The integrated circuit according to claim 1, wherein a width of a portion of the channel region is smaller than a width of the first or second source/drain regions, the width being measured in a direction perpendicular to the first direction parallel to a surface of a semiconductor substrate, in which the first and second source/drain regions are formed.

5. The integrated circuit according to claim 1, wherein the first source/drain region comprises a heavily doped and a lightly doped region, the lightly doped region being disposed between the heavily doped region and the channel region.

6. The integrated circuit according to claim 5, wherein the lightly doped region extends to a depth beneath the top side of a portion of the channel region.

7. The integrated circuit according to claim 6, further comprising a spacer made from an insulating material, the spacer being arranged at an interface between the gate electrode and the first and second source/drain regions, wherein the heavily doped region is disposed above the lightly doped region and the spacer extends to a depth corresponding to the depth of the heavily doped region.

8. The integrated circuit according to claim 1, wherein the channel region comprises horizontal and vertical components.

9. An integrated circuit including a transistor that comprises:
    a first and a second source/drain region formed in a semiconductor substrate;
    a channel region being formed in the semiconductor substrate, between the first and second source/drain regions and comprising a portion in which the channel has the shape of a ridge, the ridge comprising a top side and two lateral sides, wherein the top side is disposed beneath a substrate surface of the semiconductor substrate; and
    a gate electrode disposed along the top side and the two lateral sides, a portion of the gate electrode being disposed in pockets that are arranged in isolation trenches.

10. The integrated circuit according to claim 9, wherein a distance between the top side and the substrate surface, measured in a direction perpendicular to the substrate surface, is 10 to 200 nm.

11. The integrated circuit according to claim 9, wherein the distance between the top side and the substrate surface is more than 40 nm.

* * * * *